United States Patent
Facchetti et al.

(10) Patent No.: US 9,219,233 B2
(45) Date of Patent: Dec. 22, 2015

(54) SEMICONDUCTOR MATERIALS PREPARED FROM RYLENE-(π-ACCEPTOR)COPOLYMERS

(75) Inventors: Antonio Facchetti, Chicago, IL (US); Zhihua Chen, Skokie, IL (US); He Yan, Skokie, IL (US); Shaofeng Lu, Skokie, IL (US); Tobin J. Marks, Evanston, IL (US); Yan Zheng, Skokie, IL (US); Marcel Kastler, Basel (CH); Subramanian Vaidyanathan, Singapore (SG); Florian Doetz, Singapore (SG); Silke Annika Koehler, Basel (CH)

(73) Assignees: BASF SE, Ludwigshafen (DE); Polyera Corporation, Princeton, NJ (US)

( * ) Notice: Subject to any disclaimer, the term of this patent is extended or adjusted under 35 U.S.C. 154(b) by 1257 days.

(21) Appl. No.: 12/865,031

(22) PCT Filed: Feb. 5, 2009

(86) PCT No.: PCT/EP2009/051315
§ 371 (c)(1),
(2), (4) Date: Dec. 8, 2010

(87) PCT Pub. No.: WO2009/098254
PCT Pub. Date: Aug. 13, 2009

(65) Prior Publication Data
US 2011/0120558 A1 May 26, 2011

Related U.S. Application Data

(60) Provisional application No. 61/050,010, filed on May 2, 2008, provisional application No. 61/026,311, filed on Feb. 5, 2008, provisional application No. 61/088,236, filed on Aug. 12, 2008, provisional (Continued)

(51) Int. Cl.
*H01L 51/46* (2006.01)
*H01B 1/12* (2006.01)
(Continued)

(52) U.S. Cl.
CPC ............ *H01L 51/0043* (2013.01); *C08G 61/10* (2013.01); *C08G 61/12* (2013.01); *C09K 11/06* (2013.01); *H01B 1/127* (2013.01); *H01L 51/0036* (2013.01); *H01L 51/0094* (2013.01); *H05B 33/14* (2013.01); *C09K 2211/1458* (2013.01); *C09K 2211/1483* (2013.01);
(Continued)

(58) Field of Classification Search
USPC .................................................. 136/263, 252
See application file for complete search history.

(56) References Cited

U.S. PATENT DOCUMENTS 6,491,749 B1 * 12/2002 Langhals et al. ......... 106/287.21
6,585,914 B2    7/2003 Marks et al.
(Continued)

OTHER PUBLICATIONS

U.S. Appl. No. 13/266,935, filed Oct. 28, 2011, Karpov, et al.
(Continued)

*Primary Examiner* — Golam Mowla
(74) *Attorney, Agent, or Firm* — Oblon, Spivak, McClelland, Maier & Neustadt, L.L.P.

(57) ABSTRACT

Disclosed are new semiconductor materials prepared from rylene-(π-acceptor) copolymers. Such copolymers can exhibit high n-type carrier mobility and/or good current modulation characteristics. In addition, the polymers of the present teachings can possess certain processing advantages such as solution-processability and/or good stability at ambient conditions.

37 Claims, 7 Drawing Sheets

Related U.S. Application Data application No. 61/088,246, filed on Aug. 12, 2008, provisional application No. 61/088,215, filed on Aug. 12, 2008, provisional application No. 61/026,322, filed on Feb. 5, 2008, provisional application No. 61/112,478, filed on Nov. 7, 2008.

(51) Int. Cl.

| | | |
|---|---|---|
| *C08G 61/12* | (2006.01) | |
| *C08G 61/10* | (2006.01) | |
| *H05B 33/14* | (2006.01) | |
| *C09K 11/06* | (2006.01) | |
| *H01L 51/00* | (2006.01) | |
| *H01L 51/05* | (2006.01) | |

(52) U.S. Cl.
CPC ......... *H01L51/0053* (2013.01); *H01L 51/0541* (2013.01); *H01L 51/0545* (2013.01); *Y02E 10/549* (2013.01)

(56) References Cited

U.S. PATENT DOCUMENTS

| | | | |
|---|---|---|---|
| 6,608,323 B2 | 8/2003 | Marks et al. | |
| 6,991,749 B2 | 1/2006 | Marks et al. | |
| 7,569,693 B2 * | 8/2009 | Marks et al. | 546/66 |
| 7,605,394 B2 | 10/2009 | Marks et al. | |
| 7,671,202 B2 * | 3/2010 | Marks et al. | 546/37 |
| 7,678,463 B2 | 3/2010 | Marks et al. | |
| 7,892,454 B2 * | 2/2011 | Facchetti et al. | 252/500 |
| 7,893,265 B2 * | 2/2011 | Facchetti et al. | 546/37 |
| 7,902,363 B2 * | 3/2011 | Facchetti et al. | 546/37 |
| 7,947,387 B2 * | 5/2011 | Saito et al. | 429/62 |
| 7,982,039 B2 * | 7/2011 | Marks et al. | 546/38 |
| 8,022,214 B2 * | 9/2011 | Facchetti et al. | 546/37 |
| 2005/0176970 A1 | 8/2005 | Marks et al. | |
| 2006/0124909 A1 | 6/2006 | Marks et al. | |
| 2006/0186401 A1 | 8/2006 | Marks et al. | |
| 2008/0177073 A1 | 7/2008 | Facchetti et al. | |
| 2008/0185577 A1 | 8/2008 | Facchetti et al. | |

OTHER PUBLICATIONS

U.S. Appl. No. 13/140,595, filed Jun. 17, 2011, Mishra, et al.
Xiaorong He, et al., "A New Copolymer Containing Perylene Bisimide and Porphyrin Moieties: Synthesis and Characterization", Macromolecular Chemistry and Physics, vol. 206, 2005, pp. 2199-2205.
Yang Liu, et al., "Synthesis and Photovoltaic Characteristics of Novel Copolymers Containing Poly(phenylenevinylene) and Triphenylamine Moieties Connected at 1,7 Bay Positions of Perylene Bisimide", Macromolecules, vol. 38, 2005, pp. 716-721.
International Search Report issued Jun. 18, 2009 in PCT/EP09/051315 filed Feb. 5, 2009.
He, Xiaorong et al., "Synthesis and Characterization of New Types of Perylene Bisimide-Containing Conjugated Copolymers", Macromolecular Rapid Communications, vol. 26, pp. 721-727, XP002527203, (2005).
Zhan, Xiaowei et al., "A High-Mobility Electron-Transport Polymer with Broad Absorption and Its Use in Field-Effect Transistors and All-Polymer Solar Cells", J. Am. Chem., Soc., vol. 129, pp. 7246-7247 and S1-S11, XP002527202, (May 18, 2007).
Brzezinski, J. Z. et al. A New, Improved and Convenient Synthesis of 4H-Cyclopenta [2, 1-b: 3, 4-b']-dithiophen-4-one, Synthesis, vol. 8, pp. 1053-1056, XP002530529 (2002).
U.S. Appl. No. 61/057,547, filed May 30, 2008, Facchetti, et al.
U.S. Appl. No. 61/026,311, filed Feb. 5, 2008, Kastler, et al.
U.S. Appl. No. 61/026,322, filed Feb. 5, 2008, Facchett, et al.
U.S. Appl. No. 61/050,010, filed May 2, 2008, Chen, et al.
U.S. Appl. No. 61/088,215, filed Aug. 12, 2008, Facchetti, et al.
U.S. Appl. No. 61/088,236, filed Aug. 12, 2008, Facchetti, et al.
U.S. Appl. No. 61/088,246, filed Aug. 12. 2008, Facchetti, et al.
U.S. Appl. No. 60/859,761, filed Nov. 17, 2006, Facchetti, et al.
U.S. Appl. No. 60/879,145, filed Jan. 8, 2007, Facchetti, et al.
U.S. Appl. No. 13/128,961, filed May 12, 2011, Quinn, et al.

\* cited by examiner

SEMICONDUCTOR MATERIALS PREPARED FROM RYLENE-(π-ACCEPTOR)COPOLYMERS

CROSS REFERENCE TO RELATED APPLICATION

This application claims priority to and the benefit of U.S. Provisional Patent Application Ser. Nos. 61/026,322, filed on Feb. 5, 2008; 61/026,311, filed on Feb. 5, 2008; 61/050,010, filed on May 2, 2008; 61/088,236, filed on Aug. 12, 2008, 61/088,246, filed on Aug. 12, 2008; 61/088,215, filed on Aug. 12, 2008; and 61/112,478, filed on Nov. 7, 2008, the disclosure of each of which is incorporated by reference herein in its entirety.

BACKGROUND

Since the beginning of the electronic era, the primary building blocks in electronics and microelectronics have been field-effect transistors (FETs) based on inorganic electrodes, insulators, and semiconductors. These materials have proven to be reliable and highly efficient, providing performance that improves continually according to Moore's law. More recently, organic materials have been developed as both active and passive materials in electronic circuitry. Instead of competing with conventional silicon technologies, organic FETs (OFETs) based on molecular and polymeric materials are desired in niche applications, for example, in low-end radio-frequency technologies, sensors, and light emission, as well as in integrated optoelectronic devices such as pixel drives and switching elements in displays. These systems have been widely pursued for the advantages they offer, which include processability via vapor/solution-phase fabrication, good compatibility with different substrates (e.g., flexible plastics), and opportunities for structural tailoring. This trend is further driven by the continued demand for low-cost, large-area, flexible, and lightweight devices, and the possibility to process these materials at much lower substrate temperatures compared to inorganic semiconductors.

The simplest and most common OFET device configuration is that of an organic thin-film transistor (OTFT), in which a thin film of the organic semiconductor is deposited on top of a dielectric with an underlying gate (G) electrode. Charge-injecting drain-source (D-S) electrodes providing the contacts are defined either on top of the organic film (top-configuration) or on the surface of the FET dielectric prior to the deposition of the semiconductor (bottom-configuration). The current between the S and D electrodes is low when no voltage ($V_g$) is applied between the G and D electrodes, and the device is in the so called "off" state. When $V_g$ is applied, charges can be induced in the semiconductor at the interface with the dielectric layer. As a result, current ($I_d$) flows in the channel between the S and D electrodes when a source-drain bias ($V_d$) is applied, thus providing the "on" state of a transistor. Key parameters in characterizing FET performance are the field-effect mobility ($\mu$), which quantifies the average charge carrier drift velocity per unit electric field, and the current on/off ratio ($I_{on}$:$I_{off}$), which is the D-S current ratio between the "on" and "off" states. For a high-performance OFET, the field-effect mobility and on/off ratio should both be as high as possible, for example, having at least $\mu\sim 0.1$-1 $cm^2V^{-1} s^{-1}$ and $I_{on}/I_{off}\sim 10^6$.

Most OFETs operate in p-type accumulation mode, meaning that the semiconductor acts as a hole-transporting material. However, high-performance electron-transporting (n-type) materials are needed as well. For most practical applications, the mobility of the field-induced charges should be greater than about 0.01-1 $cm^2/Vs$. To achieve high performance, the organic semiconductors should satisfy stringent criteria relating to both the injection and current-carrying capacity; in particular: (i) the HOMO/LUMO energies of the material should be appropriate for hole/electron injection at practical voltages; (ii) the crystal structure of the material should provide sufficient overlap of the frontier orbitals (e.g., π-stacking and edge-to-face contacts) to allow charges to migrate among neighboring molecules; (iii) the compound should be very pure as impurities can hinder the mobility of charge carriers; (iv) the conjugated core of the material should be preferentially oriented to allow charge transport in the plane of the TFT substrate (the most efficient charge transport occurs along the direction of intermolecular π-π stacking); and (v) the domains of the crystalline semiconductor should uniformly cover the area between the source and drain contacts, hence the film should have a single crystal-like morphology.

Among the organic semiconductors used in OFETs, oligothiophenes, polythiophenes, acenes, rylenes, and phthalocyanenes are the most investigated. For instance, the first report on a polyheterocycle-based PET was on polythiophene. In addition, poly(3-hexyl)thiophene and α,ω-di-alkyloligothiophenes were the first high-mobility polymer and small molecules, respectively. Over the years, chemical modifications of these compounds, including variations in ring-to-ring connectivity and substitution pattern, have resulted in a considerable number of electro-active materials. However, with very few exceptions, all of these materials are p-type semiconductors. One exception is an alternating copolymer of perylene diimide and dithienothiophene units which was reported to have electron mobilities as high as $1.3\times 10^{-2}$ $cm^2V^{-1} s^{-1}$ and an on/off current ratio of $>10^4$ in vacuum. See, e.g., Zhan, X. et al., *J. Amer. Chem. Soc.* 129: 7246-7247 (2007).

In addition to the scarcity of n-type semiconductor materials, OFET electron transport is frequently depressed, or even completely quenched, when the devices are operated in the presence of ambient species (e.g. oxygen, water, and carbon dioxide). This sensitivity to ambient conditions severely hinders the ability to operate these devices without proper encapsulation.

Another important class of organic semiconductor-based devices where electron-transporting (n-type) materials are needed is bulk heterojunction photovoltaic (or solar cell). In these devices, the combination of an electron donor semiconductor (e.g., poly(3-hexylthiophene (P3HT)) and an electron acceptor semiconductor (e.g., methanofullerene[6,6]-phenyl-butyric acid methyl ester (PCBM)) work together to split the exciton (hole-electron pair formed upon light absorption) and generate power. It is desirable that both the electron-donor semiconductor and the electron-acceptor semiconductor possess a broad optical absorption so that they are able to absorb as much light from the solar spectrum as possible. For example, a drawback of PCBM is that it does not absorb light in the visible/near IR part of the spectrum.

The synthesis of a large number of electron-acceptor (π-acceptor) carbonyl-functionalized oligothiophenes was recently described and compared to the molecular/solid-state properties of the corresponding alkyl-substituted and parent unsubstituted oligothiophenes. Each of these substituted oligothiophenes exhibits high chemical/thermal stability, similar packing characteristics, strong π-π intermolecular interactions, and low LUMO energies. Furthermore, carbonyl functionalization of the oligothiophene core was found to have a significant impact on the electronic, film growth, and semiconducting properties of the resulting films, and TFT devices with such systems as the active layer were demonstrated to operate in the n-type accumulation mode, indicating facile electron injection into the semiconductor material. See, e.g., U.S. Pat. Nos. 6,585,914, 6,608,323, 6,991,749, and U.S. Patent Application Publication Nos. 2006/0124909 and 2006/0186401, the entire disclosure of each of which is incorporated by reference herein.

A separate class of electron-acceptor-functionalized (e.g., cyano-substituted) rylene imide-based semiconductors was shown to exhibit excellent stable operation in air. Data from relevant studies suggest that electron transport in these molecules is possible in air if the electron affinity (EA) or the first reduction potential (the equivalent solution state parameter) of the molecule is sufficiently increased or sufficiently negative, respectively. Although it is difficult to pinpoint the exact EA required for the onset of such stability, it appears that for rylene-containing molecules it occurs in the range of about −3.9 eV to about −4.4 eV versus vacuum. See, e.g., U.S. Patent Application Publication No. 2005/0176970, the entire disclosure of which is incorporated by reference herein.

In addition to the various deficiencies described above, molecular semiconductors generally have limited processability. High-performance p-channel polymers with hole mobilities of about 0.1 cm$^2$V$^{-1}$ s$^{-1}$ have been reported, but n-channel polymers for OTFTs to date either suffer from poor processability and/or negligible electron mobilities under ambient conditions.

Accordingly, new classes of polymers having semiconducting activity are desired in the art, especially those with n-type semiconducting activity, are stable at ambient conditions, and/or can be processed in solution-phase (e.g., via printing, casting, spraying, or spin-coating).

SUMMARY

In light of the foregoing, the present teachings provide semiconducting polymers that can address various deficiencies and shortcomings of the prior art, including those outlined above. Also provided are associated devices and related methods for the preparation and use of these polymers. The present polymers can exhibit properties such as excellent charge transport characteristics in ambient conditions, chemical stability, low-temperature processability, and satisfactory solubility in common solvents. As a result, field effect devices such as thin film transistors that incorporate one or more of the present polymers as the semiconductor layer can exhibit high performance in ambient conditions, for example, demonstrating one or more of large electron mobilities, low threshold voltages, and high current on-off ratios. Similarly, other organic semiconductor-based devices such as OPVs, OLETs, and OLEDs can be fabricated efficiently using the polymeric materials described herein.

Generally, the present teachings provide polymers that can be represented by the formula:

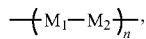

wherein $M_1$ is an optionally substituted aromatic imide, $M_2$ is a repeating unit that includes one or more optionally substituted polycyclic moieties, and n is an integer greater than or equal to 2. For example, $M_1$ can have the formula:

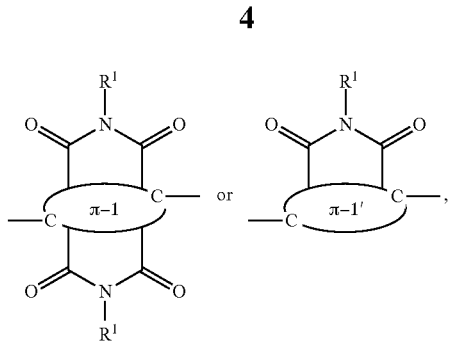

$M_2$ can have a formula selected from:

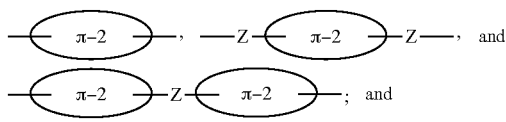

n can be an integer between 2 and 5,000;
where π-1 and π-1' can be an optionally substituted fused ring moiety, π-2 can be an optionally substituted polycyclic moiety, Z can be a conjugated linear linker, and R$^1$ is as defined herein.

The present teachings also provide methods of preparing such polymers and semiconductor materials, as well as various compositions, composites, and devices that incorporate the polymers and semiconductor materials disclosed herein.

The foregoing as well as other features and advantages of the present teachings will be more fully understood from the following figures, description, and claims.

BRIEF DESCRIPTION OF DRAWINGS

It should be understood that the drawings described below are for illustration purpose only. The drawings are not necessarily to scale and are not intended to limit the scope of the present teachings in any way.

DETAILED DESCRIPTION

Figure 1:
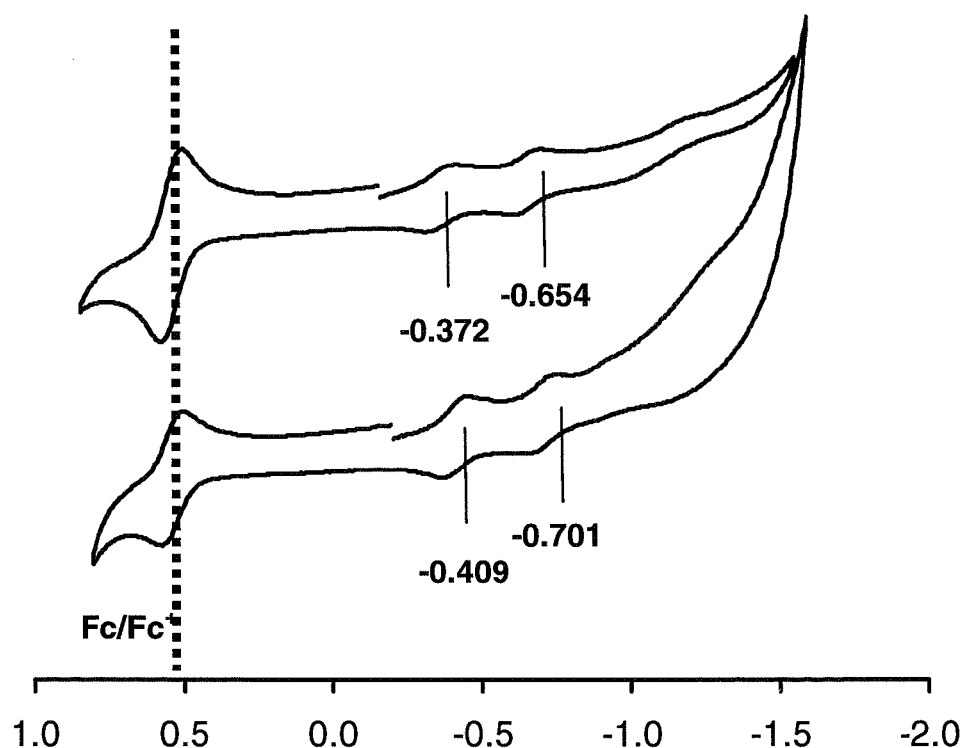
FIG. 1 shows cyclic voltammograms of two representative polymers of the present teachings, namely, P(PDIMP-DTCO) (top) and P(PDIMP-DTDiox) (bottom), in solution (THF).

The present teachings provide organic semiconductor materials that include one or more semiconducting polymers, and associated compositions, composites, and/or devices. Polymers of the present teachings can exhibit semiconductor behavior such as high carrier mobility and/or good current modulation characteristics in a field-effect device, light absorption/charge separation in a photovoltaic device, and/or charge transport/recombination/light emission in a light-emitting device. In addition, the present polymers can possess certain processing advantages such as solution-processability and/or good stability (for example, air stability) in ambient conditions. The polymers of the present teachings can be used to prepare either p-type or n-type semiconductor materials, which in turn can be used to fabricate various organic electronic articles, structures and devices, including field-effect transistors, unipolar circuitries, complementary circuitries, photovoltaic devices, and light emitting devices.

Accordingly, one aspect of the present teachings provides polymers having semiconducting activity and semiconductor materials prepared from these polymers. More specifically, the polymers can be A-B copolymers comprising a first repeating unit (repeating unit A or $M_1$) that includes an aromatic (e.g., rylene) imide, and a second repeating unit (repeating unit B or $M_2$) that includes one or more polycyclic moieties. In various embodiments, both repeating unit A and repeating unit B can include an aromatic or otherwise highly conjugated cyclic (carbocyclic or heterocyclic) moieties, where such cyclic moieties can be optionally substituted or functionalized with one or more electron-withdrawing or electron-donating groups. The pairing of repeating units A and B, the imide position functionalization of repeating unit A, and any additional functionalization on either repeating unit can be affected by one or more of the following considerations: 1) the electron-withdrawing capability for semiconductor processing in air and stable charge transport operation; 2) modulation of the majority carrier type depending on the electronic structure of repeating units A and B; 3) regiochemistry of the polymerization possibly affording regioregular polymers; 4) the core planarity and linearity of the polymer chain; 5) the capability of additional functionalization of the π-conjugated core; 6) the potential for increased solubility of the polymer for solution processing; 7) achieving strong π-π interactions/intermolecular electronic coupling; and 8) bandgap modulation via electron donor-acceptor coupling of electron-poor (acceptor) and electron-rich (donor) A-B or B-A repeating units. The resulting polymers and related methods can be employed to enhance the performance of an associated device (e.g., an organic field effect transistor, a light-emitting transistor, a solar cell, or the like).

More specifically, $M_1$ of the present polymers generally comprises an optionally substituted (core-substituted and/or imide-substituted) aromatic diimide or monoimide, while $M_2$ generally comprises one or more optionally substituted aromatic (or otherwise π-conjugated) polycyclic moieties. In certain embodiments, $M_2$ can include one or more linkers in between the one or more polycyclic moieties and/or in between $M_1$ and $M_2$. The one or more polycyclic moieties typically are π-conjugated, and can have a reduction potential greater than about −2.6 V and/or optionally include one or more electron-withdrawing groups. In various embodiments, $M_2$ as a whole can comprise a highly conjugated system.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components and can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "polymer" or "polymeric compound" refers to a molecule (e.g., a macromolecule) including a plurality of one or more repeating units connected by covalent chemical bonds. A polymer can be represented by the general formula:

wherein M is the repeating unit or monomer, and n is the number of M's in the polymer. For example, if n is 3, the polymer shown above is understood to be:

M-M-M.

The polymer or polymeric compound can have only one type of repeating unit as well as two or more types of different repeating units. In the former case, the polymer can be referred to as a homopolymer. In the latter case, the term "copolymer" or "copolymeric compound" can be used instead, especially when the polymer includes chemically significantly different repeating units. The polymer or polymeric compound can be linear or branched. Branched polymers can include dendritic polymers, such as dendronized polymers, hyperbranched polymers, brush polymers (also called bottle-brushes), and the like. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and can be optionally substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which can be optionally substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which can be optionally substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and can include polycyclic aromatic hydrocarbons such as rylenes (or analogs thereof containing one or more heteroatoms) having the formula:

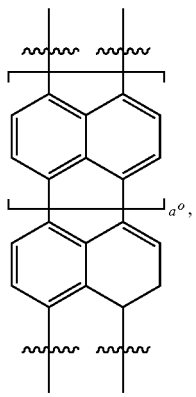

where $a^o$ can be an integer in the range of 0-3; coronenes (or analogs thereof containing one or more heteroatoms) having the formula:

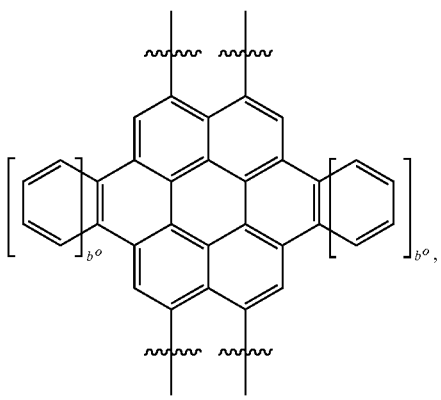

where $b^o$ can be an integer in the range of 0-3; and linear acenes (or analogs thereof containing one or more heteroatoms) having the formula:

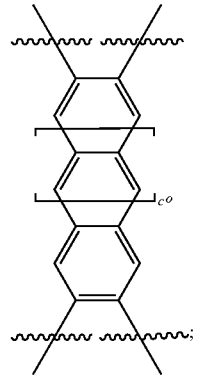

where $c^o$ can be an integer in the range of 0-4. The fused ring moiety can be optionally substituted as described herein.

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula $—C_zH_{2z+1-t}X^o_t$, where $X^o$, at each occurrence, is F, Cl, Br or I, z is an integer in the range of 1 to 40, and t is an integer in the range of 1 to 81, provided that t is less than or equal to 2z+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S-alkyl group (which, in some cases, can be expressed as —S(O)$_m$-alkyl, wherein m is 0). Examples of alkylthio groups include, but are not limited to, methylthio, ethylthio, propylthio (e.g., n-propylthio and isopropylthio), t-butylthio, pentylthio, hexylthio groups, and the like. The alkyl group in the —S-alkyl group can be substituted as described herein.

As used herein, "arylalkyl" refers to an -alkyl-aryl group, where the arylalkyl group is covalently linked to the defined chemical structure via the alkyl group. An arylalkyl group is within the definition of a —Y—$C_{6-14}$ aryl group, where Y is as defined herein. An example of an arylalkyl group is a benzyl group (—$CH_2$—$C_6H_5$). An arylalkyl group can be optionally substituted, i.e., the aryl group and/or the alkyl group, can be substituted as disclosed herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, "cycloalkyl" refers to a non-aromatic carbocyclic group including cyclized alkyl, alkenyl, and alkynyl groups. In various embodiments, a cycloalkyl group can have 3 to 22 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 22 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group (e.g., —$C_{6-22}$ aryl-$C_{6-22}$ aryl group). Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

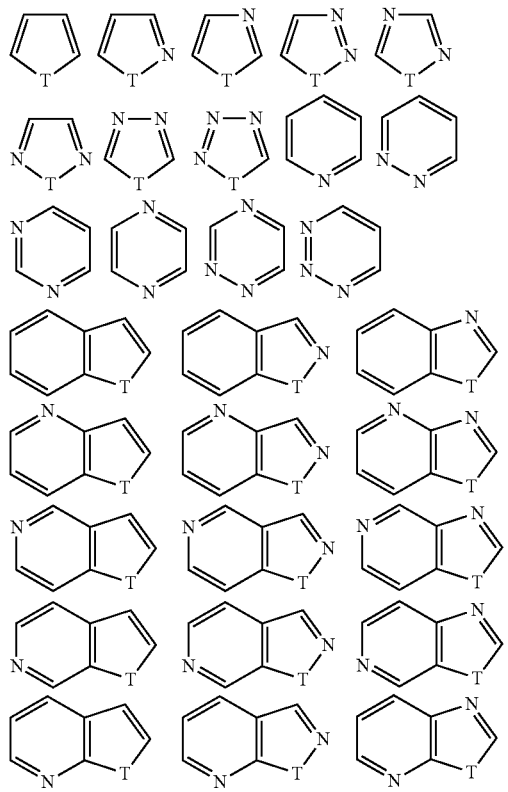

where T is O, S, NH, N-alkyl, N-aryl, N-(arylalkyl) (e.g., N-benzyl), SiH$_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Polymers of the present teachings can include a "divalent group" defined herein as a linking group capable of forming a covalent bond with two other moieties. For example, polymers of the present teachings can include a divalent C$_{1-20}$ alkyl group (e.g., a methylene group), a divalent C$_{2-20}$ alkenyl group (e.g., a vinylyl group), a divalent C$_{2-20}$ alkynyl group (e.g., an ethynylyl group), a divalent C$_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

Polymers described herein can contain an asymmetric atom (also referred as a chiral center) and some of the compounds can contain two or more asymmetric atoms or centers, which can thus give rise to optical isomers (enantiomers) and diastereomers (geometric isomers). The present teachings include such optical isomers and diastereomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of polymers containing alkenyl moieties (e.g., alkenes, azo, and imines). It also should be understood that the polymers of the present teachings encompass all possible regioisomers in pure form and mixtures thereof. In some embodiments, the preparation of the present polymers can include separating such isomers using standard separation procedures known to those skilled in the art, for example, by using one or more of column chromatography, thin-layer chromatography, simulated moving-bed chromatography, and high-performance liquid chromatography. However, mixtures of regioisomers can be used similarly to the uses of each individual regioisomer of the present teachings as described herein and/or known by a skilled artisan.

It is specifically contemplated that the depiction of one regioisomer includes any other regioisomers and any regioisomeric mixtures unless specifically stated otherwise.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halogen (e.g., Cl, Br, I), azide (N$_3$), thiocyanate (SCN), nitro (NO$_2$), cyanate (CN), water (H$_2$O), ammonia (NH$_3$), and sulfonate groups (e.g., OSO$_2$—R, wherein R can be a C$_{1-10}$ alkyl group or a C$_{6-14}$ aryl group each optionally substituted with 1-4 groups independently selected from a C$_{1-10}$ alkyl group and an electron-withdrawing group) such as tosylate (toluenesulfonate, OTs), mesylate (methanesulfonate, OMs), brosylate (p-bromobenzenesulfonate, OBs), nosylate (4-nitrobenzenesulfonate, ONs), and triflate (trifluoromethanesulfonate, OTf).

As used herein, a "p-type semiconductor material" or a "p-type semiconductor" refers to a semiconductor material having holes as the majority current carriers. In some embodiments, when a p-type semiconductor material is deposited on a substrate, it can provide a hole mobility in excess of about 10$^{-5}$ cm$^2$/Vs. In the case of field-effect devices, a p-type semiconductor can also exhibit a current on/off ratio of greater than about 10.

As used herein, an "n-type semiconductor material" or an "n-type semiconductor" refers to a semiconductor material having electrons as the majority current carriers. In some embodiments, when an n-type semiconductor material is deposited on a substrate, it can provide an electron mobility in excess of about 10$^{-5}$ cm$^2$/Vs. In the case of field-effect devices, an n-type semiconductor can also exhibit a current on/off ratio of greater than about 10.

As used herein, "field effect mobility" refers to a measure of the velocity with which charge carriers, for example, holes (or units of positive charge) in the case of a p-type semiconductor material and electrons in the case of an n-type semiconductor material, move through the material under the influence of an electric field.

As used herein, a compound can be considered "ambient stable" or "stable at ambient conditions" when the carrier mobility or the reduction-potential of the compound is maintained at about its initial measurement when the compound is exposed to ambient conditions, for example, air, ambient temperature, and humidity, over a period of time. For example, a compound can be described as ambient stable if its carrier mobility or reduction potential does not vary more than 20% or more than 10% from its initial value after exposure to ambient conditions, including, air, humidity and temperature, over a 3 day, 5 day, or 10 day period.

As used herein, "solution-processable" refers to compounds (e.g., polymers), materials, or compositions that can be used in various solution-phase processes including spin-coating, printing (e.g., inkjet printing, screen printing, pad printing, offset printing, gravure printing, flexographic printing, lithographic printing, mass-printing and the like), spray coating, electrospray coating, drop casting, dip coating, and blade coating.

Throughout the specification, structures may or may not be presented with chemical names. Where any question arises as to nomenclature, the structure prevails.

The present teachings provide polymers that can be represented by the formula:

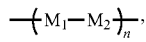

wherein $M_1$ is an optionally substituted aromatic imide, $M_2$ is a repeating unit that includes one or more optionally substituted polycyclic moieties, and n is an integer greater than or equal to 2.

For example, $M_1$ can have the formula:

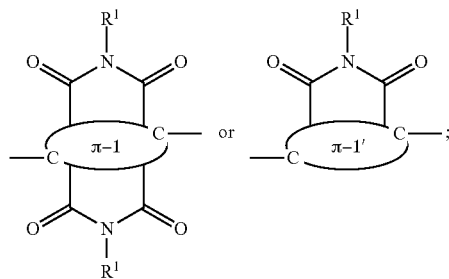

$M_2$ can have a formula selected from:

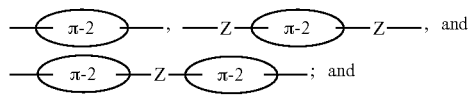

n can be an integer between 2 and 5,000;
wherein:
each of π-1 and π-1' is an optionally substituted fused ring moiety;
π-2, at each occurrence, is independently an optionally substituted polycyclic moiety;
Z, at each occurrence, is independently a linear conjugated linker; and $R^1$, at each occurrence, is independently selected from H, a $C_{1-40}$ alkyl group, a $C_{2-40}$ alkenyl group, a $C_{1-40}$ haloalkyl group, and 1-4 cyclic moieties,
wherein:
each of the $C_{1-40}$ alkyl group, the $C_{2-40}$ alkenyl group, and the $C_{1-40}$ haloalkyl group can be optionally substituted with 1-10 substituents independently selected from a halogen, —CN, $NO_2$, OH, —$NH_2$, —NH($C_{1-20}$ alkyl), —N($C_{1-20}$ alkyl)$_2$, —S(O)$_2$OH, —CHO, —C(O)—$C_{1-20}$ alkyl, —C(O)OH, —C(O)—O$C_{1-20}$ alkyl, —C(O)NH$_2$, —C(O)NH—$C_{1-20}$ alkyl, —C(O)N($C_{1-20}$ alkyl)$_2$, —O$C_{1-20}$ alkyl, —SiH$_3$, —SiH($C_{1-20}$ alkyl)$_2$, —SiH$_2$($C_{1-20}$ alkyl), and —Si($C_{1-20}$ alkyl)$_3$;
each of the $C_{1-40}$ alkyl group, the $C_{2-40}$ alkenyl group, and the $C_{1-40}$ haloalkyl group can be covalently bonded to the imide nitrogen atom via an optional linker; and
each of the 1-4 cyclic moieties can be the same or different, can be covalently bonded to each other or the imide nitrogen via an optional linker, and can be optionally substituted with 1-5 substituents independently selected from a halogen, oxo, —CN, $NO_2$, OH, αC(CN)$_2$, —NH$_2$, —NH($C_{1-20}$ alkyl), —N($C_{1-20}$ alkyl)$_2$, —S(O)$_2$OH, —CHO, —C(O)OH, —C(O)—$C_{1-20}$ alkyl, —C(O)—O$C_{1-20}$ alkyl, —C(O)NH$_2$, —C(O)NH—$C_{1-20}$ alkyl, —C(O)N($C_{1-20}$ alkyl)$_2$, —SiH$_3$, —SiH($C_{1-20}$ alkyl)$_2$, —SiH$_2$($C_{1-20}$ alkyl), —Si($C_{1-20}$ alkyl)$_3$, —O—$C_{1-20}$ alkyl, —O—$C_{1-20}$ haloalkyl, a $C_{1-20}$ alkyl group, a $C_{1-20}$ alkenyl group, and a $C_{1-20}$ haloalkyl group.

In some embodiments, each of π-1 and π-1' can be a fused ring moiety optionally substituted with 1-6 $R^a$ groups, and π-2 can be a polycyclic moiety optionally substituted with 1-6 $R^a$ groups, wherein:
$R^a$, at each occurrence, is independently a) halogen, b) —CN, c) —NO$_2$, d) oxo, e) —OH, f) =C($R^b$)$_2$, g) a $C_{1-40}$ alkyl group, h) a $C_{2-40}$ alkenyl group, i) a $C_{2-40}$ alkynyl group, j) a $C_{1-40}$ alkoxy group, k) a $C_{1-40}$ alkylthio group, l) a $C_{1-40}$ haloalkyl group, m) a —Y—$C_{3-10}$ cycloalkyl group, n) a —Y—$C_{6-14}$ aryl group, o) a —Y—$C_{6-14}$ haloaryl group, p) a —Y-3-12 membered cycloheteroalkyl group, or q) a —Y-5-14 membered heteroaryl group, wherein each of the $C_{1-40}$ alkyl group, the $C_{2-40}$ alkenyl group, the $C_{2-40}$ alkynyl group, the $C_{3-10}$ cycloalkyl group, the $C_{6-14}$ aryl group, the $C_{6-14}$ haloaryl group, the 3-12 membered cycloheteroalkyl group, and the 5-14 membered heteroaryl group is optionally substituted with 1-4 $R^b$ groups;
$R^b$, at each occurrence, is independently a) halogen, b) —CN, c) —NO$_2$, d) oxo, e) —OH, f) —NH$_2$, g) —NH($C_{1-20}$ alkyl), h) —N($C_{1-20}$ alkyl)$_2$, i) —N($C_{1-20}$ alkyl)-$C_{6-14}$ aryl, j) —N($C_{6-14}$ aryl)$_2$, k) —S(O)$_m$H, l) —S(O)$_m$—$C_{1-20}$ alkyl, m) —S(O)$_2$OH, n) —S(O)$_m$—O$C_{1-20}$ alkyl, o) —S(O)$_m$—O$C_{6-14}$ aryl, p) —CHO, q) —C(O)—$C_{1-20}$ alkyl, r) —C(O)—$C_{6-14}$ aryl, s) —C(O)OH, t) —C(O)—O$C_{1-20}$ alkyl, u) —C(O)—O$C_{6-14}$ aryl, v) —C(O)NH$_2$, w) —C(O)NH—$C_{1-20}$ alkyl, x) —C(O)N($C_{1-20}$ alkyl)$_2$, y) —C(O)NH—$C_{6-14}$ aryl, z) —C(O)N($C_{1-20}$ alkyl)-$C_{6-14}$ aryl, aa) —C(O)N($C_{6-14}$ aryl)$_2$, ab) —C(S)NH$_2$, ac) —C(S)NH—$C_{1-20}$ alkyl, ad) —C(S)N($C_{1-20}$ alkyl)$_2$, ae) —C(S)N($C_{6-14}$ aryl)$_2$, af) —C(S)N($C_{1-20}$ alkyl)-$C_{6-14}$ aryl, ag) —C(S)NH—$C_{6-14}$ aryl, ah) —S(O)$_m$NH$_2$, ai) —S(O)$_m$NH($C_{1-20}$ alkyl), aj) —S(O)$_m$N($C_{1-20}$ alkyl)$_2$, ak) —S(O)$_m$NH($C_{6-14}$ aryl), al) —S(O)$_m$N($C_{1-20}$ alkyl)-$C_{6-14}$ aryl, am) —S(O)$_m$N($C_{6-14}$ aryl)$_2$, an) —SiH$_3$, ao) —SiH($C_{1-20}$ alkyl)$_2$, ap) —SiH$_2$($C_{1-20}$ alkyl), aq) —Si($C_{1-20}$alkyl)$_3$, ar) a $C_{1-20}$ alkyl group, as) a $C_{2-20}$ alkenyl group, at) a $C_{2-20}$ alkynyl group, au) a $C_{1-20}$ alkoxy group, av) a $C_{1-20}$ alkylthio group, aw) a $C_{1-20}$ haloalkyl group, ax) a $C_{3-10}$ cycloalkyl group, ay) a $C_{6-14}$ aryl group, az) a $C_{6-14}$ haloaryl group, ba) a 3-12 membered cycloheteroalkyl group, or bb) a 5-14 membered heteroaryl group;

Y, at each occurrence, is independently a divalent $C_{1-20}$ alkyl group, a divalent $C_{1-20}$ haloalkyl group, or a covalent bond; and m, at each occurrence, is independently 0, 1, or 2.

In some embodiments, $R^1$, at each occurrence, can be independently selected from H, a $C_{1-40}$ alkyl group, a $C_{2-40}$ alkenyl group, a $C_{1-40}$ haloalkyl group, -L-$Ar^1$, -L-$Ar^1$—$Ar^1$, -L-$Ar^1$—$R^2$, -L-$Ar^1$—$Ar^1$—$R^2$, -L-$Cy^1$, -L-$Cy^1$-$Cy^1$, -L-$Cy^1$-$R^2$, and -L-$Cy^1$-$Cy^1$-$R^2$;

wherein:

L, at each occurrence, is independently selected from —Y—O—Y—, —Y—[S(O)$_m$]—Y—, —Y—C(O)—Y—, —Y—[NR$^c$C(O)]—Y—, —Y—[C(O)NR$^c$]—, —Y—NR$^c$—, —Y—[SiR$^c_2$]—Y—, a divalent $C_{1-20}$ alkyl group, a divalent $C_{1-20}$ alkenyl group, a divalent $C_{1-20}$ haloalkyl group, and a covalent bond;

wherein:

$R^c$, at each occurrence, is independently H, a $C_{1-6}$ alkyl group, or a —Y—$C_{6-14}$ aryl group;

$Ar^1$, at each occurrence, is independently a monovalent or divalent $C_{6-14}$ aryl group or a 5-14 membered heteroaryl group, each optionally substituted with 1-5 substituents independently selected from a halogen, —CN, oxo, =C(CN)$_2$, a $C_{1-6}$ alkyl group, a $C_{1-6}$ alkoxy group, and a $C_{1-6}$ haloalkyl group; and $Cy^1$, at each occurrence, is independently a monovalent or divalent $C_{3-14}$ cycloalkyl group or a 3-14 membered cycloheteroalkyl group, each optionally substituted with 1-5 substituents independently selected from a halogen, —CN, oxo, =C(CN)$_2$, a $C_{1-6}$ alkyl group, a $C_{1-6}$ alkoxy group, and a $C_{1-6}$ haloalkyl group;

$R^2$, at each occurrence, is independently selected from a $C_{1-40}$ alkyl group, a $C_{2-40}$ alkenyl group, a $C_{1-40}$ haloalkyl group, a $C_{1-40}$ alkoxy group, -L'-$Ar^2$, -L'-$Ar^2$—$Ar^2$, -L'-$Ar^2$—$R^3$, -L'-$Ar^2$—$Ar^2$—$R^3$, -L'-$Cy^2$, -L'-$Cy^2$-$Cy^2$, -L'-$Cy^2$-$R^3$, -L'-$Cy^2$-$Cy^2$-$R^3$;

wherein:

L', at each occurrence, is independently selected from —Y—O—Y—, —Y—[S(O)$_m$]—Y—, —Y—C(O)—Y—, —Y—[NR$^c$C(O)]—Y—, —Y—[C(O)NR$^c$]—, —Y—NR$^c$—, —Y—[SiR$^c_2$]—Y—, a divalent $C_{1-20}$ alkyl group, a divalent $C_{1-20}$ alkenyl group, a divalent $C_{1-20}$ haloalkyl group, and a covalent bond;

$Ar^2$, at each occurrence, is independently a monovalent or divalent $C_{6-14}$ aryl group or a 5-14 membered heteroaryl group, each optionally substituted with 1-5 substituents independently selected from halogen, oxo, —CN, =C(CN)$_2$, a $C_{1-6}$ alkyl group, a $C_{1-6}$ alkoxy group, and a $C_{1-6}$ haloalkyl group;

$Cy^2$, at each occurrence, is independently a monovalent or divalent $C_{3-14}$ cycloalkyl group or a 3-14 membered cycloheteroalkyl group, each optionally substituted with 1-5 substituents independently selected from a halogen, oxo, —CN, =C(CN)$_2$, a $C_{1-6}$ alkyl group, a $C_{1-6}$ alkoxy group, and a $C_{1-6}$ haloalkyl group;

$R^3$, at each occurrence, is a $C_{1-40}$ alkyl group, a $C_{2-40}$ alkenyl group, a $C_{1-40}$ haloalkyl group, or a $C_{1-40}$ alkoxy group; and Y and m are as defined herein.

The present teachings, therefore, provide A-B copolymers, where repeating unit A or $M_1$ includes a π-1 core or a π-1' core and repeating unit B or $M_2$ includes a π-2 core. The π-1 core or the π-1' core of repeating unit A and the π-2 core of repeating unit B are typically bonded to each other via carbon atoms.

Accordingly, certain embodiments of the present polymers can have formula I or formula I':

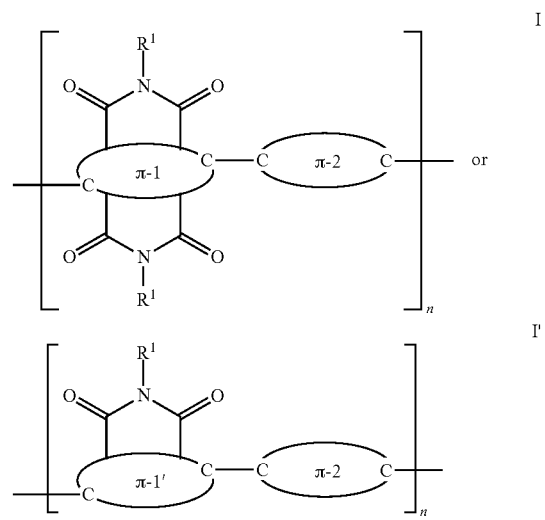

wherein π-1, π-1', π-2, $R^1$, and n are as defined herein.

In various embodiments, π-1 can be an aromatic hydrocarbon (e.g., benzene, naphthalene, anthracene, tetracene, pentacene, perylene, pyrene, coronene) that is tetravalent and can form covalent bonds with two dicarboxylic imide groups, and can be optionally substituted with 1-4 $R^a$ groups, where $R^a$ is as defined herein. In some embodiments, one or more (e.g., 1-4) carbon ring atoms of the aromatic hydrocarbons can be replaced with a heteroatom such as Si, N, or P (i.e., heteroaryl). In some embodiments, π-1 can be selected from:

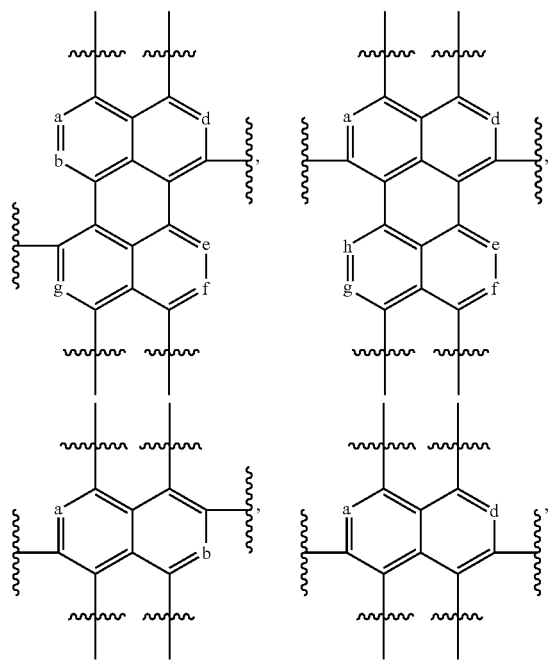

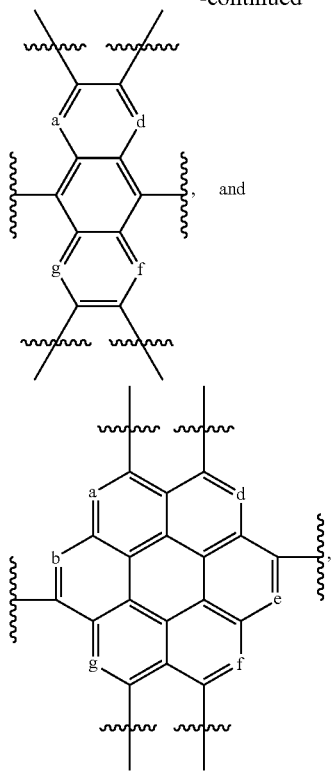

where a, b, d, e, f, g, and h independently are CH, CR$^a$, SiH, SiR$^a$, N, or P, and R$^a$ is as defined herein.

In various embodiments, π-1' can be an aromatic hydrocarbon (e.g., benzene, naphthalene, anthracene, tetracene, pentacene, perylene, pyrene, coronene) that is bivalent and can form covalent bonds with one dicarboxylic imide group, and can be optionally substituted with 1-4 R$^a$ groups, where R$^a$ is as defined herein. In some embodiments, one or more (e.g., 1-4) carbon ring atoms of the aromatic hydrocarbons can be replaced with a heteroatom such as Si, N, or P (i.e., heteroaryl). In some embodiments, each π-1' in the compound of formula I' can be different. For example, π-1', at each occurrence, can be selected from:

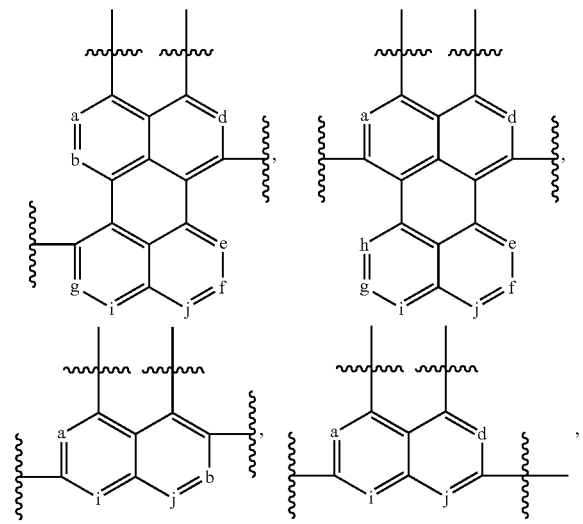

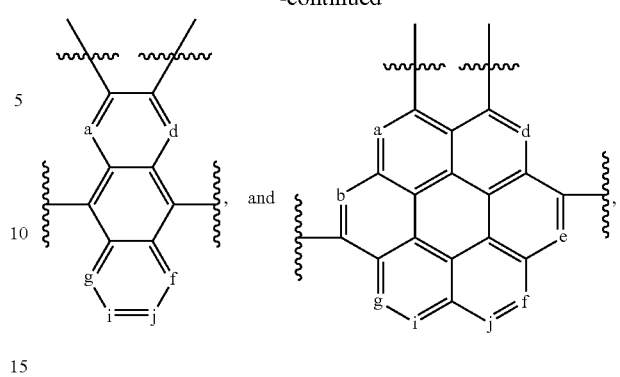

where a, b, d, e, f, g, h, i, and j independently are CH, CR$^a$, SiH, SiR$^a$, N, or P, and R$^a$ is as defined herein.

To enhance the physical and/or electrochemical properties of the polymer, one or more electron-withdrawing groups can be substituted onto the π-1, and π-2 cores. Accordingly, in certain embodiments, a, b, d, e, f, g, h, i, and j independently can be CH or CR$^a$.

In particular embodiments, π-1 can be selected from:

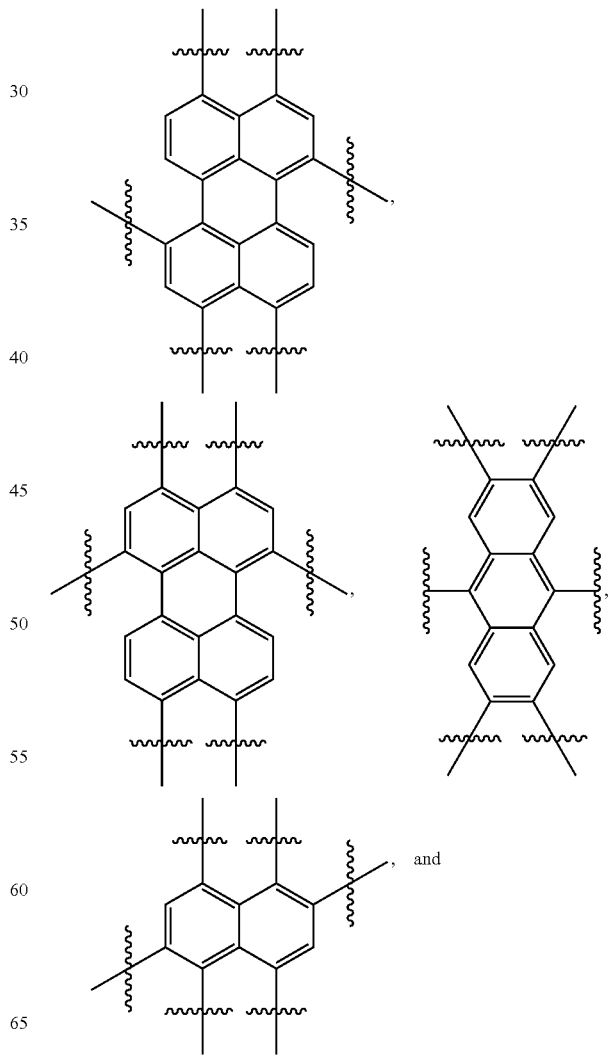

-continued

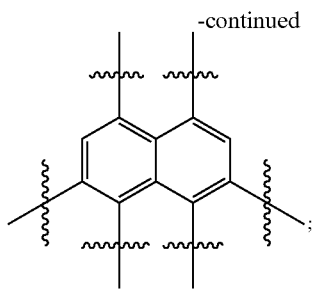

where each of these groups can be optionally substituted with 1-4 $R^a$, and $R^a$ is as defined herein. For example, π-1 can be a rylene (e.g., perylene or naphthalene) core that can be optionally substituted as described herein.

In certain embodiments, π-1', at each occurrence, can be selected from:

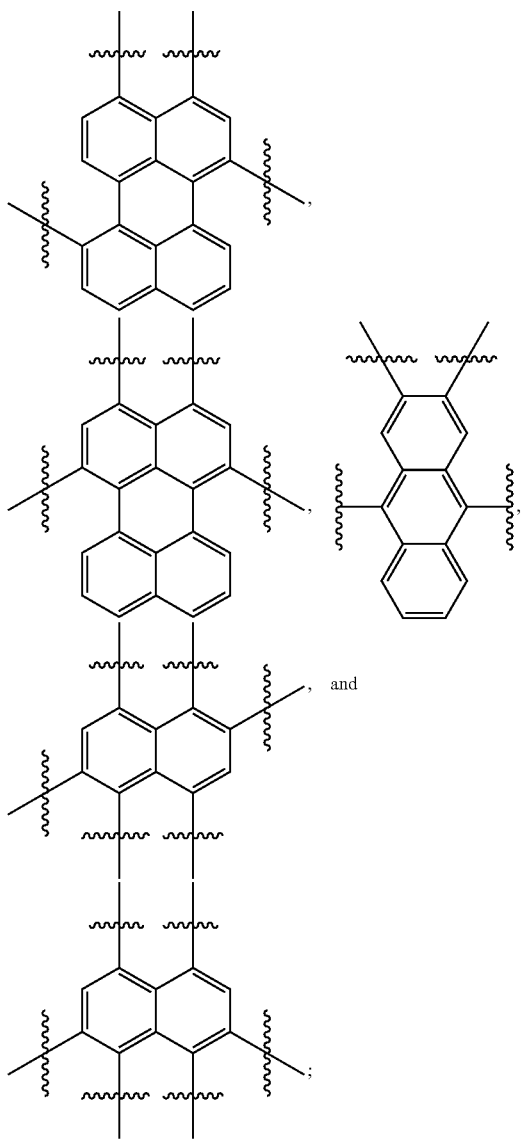

where each of these groups can be optionally substituted with 1-4 $R^a$, and $R^a$ is as defined herein. For example, π-1' can be a rylene (e.g., perylene or naphthalene) core that can be optionally substituted as described herein.

In various embodiments, $M_1$ can be selected from:

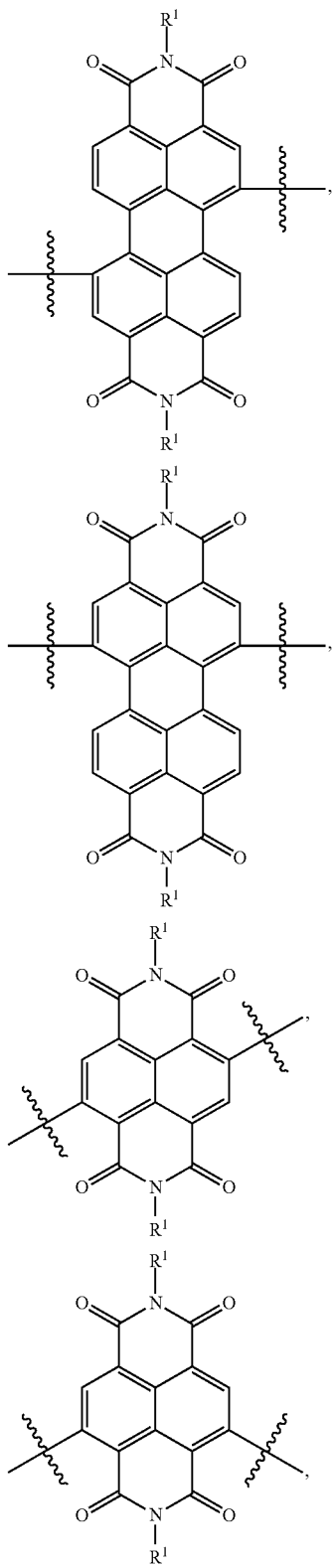

wherein R¹ is as defined herein. Accordingly, polymers of the present teachings can have formula II or formula III:

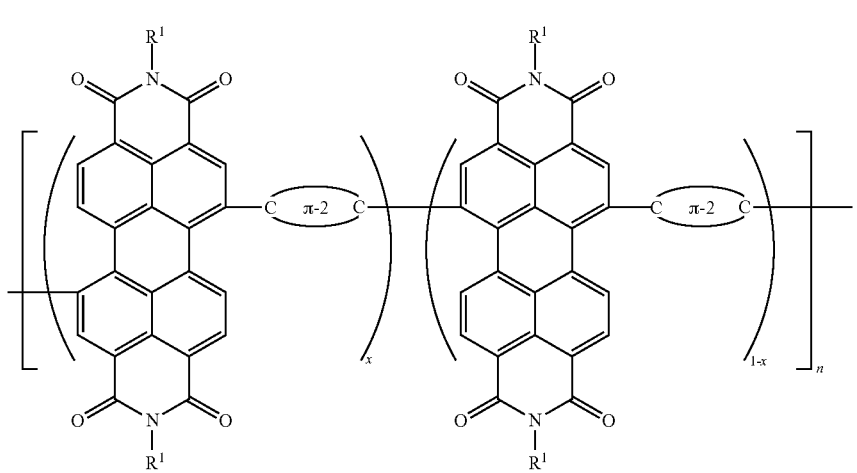

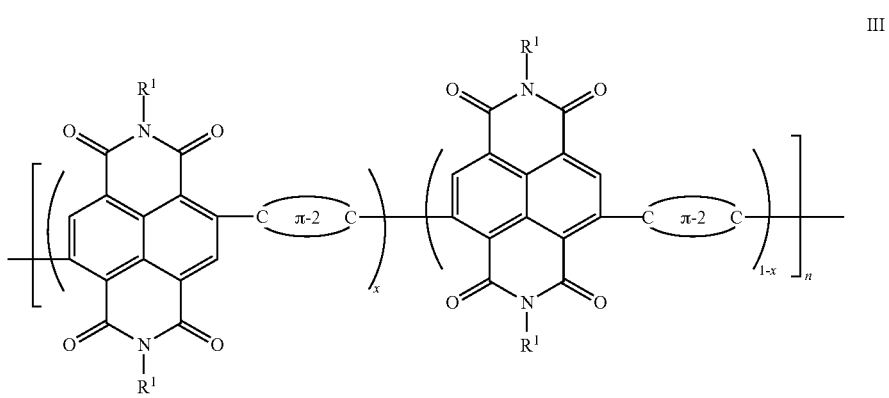

wherein x is a real number and 0<x≤1; and π-2, R¹ and n are as defined herein.

In some embodiments, substitution of alkyl chains (and similar groups such as haloalkyl groups, arylalkyl groups, heteroarylalkyl groups and so forth) on one or both imide nitrogen atoms can improve solubility of the polymer in an organic solvent. Accordingly, in certain embodiments, R¹ can be a linear or branched $C_{3-40}$ alkyl group, examples of which include an n-hexyl group, a 1-methylpropyl group, a 1-methylbutyl group, a 1-methylpentyl group, a 1-methylhexyl group, a 1-ethylpropyl group, a 1-ethylbutyl group, a 1-3, dimethylbutyl group, and a 2-octyldodecyl group. In certain embodiments, R¹ can be a linear or branched $C_{3-40}$ alkenyl group. In particular embodiments, R¹ can be a branched $C_{3-20}$ alkyl group or a branched $C_{3-20}$ alkenyl group. For example, R¹, at each occurrence, independently can be selected from the following:

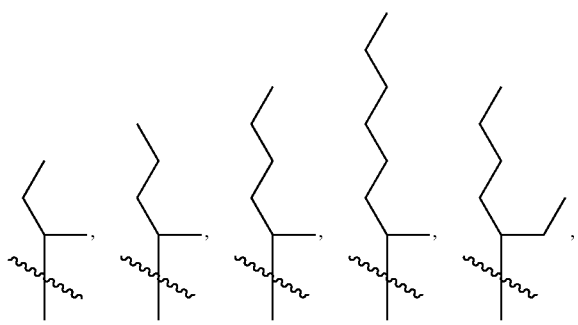

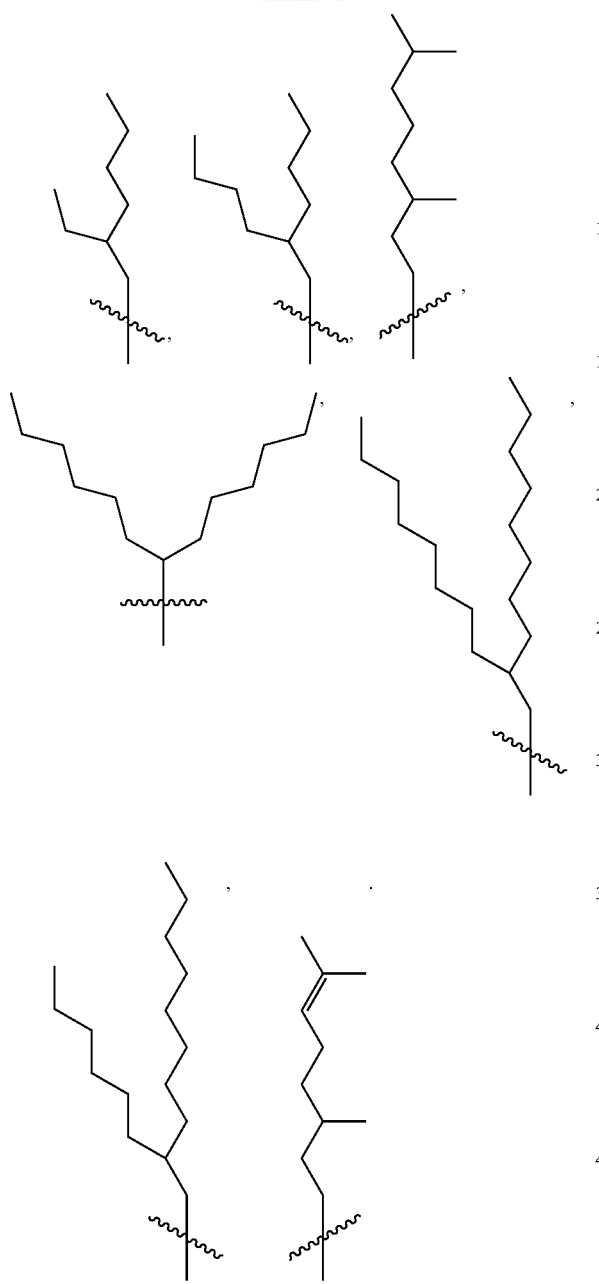

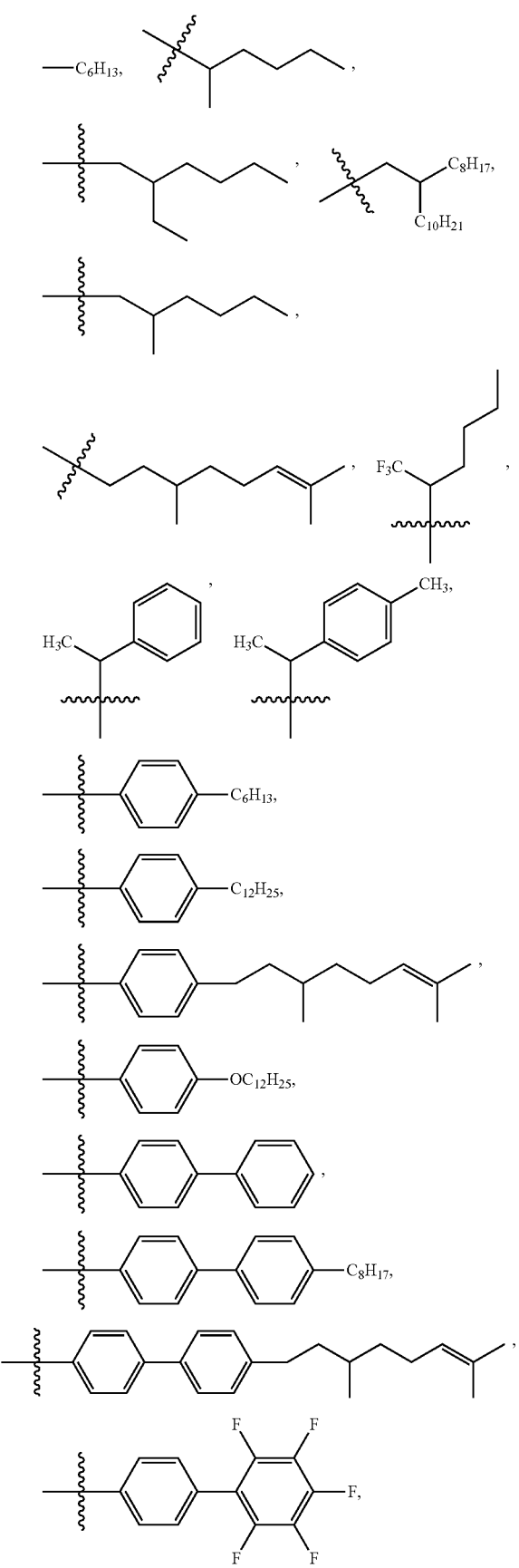

In certain embodiments, $R^1$, at each occurrence, can be a linear or branched $C_{6-40}$ alkyl or alkenyl group, an arylalkyl group optionally substituted with a linear or branched $C_{6-40}$ alkyl or alkenyl group, an aryl group (e.g., a phenyl group) substituted with a linear or branched $C_{6-40}$ alkyl or alkenyl group, or a biaryl group (e.g., a biphenyl group) optionally substituted with a linear or branched $C_{6-40}$ alkyl or alkenyl group, wherein each of these groups optionally can be substituted with 1-5 halo groups (e.g., F). In some embodiments, $R^1$ can be a biaryl group wherein the two aryl groups are covalently linked via a linker (L'). For example, the linker can be a divalent $C_{1-6}$ alkyl group or a carbonyl group. In particular embodiments, $R^1$, at each occurrence, independently can be selected from:

-continued

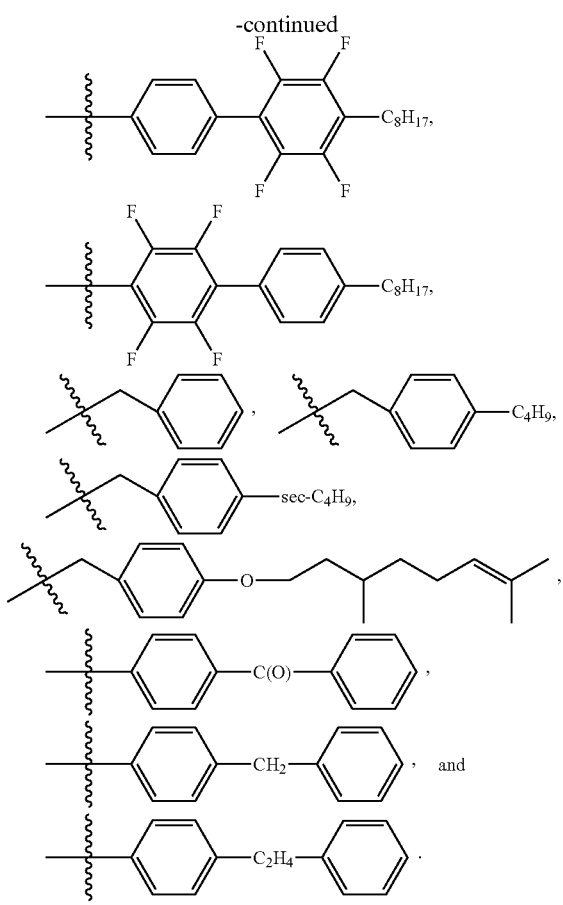

In some embodiments, $R^1$ can be an optionally substituted $C_{6-14}$ cycloalkyl group. For example, $R^1$, at each occurrence, independently can be selected from:

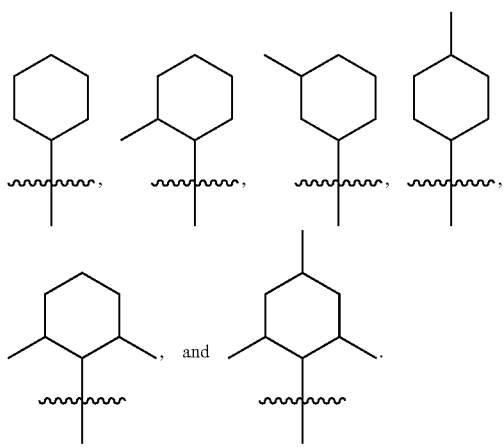

In some embodiments, $M_2$ can have the formula:

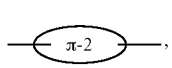

where π-2 is as defined herein. In certain embodiments, π-2 can have a planar and highly conjugated cyclic core. Examples of suitable cyclic cores include naphthalene, anthracene, tetracene, pentacene, perylene, pyrene, coronene, fluorene, indacene, indenofluorene, and tetraphenylene, as well as their analogs in which one or more carbon atoms can be replaced with a heteroatom such as O, S, Si, Se, N, or P.

In certain embodiments, π-2 can be a polycyclic moiety having two or more (e.g., 2, 3, or 4) five-, six-, and/or seven-membered rings, each optionally substituted with 1-6 $R^a$ groups, where $R^a$ is as defined herein. In some embodiments, π-2 can include one or more electron-withdrawing groups, independently selected from a halo group, a carbonyl group, a cyano group, and a dicyanovinylidenyl group.

In various embodiments, π-2 can have a reduction potential greater than (i.e., more positive than) about −2.6 V. In certain embodiments, π-2 can have a reduction potential greater than or equal to about −2.2 V. In particular embodiments, π-2 can have a reduction potential greater than or equal to about −1.2 V. In particular embodiments, π-2 can include at least one electron-withdrawing group.

In some embodiments, π-2 can be a polycyclic moiety including a monocyclic ring (e.g., a 1,3-dioxolane group or a derivative thereof including optional substituents and/or ring heteroatoms) covalently bonded to a second monocyclic ring or a polycyclic system via a spiroatom (e.g., a spiro carbon atom).

In certain embodiments, π-2 can be selected from:

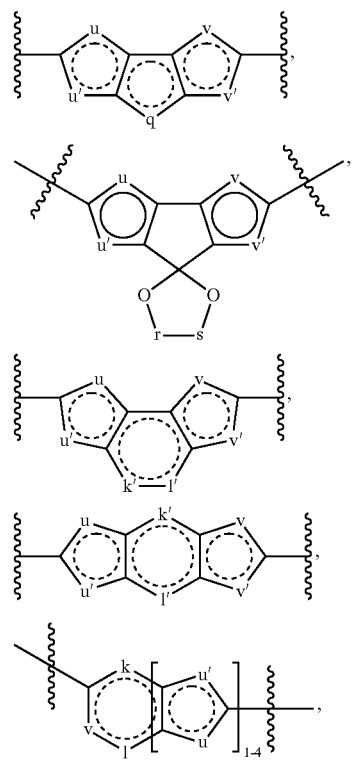

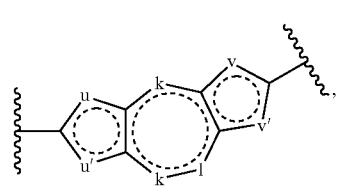

-continued

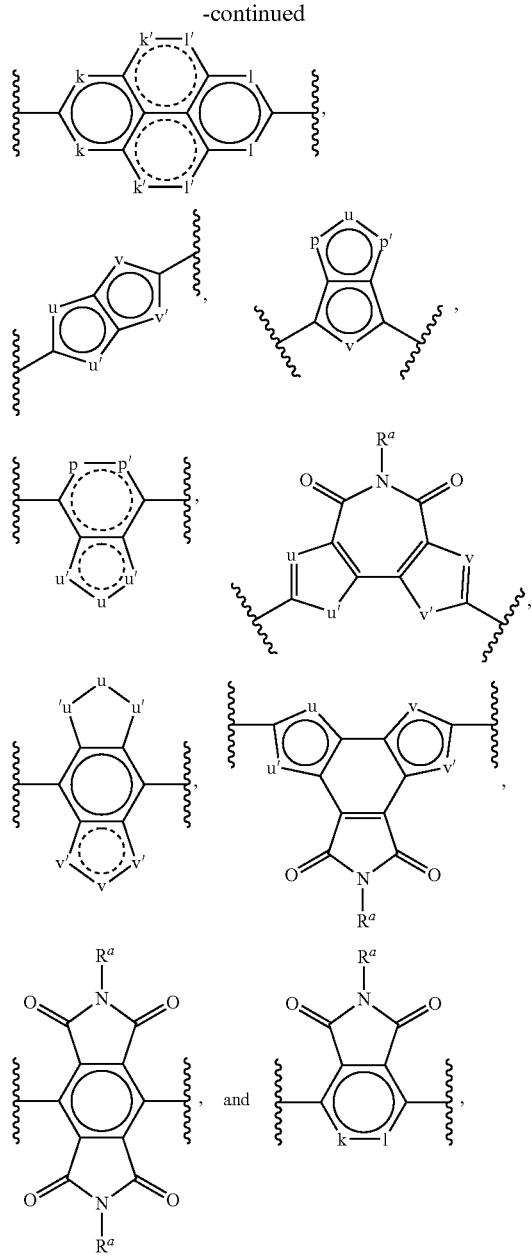

In particular embodiments, π-2 can be selected from:

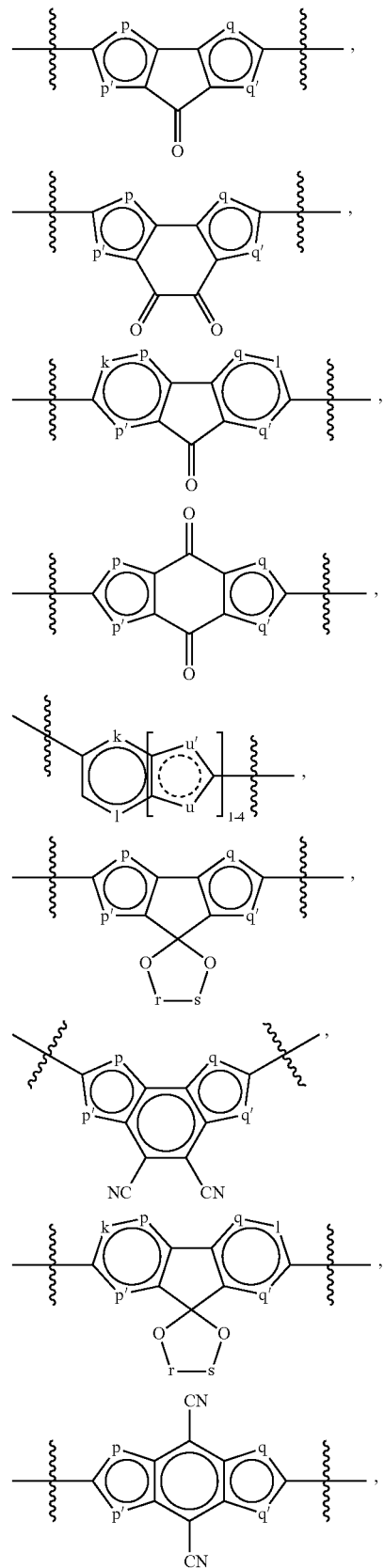

where:

k, k', l and l' independently can be selected from —CR$^d$=, =CR$^d$—, —C(O)—, and —C(C(CN)$_2$)—;

p, p', q and q' independently can be selected from —CR$^d$=, =CR$^d$—, —C(O)—, —C(C(CN)$_2$)—, —O—, —S—, —N=, =N—, —N(R$^d$)—, —SiR$^d$=, =SiR$^d$—, and —SiR$^d$R$^d$—;

r and s independently can be —CR$^d$R$^d$— or —C(C(CN)$_2$)—;

u, u', v and v' independently can be selected from —CR$^d$=, =CR$^d$—, —C(O)—, —C(C(CN)$_2$)—, —S—, —S(O)—, —S(O)$_2$—, —O—, —N=, =N—, —SiR$^d$=, =SiR$^d$—, —SiR$^d$R$^d$—, —CR$^d$R$^d$—CR$^d$R$^d$—, and —CR$^d$=CR$^d$—;

R$^d$, at each occurrence, independently can be H or R$^a$; and

R$^a$ is as defined herein.

29
-continued
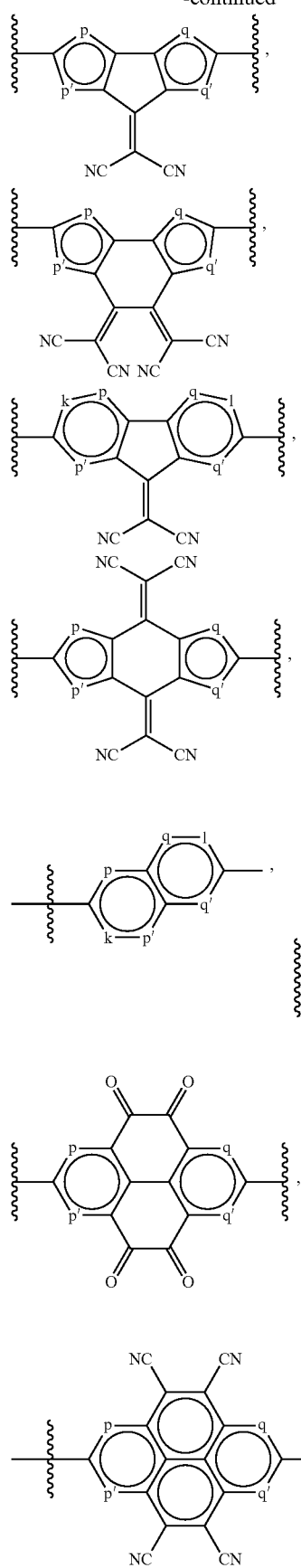
30
-continued
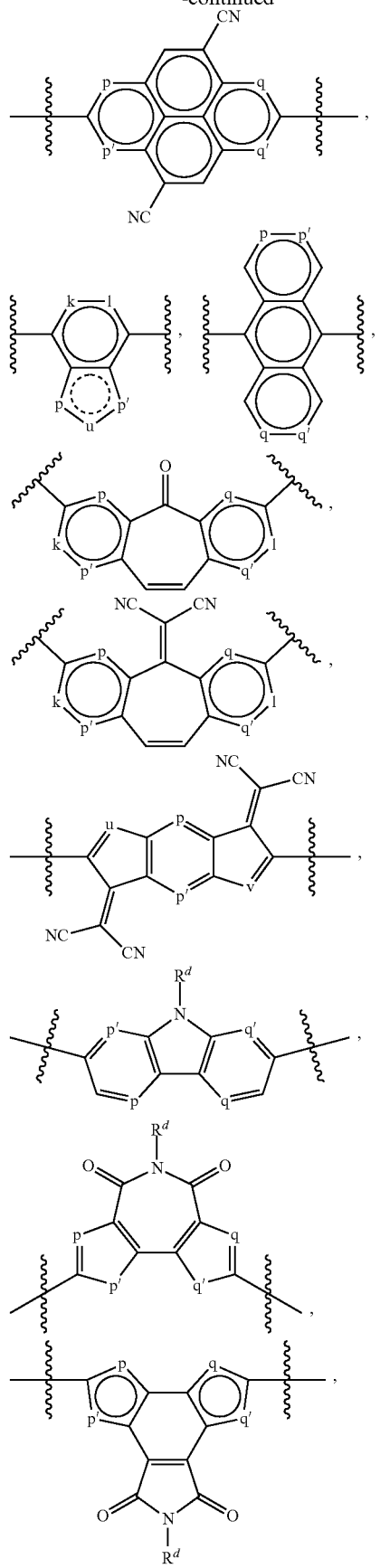

-continued

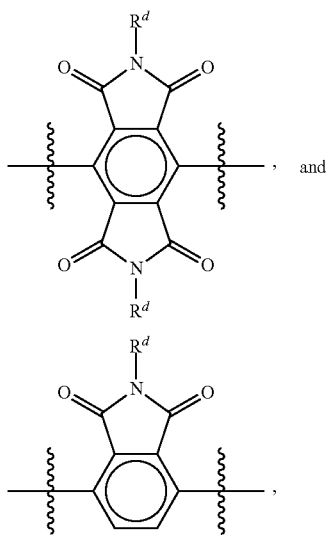

and where k, l, p, p', q, q', r, s and $R^d$ are as defined herein. In some embodiments, k and l independently can be selected from —$CR^d$=, =$CR^d$—, and —C(O)—; p, p', q, and q' independently can be selected from —O—, —S—, N($R^d$)—, —N=, =N—, —$CR^d$=, and =$CR^d$—; u and v independently can be selected from —$CR^d$=, =$CR^d$—, —C(O)—, —C(C(CN)$_2$)—, —S—, —O—, —N=, =N—, —$CR^dR^d$—$CR^dR^d$—, and —$CR^d$=$CR^d$—; where $R^d$ is as defined herein. For example, $R^d$, at each occurrence, independently can be selected from H, a halogen, —CN, —$OR^c$, —N($R^c$)$_2$, a $C_{1-20}$ alkyl group, and a $C_{1-20}$ haloalkyl group, where $R^c$ is as defined herein. Each of r and s can be $CH_2$.

In certain embodiments, $M_2$ can have a polycyclic core (π-2) that includes one or more thienyl or phenyl groups, where each of these groups can be optionally substituted with 1-6 $R^a$ groups, and where $R^a$ is as defined herein. For example, in the various embodiments described above, $R^a$ can be an electron-withdrawing group. For example, $R^a$ can be a halogen, —CN, oxo, =C($R^b$)$_2$, a $C_{1-20}$ alkoxy group, a $C_{1-20}$ alkylthio group, or a $C_{1-20}$ haloalkyl group. In certain embodiments, $R^a$ can be a halogen (e.g., F, Cl, Br, or I), —CN, a $C_{1-6}$ alkoxy group, —OCF$_3$, or —CF$_3$. In particular embodiments, $R^a$ can be =O, —CN, =C(CN)$_2$, F, Cl, Br, or I.

In some embodiments, $M_2$ can be selected from:

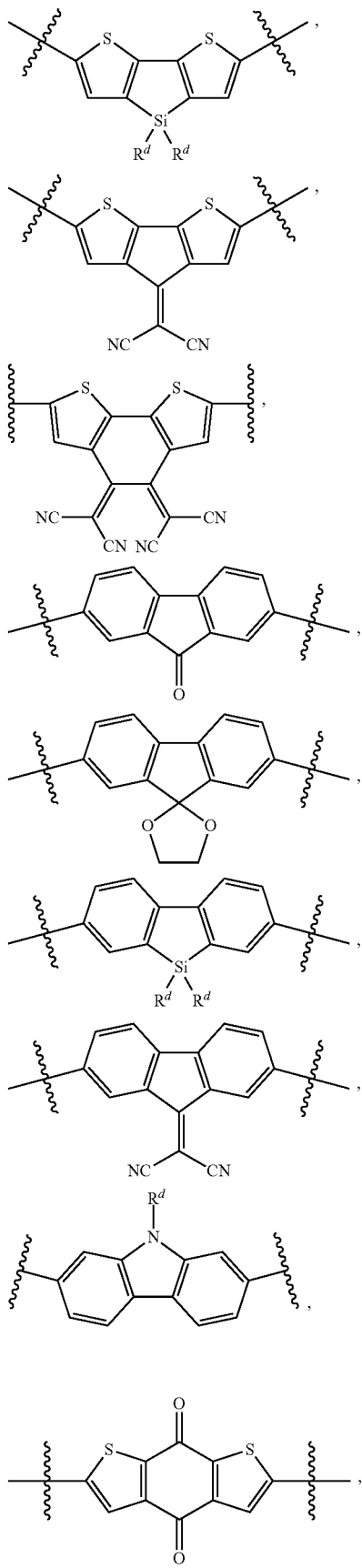

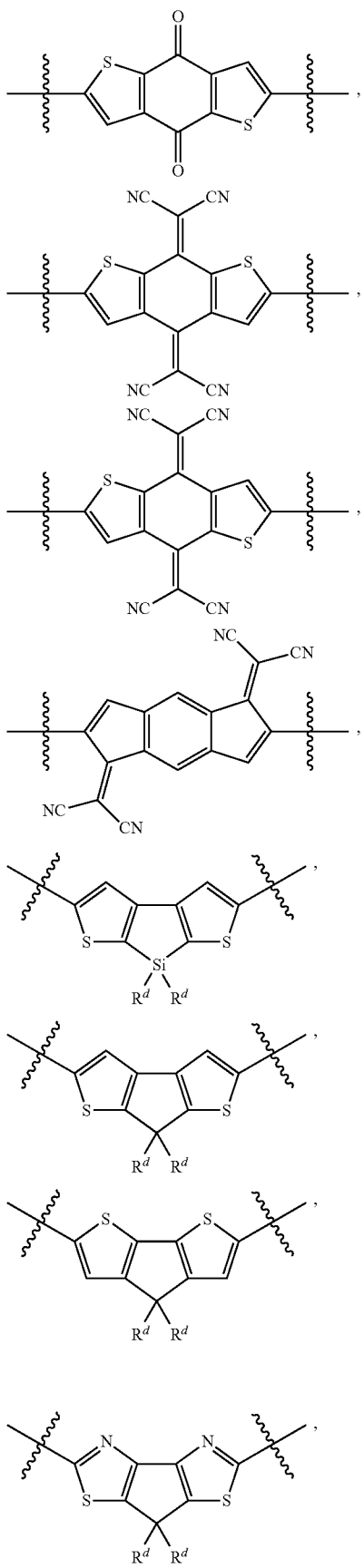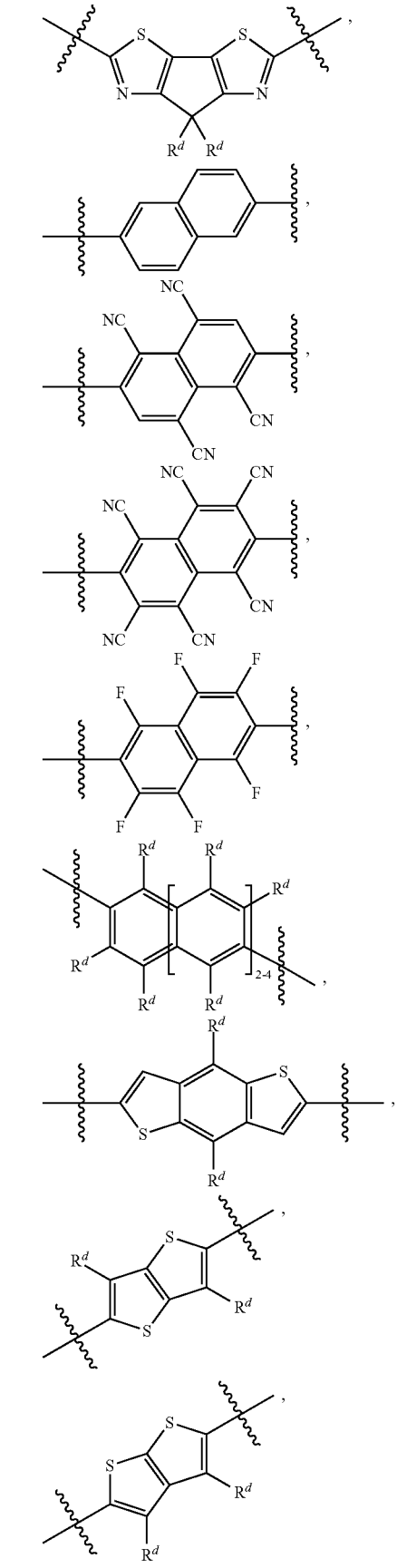

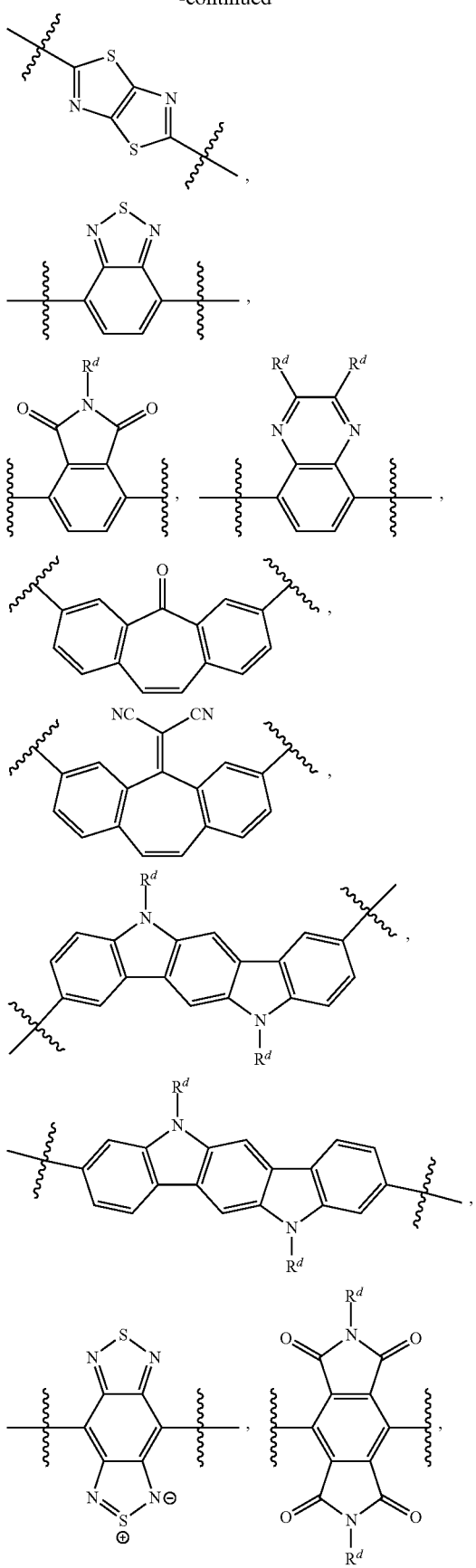

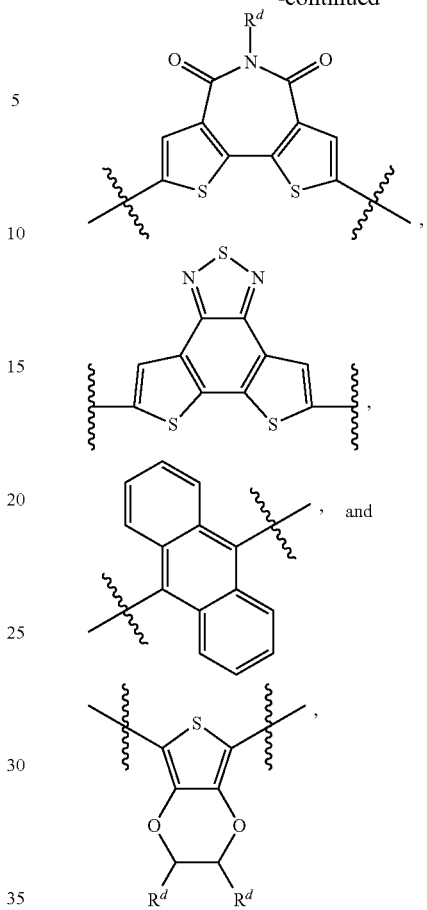

wherein $R^d$ is as defined herein. For example, $R^d$ can be selected from H, a $C_{1-20}$ alkyl group, a $C_{1-20}$ alkoxy group, and a $C_{1-20}$ haloalkyl group.

In other embodiments, $M_2$ can have the formula:

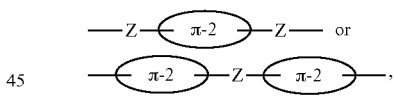

where π-2 and Z are as defined herein. For example, in various embodiments, the linker Z can be a conjugated system by itself (e.g., including two or more double or triple bonds) or can form a conjugated system with its neighboring components. For example, in embodiments where Z is a linear linker, Z can be a divalent ethenyl group (i.e., having one double bond), a divalent ethynyl group (i.e., having one tripe bond), a $C_{4-40}$ alkenyl or alkynyl group that includes two or more conjugated double or triple bonds, or some other non-cyclic conjugated systems that can include heteroatoms such as Si, N, P, and the like. For example, Z can be selected from:

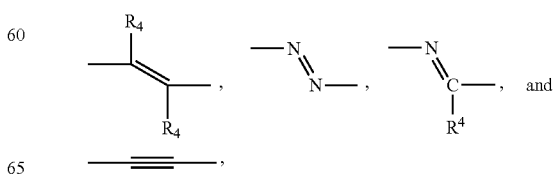

wherein R⁴ is as defined herein. In certain embodiments, Z can be selected from:

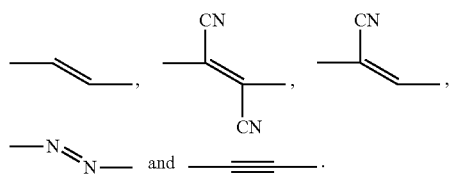

In particular embodiments, M₂ can be selected from:

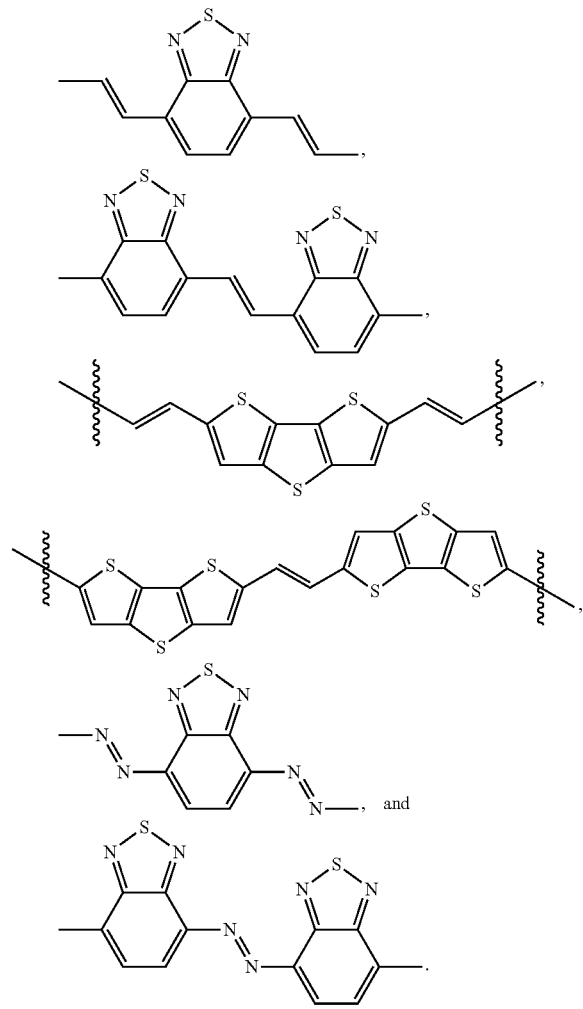

For the various polymers described above, n can be an integer in the range of 2-5,000. For example, n can be 2-1,000, 2-500, 2-400, 2-300, or 2-200. In certain embodiments, n can be 2-100. In some embodiments, n can be an integer between 3 and 1,000. In certain embodiments, n can be 4-1,000, 5-1,000, 6-1,000, 7-1,000, 8-1,000, 9-1,000, or 10-1,000. For example, n can be 8-500, 8-400, 8-300, or 8-200. In certain embodiments, n can be 8-100.

It should be understood that the present teachings can exclude certain embodiments of compounds within the genus of compounds of formula I described above. In some embodiments, the present teachings can exclude certain polymers of formula I where π-2 is an unsubstituted polycyclic moiety. As another example, certain embodiments of the present teachings can exclude polymers of formula I where π-2 is an electron-rich moiety (e.g., a moiety with high electron density because of the aromaticity of the core itself and/or because the core is substituted with one or more electron-donating groups). As a further example, certain embodiments of the present teachings can exclude polymers of formula I where $M_2$ has the formula:

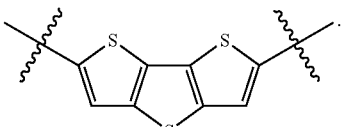

In particular embodiments, polymers of the present teachings do not have a repeating unit of the formula:

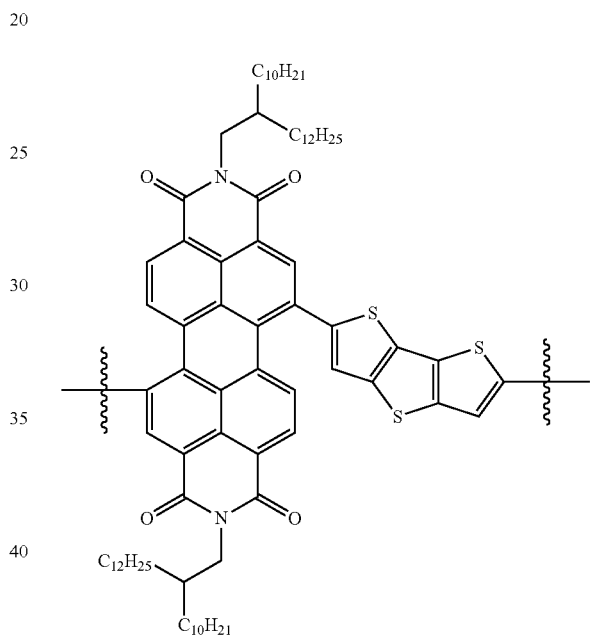

Exemplary polymers of the present teachings include:

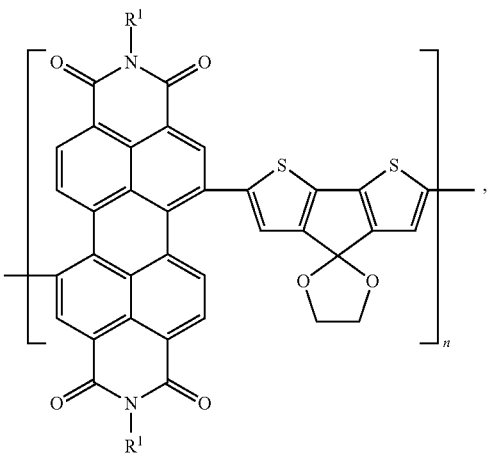

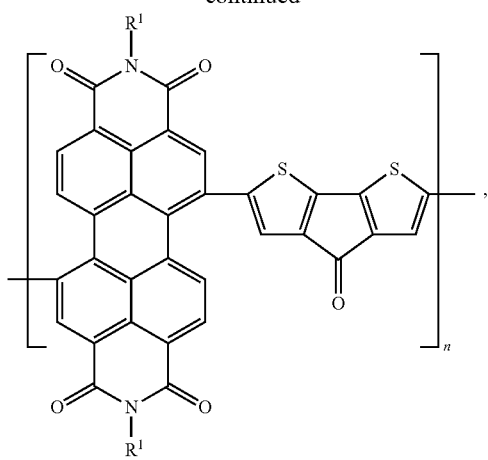
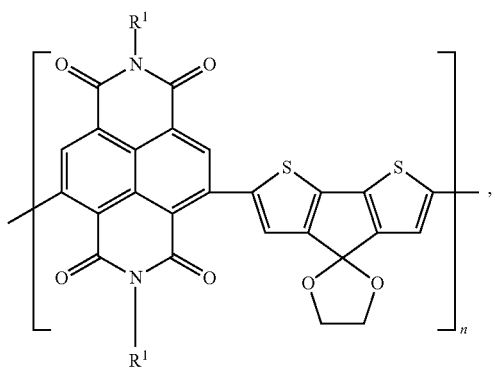
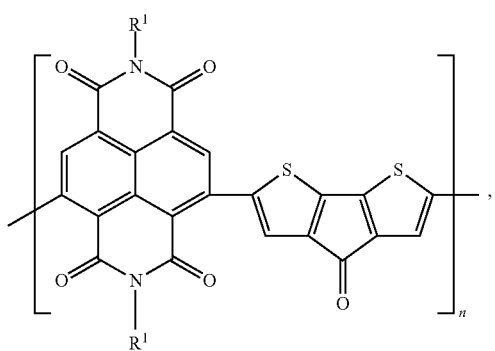
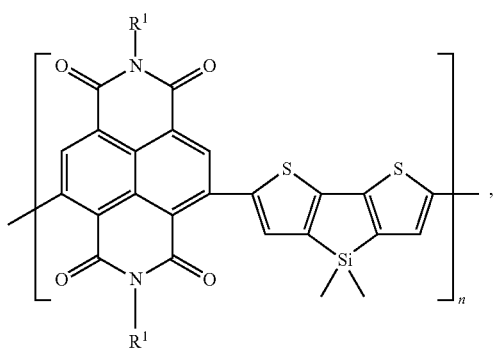
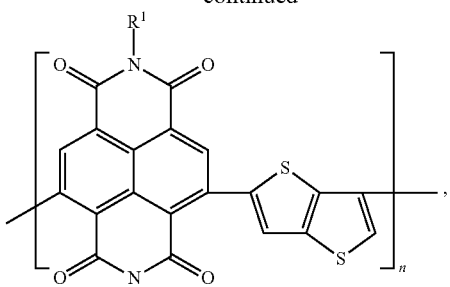
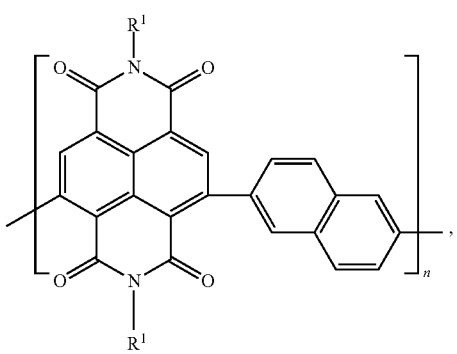
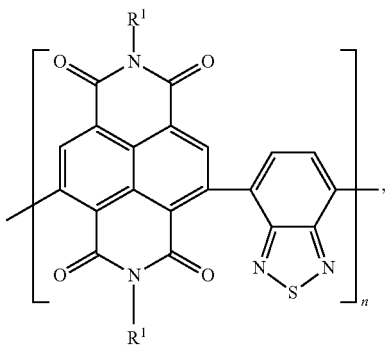
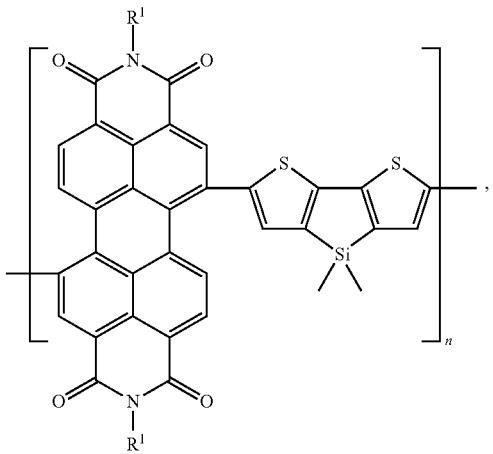

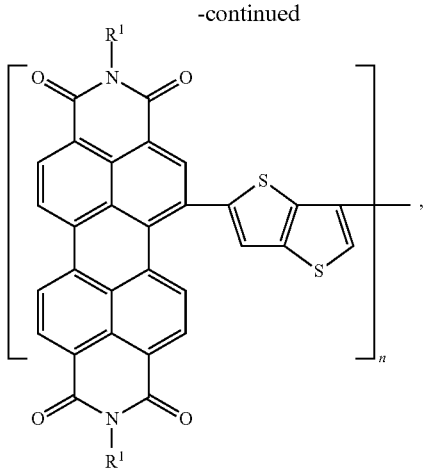

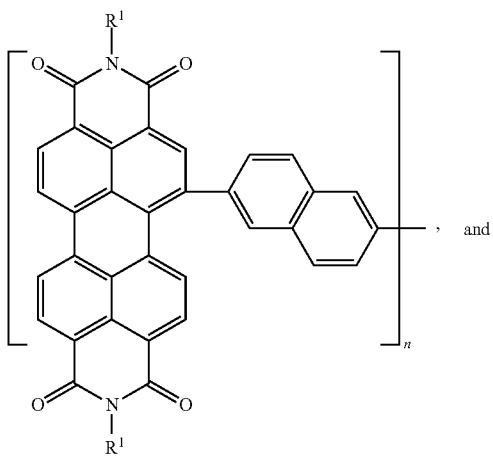
, and

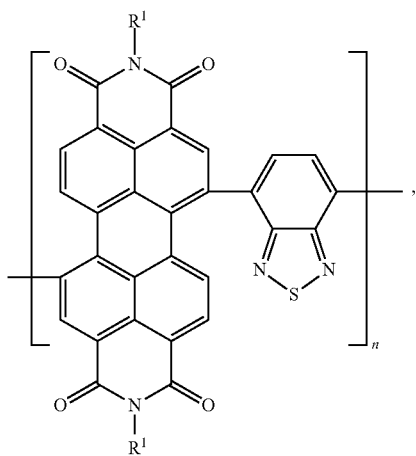

where R¹ and n are as defined herein.

Polymers of the present teachings can be prepared in accordance with the procedures outlined in Scheme 1 below, from compounds prepared according to procedures analogous to those described in co-pending U.S. Provisional Patent Application Ser. No. 61/026,311 (entitled "Perylene Semiconductors and Methods of Preparation and Use thereof," filed on Feb. 5, 2008), or commercially available starting materials, compounds known in the literature, or readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the compounds described herein.

The processes described herein can be monitored according to any suitable method known in the art. For example, product formation can be monitored by spectroscopic means, such as nuclear magnetic resonance spectroscopy (NMR, e.g., $^1$H or $^{13}$C), infrared spectroscopy (IR), spectrophotometry (e.g., UV-visible), mass spectrometry (MS), or by chromatography such as high pressure liquid chromatograpy (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

Polymers of formula I (e.g., P(PDIMP-DTDiox) and P(PDIMP-DTCO)) can be prepared generally according to Scheme 1 below.

Scheme 1

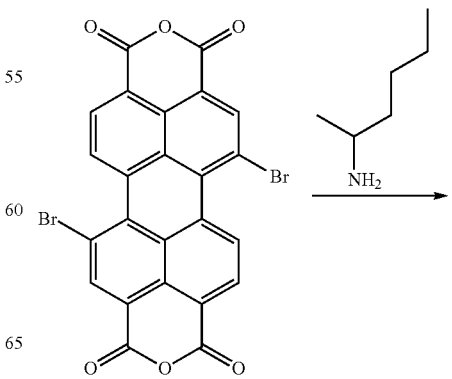

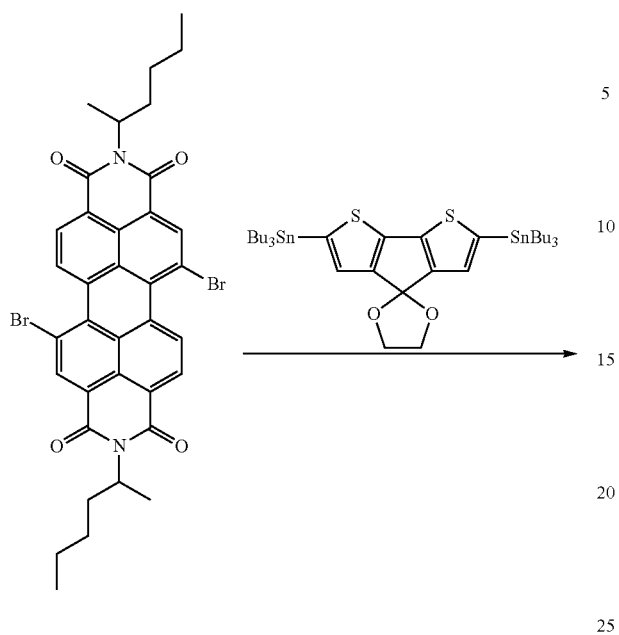
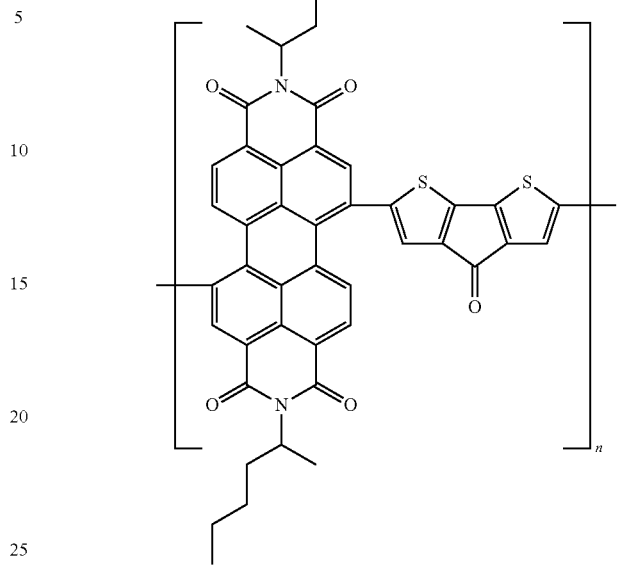
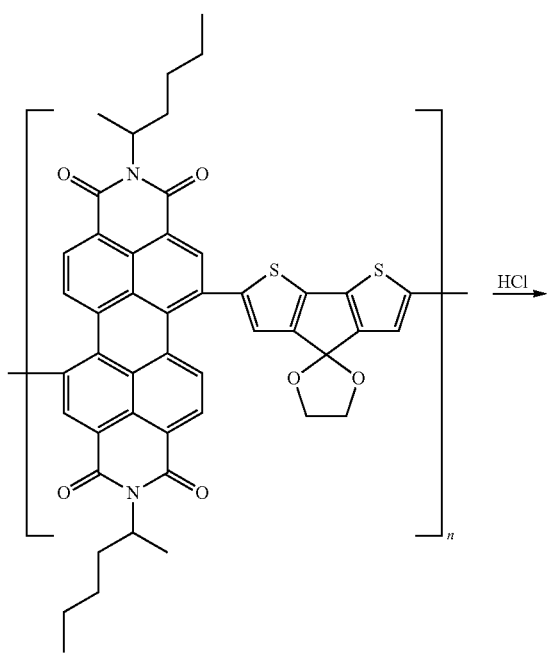

As shown in Scheme 1, 1,7-dibromoperylene-3,4:9,10-bis(tetracarboxylic dianhydride) (PDA-Br$_2$) can be reacted with 2-hexylamine to give monomer N,N'-bis[1-methylpentyl]-1,7-dibromoperylene-3,4:9,10-bis(dicarboximide) (PDIMP-Br$_2$). The other building block, spiro[4H-cyclopenta[2,1-b:3,4-b']dithiophene-4,2'-[1,3]dioxolane]-2,6-bis(tri-n-butylstannyl) (DTDiox-Sn) can be obtained by stannylation of the corresponding precursor. Pd-catalyzed Stille coupling reaction of PDIMP-Br$_2$ with DTDiox-Sn can provide the dioxolane-protected polymer P(PDIMP-DTDiox). For example, a palladium catalyst having the formula Pd(0)L$_4$, where L is a suitable ligand, such as Pd(PPh$_3$)$_4$ can be used. The polymer P(PDIMP-DTCO) can be obtained by hydrolysis of the dioxolane protecting group of P(PDIMP-DTDiox) with a CHCl$_3$—AcOH—HCl mixture. End groups of the resulting polymers, for example Br and/or —SnBu$_3$ in P(PDIMP-DTDiox) and P(PDIMP-DTCO), can be displaced with R$^a$, where R$^a$ is as defined herein.

Certain embodiments disclosed herein can be stable in ambient conditions ("ambient stable") and soluble in common solvents. As used herein, a polymer can be considered electrically "ambient stable" or "stable at ambient conditions" when the carrier mobility or the reduction-potential of the polymer is maintained at about its initial measurement when the polymer is exposed to ambient conditions, for example, air, ambient temperature, and humidity, over a period of time. For example, a polymer according to the present teachings can be described as ambient stable if its carrier mobility or redox potential does not vary more than 20% or more than 10% from its initial value after exposure to ambient conditions, including, air, humidity and temperature, over a 3 day, 5 day, or 10 day period. In addition, a polymer can be considered ambient stable if the optical absorption of the corresponding film does not vary more than 20% (preferably, does not vary more than 10%) from its initial value after exposure to ambient conditions, including air, humidity and temperature, over a 3 day, 5 day, or 10 day period.

Without wishing to be bound by any particular theory, it is believed that if n-channel transport is desired, the strong electron-depleted electronic structure enabled by M$_1$ copolymerized with a strong electron-depleted $M_2$ repeating unit, together with the regioregular highly π-conjugated polymeric backbone of the present polymers, can make the present polymers ambient-stable n-channel semiconductor materials without requiring additional π-core functionalization (i.e., core substitution of the aromatic imide moiety) with strong electron-withdrawing functionalities. If large light absorption (extinction coefficient) is desired, the present polymers can be provided with a highly-π-conjugated polymeric backbone and by having the $M_1$ unit copolymerized with an electron-donating $M_2$ comonomer to enable a push-pull structure. If an ambipolar polymer is desired, for example in light-emitting transistor applications, the present polymers can have a highly π-conjugated polymeric backbone comprising a copolymer of $M_1$ and an electron-neutral or electron-donating (electron-rich) $M_2$ unit.

OTFTs based on the present polymers can have long-term operability and continued high-performance in ambient conditions. For example, OTFTs based on certain embodiments of the present polymers can maintain satisfactory device performance in highly humid environment. Certain embodiments of the present polymers also can exhibit excellent thermal stability over a wide range of annealing temperatures. Photovoltaic devices can maintain satisfactory power conversion efficiencies over an extended period of time.

The polymers of the present teachings can have good solubilities in one or more common solvents. As used herein, a compound can be considered soluble in a solvent when at least 0.1 mg of the compound can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl)ether, diethyl ether, diisopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methypyrrolidone.

The present polymers can be fabricated into various articles of manufacture using solution processing techniques in addition to other more expensive processes such as vapor deposition. Various solution processing techniques have been used with organic electronics. Common solution processing techniques include, for example, spin coating, drop-casting, zone casting, dip coating, blade coating, or spraying. Another example of solution processing technique is printing. As used herein, "printing" includes a noncontact process such as inkjet printing, microdispensing and the like, and a contact process such as screen-printing, gravure printing, offset printing, flexographic printing, lithographic printing, pad printing, microcontact printing and the like.

Polymers of the present teachings can be used to prepare semiconductor materials (e.g., compositions and composites), which in turn can be used to fabricate various articles of manufacture, structures, and devices. In some embodiments, semiconductor materials incorporating one or more polymers of the present teachings can exhibit n-type semiconductor activity, ambipolar activity, light absorption, and/or light emission.

The present teachings, therefore, further provide methods of preparing a semiconductor material. The methods can include preparing a composition that includes one or more polymers disclosed herein dissolved or dispersed in a liquid medium such as a solvent or a mixture of solvents, depositing the composition on a substrate to provide a semiconductor material precursor, and processing (e.g., heating) the semiconductor precursor to provide a semiconductor material (e.g., a thin film semiconductor) that includes a polymer disclosed herein. In various embodiments, the liquid medium can be an organic solvent, an inorganic solvent such as water, or combinations thereof. In some embodiments, the composition can further include one or more additives independently selected from viscosity modulators, detergents, dispersants, binding agents, compatiblizing agents, curing agents, initiators, humectants, antifoaming agents, wetting agents, pH modifiers, biocides, and bactereriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatiblizing agent, and/or an antifoaming agent. In some embodiments, the depositing step can be carried out by printing, including inkjet printing and various contact printing techniques (e.g., screen-printing gravure printing, offset printing, pad printing, lithographic printing, flexographic printing, and microcontact printing). In other embodiments, the depositing step can be carried out by spin coating, drop-casting, zone casting, dip coating, blade coating, or spraying.

Various articles of manufacture including electronic devices, optical devices, and optoelectronic devices, such as thin film semiconductors, field effect transistors (e.g., thin film transistors), photovoltaics, photodetectors, organic light emitting devices such as organic light emitting diodes (OLEDs) and organic light emitting transistors (OLETs), complementary metal oxide semiconductors (CMOSs), complementary inverters, diodes, capacitors, sensors, D flip-flops, rectifiers, and ring oscillators, that make use of the polymers disclosed herein are within the scope of the present teachings as are methods of making the same. The present polymers can offer processing and operation advantages in the fabrication and/or the use of these devices.

For example, articles of manufacture such as the various devices described herein can include a composite having a semiconductor material of the present teachings and a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., polycarbonate, polyester, polystyrene, polyhaloethylene, polyacrylate), and self-assembled superlattice/self-assembled nanodielectric (SAS/SAND) materials (e.g., described in Yoon, M-H. et al., *PNAS*, 102 (13): 4678-4682 (2005), the entire disclosure of which is incorporated by reference herein), as well as hybrid organic/inorganic dielectric materials (e.g., as described in U.S. patent application Ser. No. 11/642,504, the entire disclosure of which is incorporated by reference herein). In some embodiments, the dielectric component can include the crosslinked polymer blends described in U.S. patent application Ser. Nos. 11/315,076, 60/816,952, and 60/861,308, the entire disclosure of each of which is incorporated by reference herein. The composite also can include one or more electrical contacts. Suitable materials for the source, drain, and gate electrodes include metals (e.g., Au, Al, Ni, Cu), transparent conducting oxides (e.g., TTO, IZO, ZITO, GZO, GIO, GITO), and conducting polymers (e.g., poly(3,4-ethylenedioxythiophene) poly(styrenesulfonate) (PEDOT:PSS), polyaniline (PANI), polypyrrole (PPy)). One or more of the composites described herein can be embodied within various organic electronic, optical, and optoelectronic devices such as organic thin film transistors (OTFTs), specifically, organic field effect transistors (OFETs), as well as sensors, capacitors, unipolar circuits, complementary circuits (e.g., inverter circuits), and the like.

Figure 5:
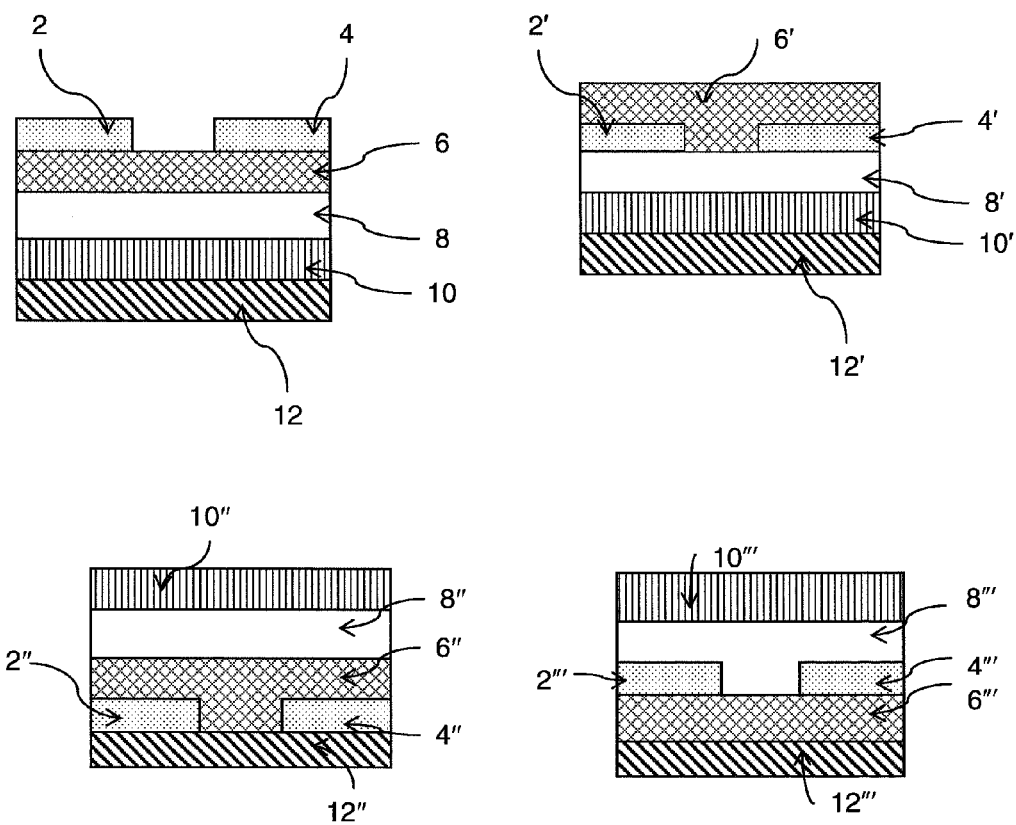
FIG. 5 illustrates different configurations of thin film transistors.

Accordingly, an aspect of the present teachings relates to methods of fabricating an organic field effect transistor that incorporates a semiconductor material of the present teachings. The semiconductor materials of the present teachings can be used to fabricate various types of organic field effect transistors including top-gate top-contact capacitor structures, top-gate bottom-contact capacitor structures, bottom-gate top-contact capacitor structures, and bottom-gate bottom-contact capacitor structures. FIG. 5 illustrates the four common types of OFET structures: (top left) bottom-gate top-contact structure, (top right) bottom-gate bottom-contact structure, (bottom left) top-gate bottom-contact structure, and (bottom right) top-gate top-contact structure. As shown in FIG. 5, an OFET can include a dielectric layer (e.g., shown as 8, 8', 8", and 8'''), a semiconductor layer (e.g., shown as 6, 6', 6", and 6'''), a gate contact (e.g., shown as 10, 10', 10", and 10'''), a substrate (e.g., shown as 12, 12', 12", and 12'''), and source and drain contacts (e.g., shown as 2, 2', 2", 2''', 4, 4', 4", and 4''').

In certain embodiments, OTFT devices can be fabricated with the present polymers on doped silicon substrates, using $SiO_2$ as the dielectric, in top-contact geometries. In particular embodiments, the active semiconductor layer which incorporates at least a polymer of the present teachings can be deposited at room temperature or at an elevated temperature. In other embodiments, the active semiconductor layer which incorporates at least one polymer of the present teachings can be applied by spin-coating or printing as described herein. For top-contact devices, metallic contacts can be patterned on top of the films using shadow masks.

In certain embodiments, OTFT devices can be fabricated with the present polymers on plastic foils, using polymers as the dielectric, in top-gate bottom-contact geometries. In particular embodiments, the active semiconducting layer which incorporates at least a polymer of the present teachings can be deposited at room temperature or at an elevated temperature. In other embodiments, the active semiconducting layer which incorporates at least a polymer of the present teachings can be applied by spin-coating or printing as described herein. Gate and source/drain contacts can be made of Au, other metals, or conducting polymers and deposited by vapor-deposition and/or printing.

Other articles of manufacture in which polymers of the present teachings are useful are photovoltaics or solar cells. Polymers of the present teachings can exhibit broad optical absorption and/or a tuned redox properties and bulk carrier mobilities, making them desirable for such applications. Accordingly, the polymers described herein can be used as an acceptor (n-type) semiconductor or a donor (p-type) semiconductor depending on the nature of the $M_2$ unit in a photovoltaic design, which includes an adjacent p-type or n-type semiconductor material, respectively, that forms a p-n junction. The polymers can be in the form of a thin film semiconductor, which can be deposited on a substrate to form a composite. Exploitation of polymers of the present teachings in such devices is within the knowledge of a skilled artisan.

Figure 9:
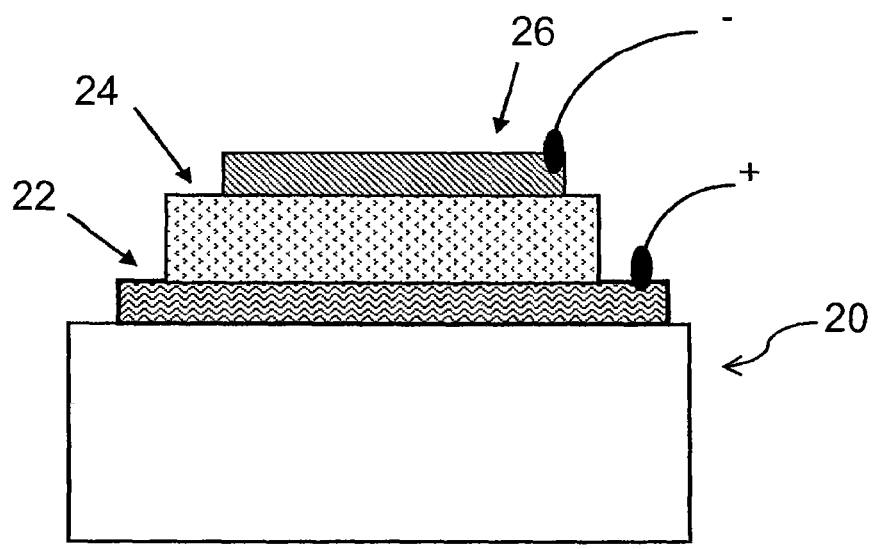
FIG. 9 illustrates a representative structure of a bulk-heterojunction organic photovoltaic device (also known as solar cell) which can incorporate one or more polymers of the present teachings as the donor and/or acceptor materials.
Figure 10:
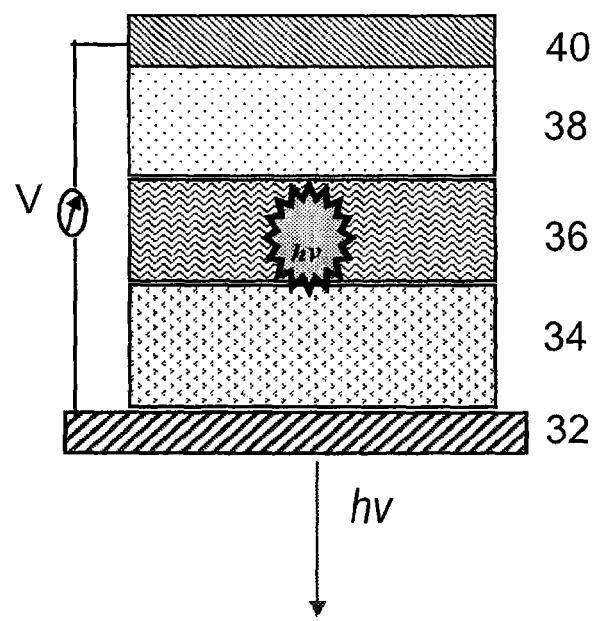
FIG. 10 illustrates a representative structure of an organic light-emitting device which can incorporate one or more polymers of the present teachings as electron-transporting and/or emissive and/or hole-transporting materials.

Accordingly, another aspect of the present teachings relates to methods of fabricating an organic light-emitting transistor, an organic light-emitting diode (OLED), or an organic photovoltaic device that incorporates one or more semiconductor materials of the present teachings. FIG. 9 illustrates a representative structure of a bulk-heterojunction organic photovoltaic device (also known as solar cell) which can incorporate one or more polymers of the present teachings as the donor and/or acceptor materials. As shown, a representative solar cell generally includes a substrate 20 (e.g., glass), an anode 22 (e.g., ITO), a cathode 26 (e.g., aluminium or calcium), and an active layer 24 between the anode and the cathode which can incorporate one or more polymers of the present teachings as the electron donor (p-channel) and/or electron acceptor (n-channel) materials. FIG. 10 illustrates a representative structure of an OLED which can incorporate one or more polymers of the present teachings as electron-transporting and/or emissive and/or hole-transporting materials. As shown, an OLED generally includes a substrate 30 (not shown), a transparent anode 32 (e.g., ITO), a cathode 40 (e.g., metal), and one or more organic layers which can incorporate one or more polymers of the present teachings as hole-transporting (n-channel) (layer 34 as shown) and/or emissive (layer 36 as shown) and/or electron-transporting (p-channel) materials (layer 38 as shown).

The following examples are provided to illustrate further and to facilitate the understanding of the present teachings and are not in any way intended to limit the invention.

All reagents were purchased from commercial sources and used without further purification unless otherwise noted. Anhydrous tetrahydrofuran (THF) was distilled from Na/benzophenone. Conventional Schlenk techniques were used and reactions were carried out under $N_2$ unless otherwise noted. Examples 1-8 describe the preparation of certain compounds of the present teachings and related intermediates. Characterization data are provided in some cases by $^1$H NMR, $^{13}$C NMR, elemental analysis, and/or electron ionization/electron spray ionization (EI/ESI) mass spectroscopy. NMR spectra were recorded on a Varian Unity Plus 500 spectrometer ($^1$H, 500 MHz; $^{13}$C, 125 MHz). Electrospray mass spectrometry was performed with a Thermo Finnegan model LCQ Advantage mass spectrometer.

Example 1

Synthesis of spiro[4H-cyclopenta[2,1-b:3,4-b'] dithiophene-4,2'-[1,3]dioxolane]-2,6-bis(tri-n-butylstannyl)

Spiro[4H-cyclopenta[2,1-b:3,4-b']dithiophene-4,2'-[1,3] dioxolane] (Brzezinski, J. Z. et al.; *Synthesis*, 8: 1053 (2002)) (1.71 g, 7.35 mmol) was dissolved in dry THF (20 mL) under nitrogen and cooled to −78° C. Two equivalents of n-BuLi (5.92 mL, 14.85 mmol) were added dropwise and the reaction mixture was stirred for 30 minutes. The solution was then allowed to warm to room temperature and stirred for an additional 1.5 hours (h). The resulting thick brown suspension was cooled again to −78° C. and tri-n-butyltin chloride (4.78 g, 14.7 mmol) was added. The solution was then stirred at room temperature for 4 h. The reaction was quenched with 100 mL $H_2O$ and extracted with hexane. The organic layer was washed with $H_2O$ (6×50 mL) and dried over $MgSO_4$. After filtration, evaporation of the solvent left a brown oil (5.7 g), which was chromatographed on silica gel using hexane as the eluent (and washed with Et$_3$N) to give the pure product in a ~70% yield. $^1$H NMR (CDCl$_3$): δ6.96 (s, 2H), 4.33 (s, 4H), 1.57 (m, 12H), 1.33 (m, 12H), 1.10 (m, 12H), 0.91 (t, 18H, J=6.8 Hz); HRMS (ACPI, CH$_2$Cl$_2$) m/z: ((M+H)$^+$) calcd for C$_{35}$H$_{60}$S$_2$O$_2$Sn$_2$: 814.4; found: 815.2.

Example 2

Synthesis of N,N'-bis[1-methylpentyl]-1,7-dibromoperylene-3,4:9,10-bis(dicarboximide) (PDIMP-Br?)

A mixture of 1,7-dibromoperylene-3,4:9,10-dianhydride (550 mg, 1.0 mmol) and 2-aminohexane (0.32 mL, 2.40 mmol) in triethylene glycol dimethyl ether (5 mL) was sealed in a tube under nitrogen and stirred at 165° C. for 1 h. After cooling, the solvent was removed by vacuum distillation, leaving 680 mg of a dark red solid. This solid was chromatographed on silica gel using CHCl$_3$ as the eluent to give the pure product as a red powder (400 mg, 0.56 mmol, yield 55.8%). $^1$H NMR (CDCl$_3$, 500 MHz): δ 9.50 (d, 2H, J=8.0 Hz), 8.92 (s, 2H), 8.70 (d, 2H, J=8.0 Hz), 5.31-5.26 (m, 2H), 2.27-2.22 (m, 1.95-1.89 (m, 2H), 1.60 (d, 6H, J=7.0 Hz), 1.40-1.30 (m, 6H), 1.28-1.20 (m, 2H), 0.88 (t, 6H, J=7.0 Hz); Elemental Analysis (EA): calc. C, 60.35; H, 4.50; N, 3.91. found C, 60.22; H, 4.62; N, 3.47.

Example 3

Synthesis of poly{[N,N'-bis(1-methylpentyl)-3,4,9,10-perylenediimide-1,7-diyl]-alt-(spiro[4H-cyclopenta[2,1-b:3,4-b']dithiophene-4,2'-[1,3]dioxolane],2,6-diyl)} [P(PDIMP-DTDiox)]

A mixture of PDIMP-Br$_2$ (Example 2, 0.39 g, 0.54 mmol), spiro[4H-cyclopenta[2,1-b:3,4-b']dithiophene-4,2'-[1,3]dioxolane]-2,6-bis(tri-n-butylstannyl) (Example 1, 0.42 g, 0.54 mmol) and Pd(PPh$_3$)$_4$ (29 mg, 0.025 mmol) in dry toluene (20 mL) was stirred for 2 days at 90° C. The dark solution was cooled to room temperature and poured into MeOH (60 mL). A dark precipitate formed and was collected by filtration (~400 mg). The solid was dissolved in CHCl$_3$ (25 mL) and stirred with a solution of KF (5 g) in water (10 mL) for 2 h. After filtration of the mixture over Celite®, the organic phase was collected, washed with H$_2$O (2×10 mL), and dried. The crude polymer obtained after evaporation of the solvent (360 mg) was dissolved in CHCl$_3$ (10 mL) The solution was filtered and precipitated with MeOH (3×25 mL) to afford 340 mg of product as a dark green solid (80% yield). $^1$H NMR (500 MHz, CDCl$_3$): δ 8.69 (br, ~12H), 8.44 (br, ~20H), 7.38 (br, —10H), 5.30 (br, —10H), 4.38 (br, ~20H), 2.25 (br, ~10H), 1.90 (br, ~10H), 1.60 (br, 30H), 1.32 (br, 30H), 1.27 (br, 10H), 0.89 (br, 30H).

Example 4

Synthesis of poly{[N,N'-bis(1-methylpentyl)-3,4,9,10-perylenediimide-1,7-diyl]-alt-(4H-cyclopenta[2,1-b:3,4-b']-dithiophen-4-one, 2,6-diyl)} [P(PDIMP-DTCO)]

P(PDIMP-DTDiox) (Example 3, 170 mg) was dissolved in 2 mL of CHCl$_3$. AcOH (5 mL) and 37% HCl (0.2 mL) were added and the reaction mixture was heated at 80° C. for 2 h. After cooling, MeOH (15 mL) was added and the precipitate (160 mg) was collected by filtration. The solid was dissolved in CHCl$_3$ (5 mL) and the solution was filtered and precipitated by addition of MeOH (3×10 mL). The resulting solid (130 mg) was extracted using a Soxhlet setup with acetone for 2 days, MeOH for 1 day, and CHCl$_3$ to give 110 mg of product (68% yield). $^1$H NMR (500 MHz, CDCl$_3$): δ 8.72 (br, ~12H), 8.46 (br, ~20H), 7.53 (br, ~10H), 5.32 (br, ~10H), 2.26 (br, ~10H), 1.90 (br, ~10H), 1.60 (br, 30H), 1.32 (br, 30H), 1.27 (br, 10H), 0.89 (br, 30H).

When $^1$H NMR spectra of P(PDIMP-DTDiox) and P(PDIMP-DTCO) in CDCl$_3$ were compared, it could be seen that the ethylene protons at 4.38 ppm disappeared, confirming that the reaction took place quantitatively. Both polymers were soluble in most organic solvents, and corresponding films were readily processed from their corresponding solutions. The average molecular weight for both polymers was greater than 5000 kD and as high as 50000 kD as estimated by GPC (polystyrene standard) and $^1$H NMR. The polymer end groups were not quenched during synthesis and the polymer chain will likely end with Br (on the M$_1$ side) and SnBu$_3$ (on the M$_2$ side). The use of other reagents, catalysts, and/or reaction conditions can modify the molecular weight as well as the end groups. For example, end groups, including Br and SnBu$_3$, can be displaced with H, halogen (e.g., F), a C$_{1-10}$ alkyl group (e.g., a methyl group, an ethyl group, a propyl group, a butyl group, and the like), or a C$_{6-14}$ aryl group (e.g., a phenyl group, a naphthyl group, or the like). Furthermore, other synthetic routes to P(PDIMP-DTDiox) or directly to P(PDIMP-DTCO) are within the scope of the present teachings. Thermogravimetric analysis (TGA) suggested excellent thermal stability with an onset decomposition temperature under nitrogen of ~400° C.

Example 5

Preparation of poly{[N,N'-bis(2-octyldodecyl)-1,4,5,8-naphthalene diimide-2,6-diyl]-alt-2,5-thieno[3,2-b]thiophene} [P(NDI2OD-TT)]

Under argon, a mixture of NDI2OD-Br$_2$ (145.1 mg, 0.147 mmol), 2,5-bis(trimethylstannyl)-thieno[3,2-b]thiophene (68.6 mg, 0.147 mmol), and Pd(PPh$_3$)$_2$Cl$_2$ (5.0 mg, 0.007 mmol) in anhydrous toluene (8 mL) was stirred at 90° C. for 3 days. Bromobenzene (0.3 mL) was added and the reaction mixture was maintained at 90° C. for an additional 12 hours. Upon cooling to room temperature, a solution of potassium fluoride (1 g) in water (2 mL) was added. This mixture was stirred and shaken at room temperature for 1 hour before it was diluted with chloroform (150 mL). The resulting mixture was washed with water (60 mL×3), dried over anhydrous Na$_2$SO$_4$, and concentrated on a rotary evaporator. The residue was taken up with chloroform (30 mL) and precipitated in methanol (100 mL). This procedure was repeated using chloroform and acetone, leading to a deep blue solid as the crude product. The obtained blue solid was further purified by Soxhlet extraction with acetone for 72 hours. The isolated solid residue was redissolved in chloroform (50 mL) and the resulting mixture was heated to boil. Upon cooling to room temperature, this chloroform solution was filtered through a syringe filter (5 μm), and the filtrate was precipitated in methanol (50 mL). The precipitates were collected by filtration, washed with methanol, and dried in vacuum, leading to a deep blue solid as the product (134 mg, yield 94.4%). $^1$H NMR (CDCl$_2$CDCl$_2$, 500 MHz): δ: 8.62-9.00 (m, br, 2H), 7.55-7.80 (m, br, 2H), 4.00-4.35 (m, br, 4H), 2.02 (br, 2H), 1.10-1.50 (br, 64H) 0.80-0.95 (br, 12H). GPC: M$_n$=102.5 K Da, $M_w$=297.6 K Da, PDI=2.9. Elemental Analysis (calc. C, 74.80; H, 9.00; N, 2.91). found C, 74.82; H, 8.89; N, 2.93.

Example 6

Preparation of Poly{[N,N'-bis(2-octyldodecyl)-1,4,5,8-naphthalene dimide-2,6-diyl]-alt-5,5'-(3,3'-dimethylsilylene-2,2'-bithiophene)} [P(NDI2OD-SL)]

Under argon, a mixture of NDI2OD-Br$_2$ (126.4 mg, 0.128 mmol), 5,5'-bis(tri-n-butylstannyl)-3,3'-dimethyldilylene-2,2'-bithiophene (102.7 mg, 0.128 mmol), and Pd(PPh$_3$)$_2$Cl$_2$ (4.4 mg, 0.006 mmol) in anhydrous toluene (8 mL) was stirred at 90° C. for 4 days. Bromobenzene (0.3 mL) was then added and the resulting mixture was stirred for an additional 12 hours. After cooling to room temperature, the reaction mixture was added dropwise to methanol (35 mL), and the resulting mixture was stirred at room temperature for 10 minutes. The precipitates were collected by filtration, redissolved in chloroform (3 mL), and precipitated in methanol (35 mL). This precipitation procedure was repeated one more time, giving a deep blue solid (45.0 mg, 33.5%). $^1$H NMR (CDCl$_2$CDCl$_2$, 500 MHz): δ 8.60-8.91 (m, br, 2H), 7.00-7.52 (m, br, 2H), 3.40-4.30 (m, br, 4H), 1.95 (br, 2H), 1.05-1.50 (m, br, 64H) 0.50-0.95 (m, br, 18H). Elemental Analysis (calc. C, 73.51; H, 8.87; N, 2.68). found C, 71.18; H, 9.12; N, 2.36.

Example 7

Preparation of poly{[N,N'-bis(2-octyldodecyl)-1,4,5,8-naphthalene diimide-2,6-diyl]-alt-4,7-(2,1,3-benzothiadiazole)} [P(NDI2OD-BT)]

Under argon, a mixture of NDI2OD-Br$_2$ (86.5 mg, 0.088 mmol), 4,7-bis(4,4,5,5-tetramethyl-1,3,2-dioxaborolan-2-yl)-2,1,3-benzothiadiazole (34.1 mg, 0.088 mmol), potassium carbonate (97 mg, 0.702 mmol), and Pd(PPh$_3$)$_4$ (2.0 mg, 0.002 mmol) in anhydrous toluene (4 mL) and anhydrous DMF (2 mL) was stirred at 90° C. for 68 hours. Bromobenzene (0.3 mL) was added and the resulting mixture was stirred for an additional 12 hours. After cooling to room temperature, the reaction mixture was diluted with chloroform (150 mL), and the resulting mixture was washed with water (80 mL×3), dried over anhydrous Na$_2$SO$_4$, and concentrated. The residue was taken up with chloroform (10 mL) and precipitated in methanol (50 mL) twice, leading to a brown solid as the product (62.0 mg, 73.5%). $^1$H NMR (CDCl$_3$, 500 MHz): δ 8.46-9.15 (m, 2H), 7.50-8.18 (m, 2H), 3.84-4.28 (m, br, 4H), 1.75-2.10 (m, br, 2H), 1.05-1.50 (br, 64H) 0.70-0.95 (br, 12H). Elemental Analysis (calc. C, 75.11; H, 9.03; N, 5.84). found C, 71.09; H, 8.47; N, 5.39.

Example 8

Preparation of poly{[N,N'-bis(2-octyldodecyl)-1,4,5,8-naphthalene diimide-2,6-diyl]-alt-2,6-naphthalene} [P(NDI2OD-N)]

Under argon, a mixture of NDI2OD-Br$_2$ (76.5 mg, 0.078 mmol), 2,6-bis(trimethylstannyl)naphthalene (35.2 mg, 0.078 mmol), and Pd(PPh$_3$)$_2$Cl$_2$ (2.7 mg, 0.004 mmol) in anhydrous toluene (7 mL) was stirred at 90° C. for 4 days. Bromobenzene (0.3 mL) was then added and the reaction mixture was maintained at 90° C. for an additional 12 hours. Upon cooling to room temperature, a solution of potassium fluoride (1 g) in water (2 mL) was added. This mixture was stirred and shaken at room temperature for 1 hour before it was diluted with chloroform (100 mL). The resulting mixture was washed with water (80 mL×3), dried over anhydrous Na$_2$SO$_4$, and concentrated on rotary evaporator. The residue was taken with chloroform (5 mL) and precipitated in methanol (50 mL). The resulting mixture was kept in refrigerator for overnight. The precipitate was collected by filtration, washed with methanol, and dried in vacuum, leading to a red solid as the product (64.1 mg, yield 86.8%). $^1$H NMR (CDCl$_3$ 500 MHz): δ: 8.85 (m, br, 2H), 7.90-8.10 (m, br, 4H), 7.50-7.59 (m, br, 2H), 4.10 (br, 4H), 2.00 (s, br, 2H), 1.05-1.50 (m, br, 64H), 0.80-0.94 (m, br, 12H). Elemental Analysis (calc. C, 80.79; H, 9.53; N, 2.94). found C, 77.41; H, 9.43; N, 2.55.

Example 9

Cyclic Voltammetry

Cyclic voltammetry experiments were conducted using an Epsilon single-channel potentiometer and a BAS C3 cell stand (a one-compartment cell with a C disk working electrode, bare Ag reference electrode, and Pt wire counter electrode). Appropriate precautions were taken to eliminate water and oxygen during measurement. All measurements were performed under N$_2$ by dissolving the monomer (1-3 mg) in a 0.1 M THF/TBAPF$_6$ solutions with scanning rates between 60-150 mV/s. When the voltammograms are (quasi)reversible, it is possible to extract formal potentials ($E^{1/2}$) as the midpoints between peak potentials for the forward and reverse scan.

Figure 2:
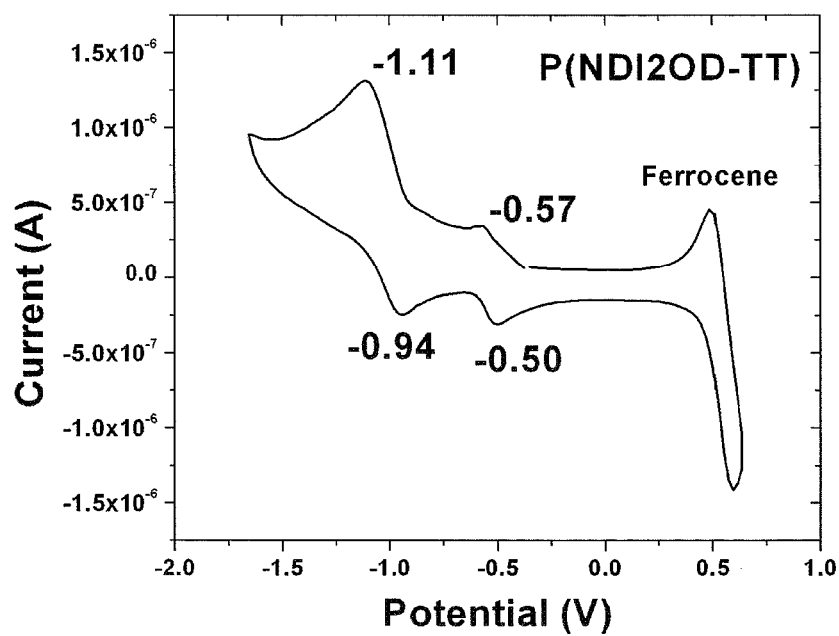
FIG. 2 shows a cyclic voltammogram of a representative polymer of the present teachings (P(ND2OD-TT)) in solution (THF).

Cyclic voltammograms of polymers P(PDIMP-DTDiox) and P(PDIMP-DTCO) in THF (FIG. 1) revealed two reversible one-electron reduction processes located at −0.41/−0.70 V and −0.37/−0.56 V, respectively, which are less negative than core-unsubstituted N-alkylperylenes such as N,N'-bisoctyl-perylene-3,4:9,10-bis(dicarboximide) (PDI8) (−0.46/−0.65V). The reduction values are also lower than those reported for the perylene-dithienothiophene co-polymer. Oxidation processes were not observed in the recorded potential window. FIG. 2 shows a cyclic voltammogram of polymers P(PNDI2OD-TT).

Example 9

UV-Vis Spectroscopy

Figure 3:
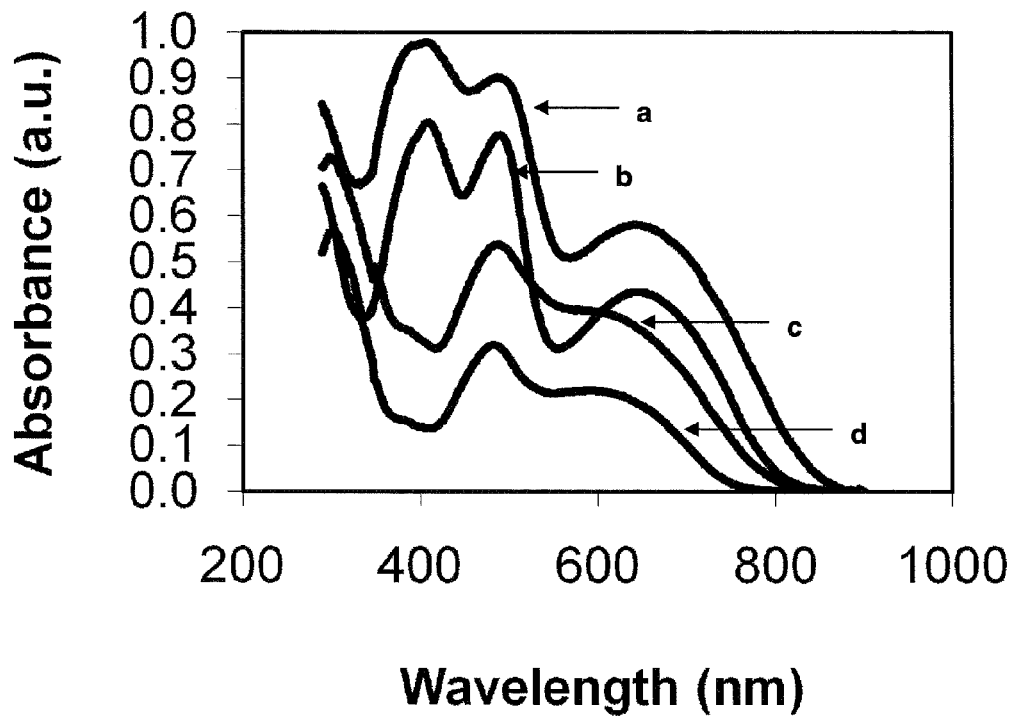
FIG. 3 shows UV-vis spectra of two representative polymers, namely, P(PDIMP-DTDiox) as thin films (a) and in chloroform (b), and P(PDIMP-DTCO) as thin films (c) and in chloroform (d).

The extension of core π-conjugation upon polymerization of the monomers PDIMP and DTDiox/DTCO was demonstrated by solution and thin-film UV-vis data (FIG. 3). Compared to the optical absorption of PDI8 in THF ($\lambda_{abs}$=221 nm), the two polymers exhibited substantially red-shifted absorption at longer wavelengths located at 642 nm for P(PDIMP-DTDiox) and at 589 nm for P(PDIMP-DTCO). Without wishing to be bound by any particular theory, it is believed that the longer wavelength absorption of P(PDIMP-DTDiox) compared to P(PDIMP-DTCO) can be due to the different nature of the electronic characteristics of the cores of the two copolymers (DTDiox versus DTCO cores). The former co-monomer is much more electron-rich than the latter, with the resulting polymer P(PDIMP-DTDiox) exhibiting a red-shifted/enhanced perylene-dithiophene charge transfer transition. On the other hand, in P(PDIMP-DTCO), both co-monomers are electron-depleted and the charge transfer (CT) band strongly reduces. Two additional high-energy optical transitions are located at 490/410 nm and at 482/301 nm for P(PDIMP-DTDiox) and P(PDIMP-DTCO), respectively. The thin-film spectra mirrored the spectra obtained from solutions with minimal variations of the absorption position, although the intensities of the relative bands differed. These results confirmed the amorphous nature of the polymeric films as demonstrated by the absence of XRD reflection.

Figure 4:
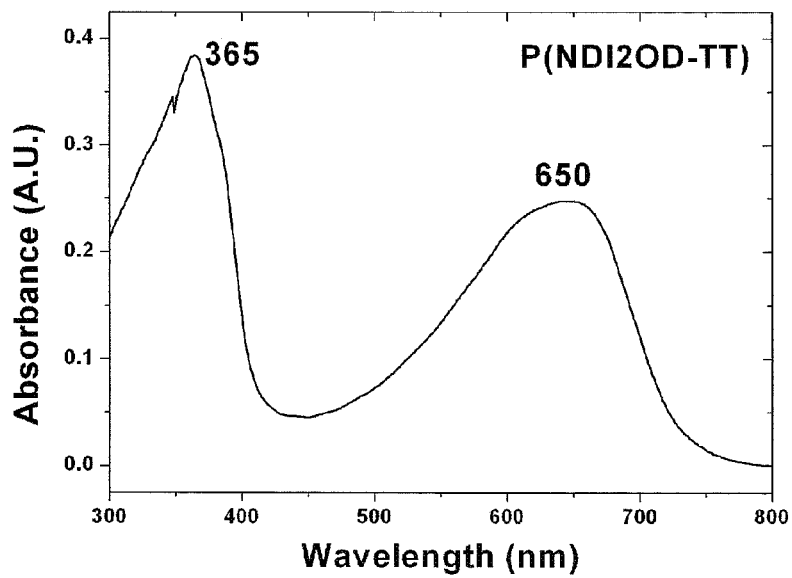
FIG. 4 shows a UV-vis spectrum of a representative polymer of the present teachings (P(ND2OD-TT)).

An exemplary UV-vis spectrum of polymer P(NDI2OD-TT) was also obtained (FIG. 4).

TABLE 1

Optical absorption data (in nm) for P(PDIMP-DTDiox) and P(PDIMP-DTCO) in solution (THF) and as thin films.

| P(PDIMP-CPTDiox) | | P(PDIMP-DTCO) | |
|---|---|---|---|
| Solution | Thin film | Solution | Thin film |
| 642 | 640 | 589 | 576 |
| 490 | 487 | 482 | 488 |
| 410 | 402 | 301 | 289 |

The energy gap ($E_g$) of these polymers was determined to be ~1.55 eV by the optical absorption onset, compared to ~2.4 eV for PDI8. From the relations $E_{LUMO} = -4.4$ eV $-E_{red1}$ and $E_{HOMO} = E_{LUMO} - E_g$, HOMO/LUMO energies were estimated to be −5.54/−3.90 eV for P(PDIMP-DTDiox) and −5.68/−4.13 eV for P(PDIMP-DTCO), compared to −6.38/−3.99 eV for PDI8.

Example 10

OFET Device Fabrication and Measurement

Organic field-effect transistors (OFETs) provide a simple device structure that allows detailed analysis of charge transport characteristics of materials via evaluation of the current-voltage response. The function of the OFET is to modulate the semiconductor conductivity between the source and drain electrodes as a function of the gate voltage. A top-contact/bottom-gate configuration device in which the source and drain were vapor-deposited on top of the semiconductor film was used in this example (FIG. 5, top left). OFET structure was selected to access polymer conduction capabilities but does not limit the fields of use of this material class.

Figure 6:
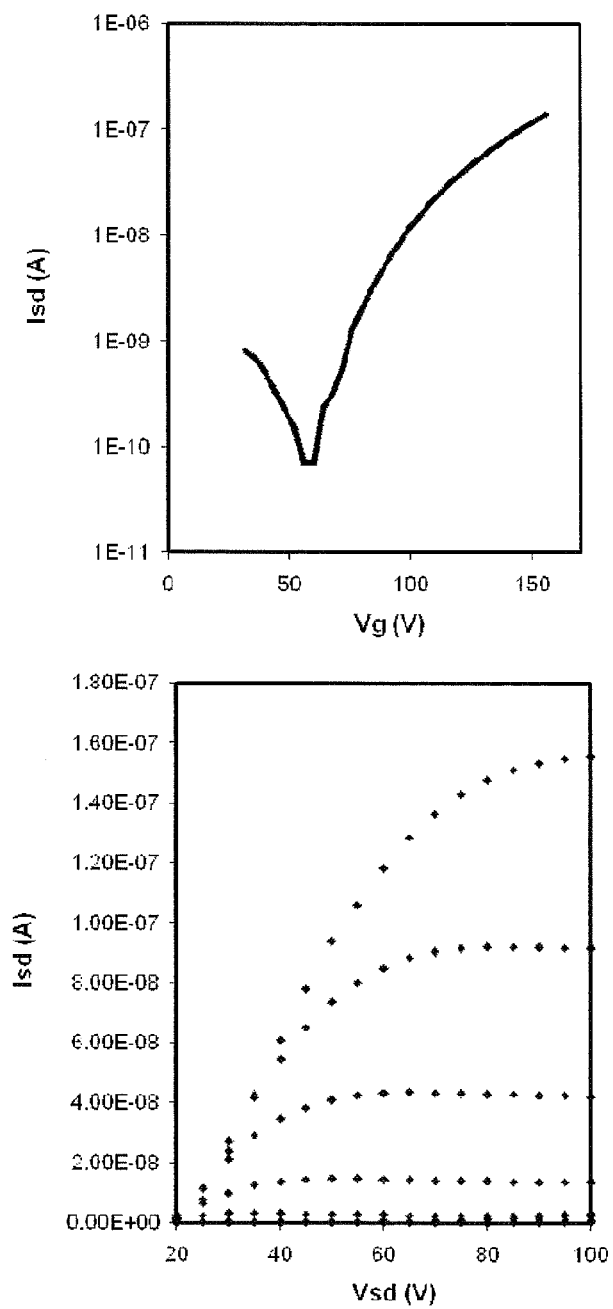
FIG. 6 shows exemplary transfer (top) and output (bottom) plots measured under ambient conditions of representative transistors based on a polymer of the present teachings (P(PDIMP-DTCO)).
Figure 7:
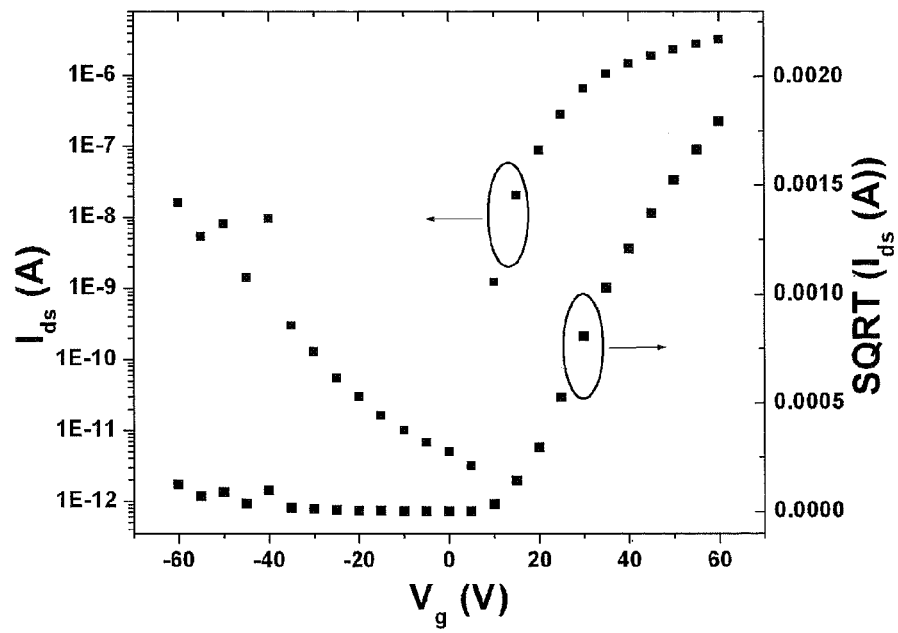
FIG. 7 shows exemplary transfer (top) and output (bottom) plots of representative top-gate bottom-contact (TGBC) transistors based on a polymer of the present teachings (P(ND2OD-TT)).
Figure 7:
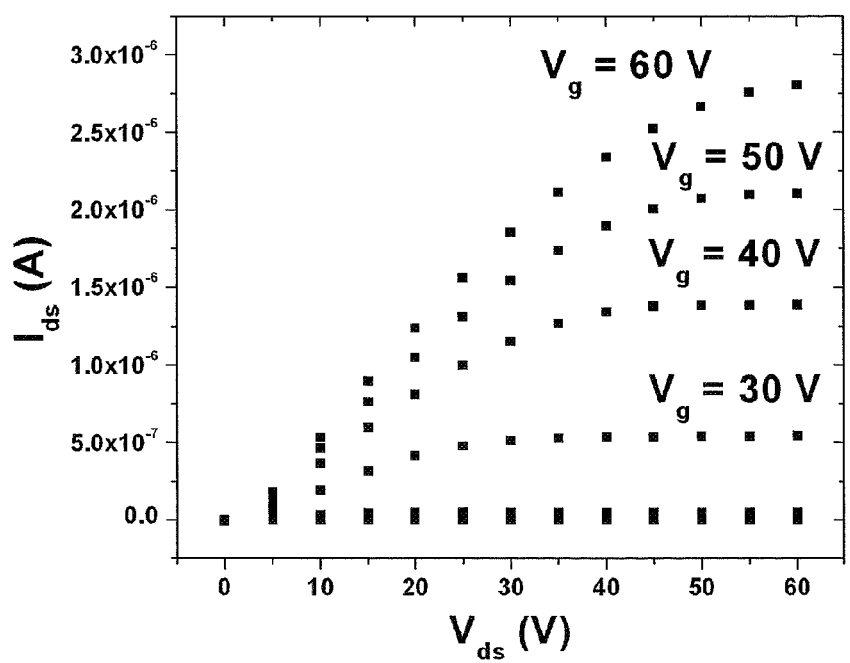
Figure 8:
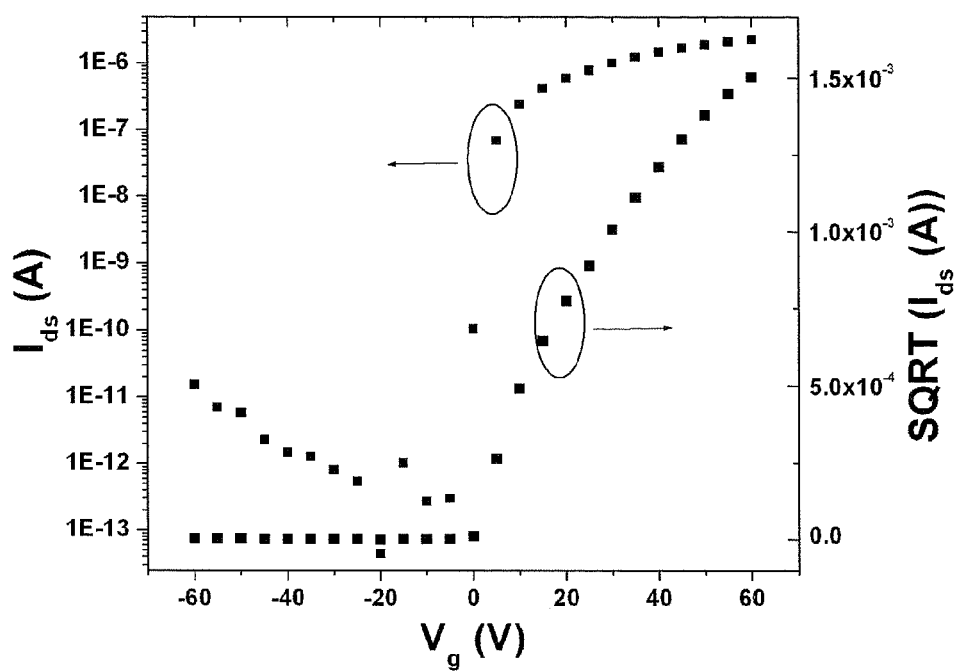
FIG. 8 shows an exemplary transfer plot of representative bottom-gate top-contact (BGTC) transistors based on a polymer of the present teachings (P(ND2OD-TT)).

For the devices fabricated and studied in this example, the gate was highly doped silicon, while the dielectric was a 100-300-nm thick $SiO_2$ film. The semiconductor polymeric film was prepared by spin-coating a solution of one or more polymers of the present teachings in $CHCl_3$ (10 mg/mL) onto HMDS-treated substrates at a spin rate of 3000 rpm. Top-contact TFTs were fabricated by vapor-depositing Au ($3 \times 10^{-6}$ Torr, 0.3 Å/s, ~50 nm thick) onto the semiconductor thin films through a shadow mask to obtain devices with a channel widths of between 25-200 μm and lengths of about 1 to 5 mm. Electrical measurements were performed with a Keithley 6430 subfemtoammeter and a Keithley 2400 source meter at ambient conditions or in a vacuum probe station at $10^{-6}$ TOM Transfer plots of $I_d$ vs. $V_g$ were used to calculate the saturation mobility, threshold voltage, and current on-off ratio for all devices. To compare the electrical properties across the series, all parameters were calculated for a $V_d$ ensuring that the device was operating in the saturation regime ($V_d > V_g$). FIGS. 6-8 show exemplary transfer and output plots of such devices measured in vacuum. The carrier mobilities were found to be as high as 0.3 cm$^2$/Vs and $I_{on}/I_{off} > 10^4$ in vacuum and as high as 0.1 cm$^2$/Vs and $I_{on}/I_{off} > 10^3$ at ambient conditions.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

What is claimed is:

1. A polymer represented by formula:

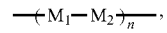

wherein:

$M_1$ is an optionally substituted aromatic imide selected from:

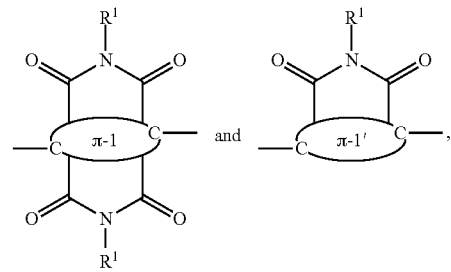

wherein:

$R^1$, at each occurrence, is independently selected from H, a $C_{1-40}$ alkyl group, a $C_{2-40}$ alkenyl group, a $C_{1-40}$ haloalkyl group, and 1-4 cyclic moieties, wherein:

each of the $C_{1-40}$ alkyl group, the $C_{2-40}$ alkenyl group, and the $C_{1-40}$ haloalkyl group can be optionally substituted with 1-10 substituents independently selected from a halogen, —CN, $NO_2$, OH, —$NH_2$, —NH($C_{1-20}$ alkyl), —N($C_{1-20}$ alkyl)$_2$, —S(O)$_2$OH, —CHO, —C(O)—$C_{1-20}$ alkyl, —C(O)OH, —C(O)—O$C_{1-20}$ alkyl, —C(O)NH$_2$, —C(O)NH—$C_{1-20}$ alkyl, —C(O)N($C_{1-20}$ alkyl)$_2$, —O$C_{1-20}$ alkyl, —$SiH_3$, —SiH($C_{1-20}$ alkyl)$_2$, —SiH$_2$($C_{1-20}$ alkyl), and —Si($C_{1-20}$ alkyl)$_3$;

each of the $C_{1-40}$ alkyl group, the $C_{2-40}$ alkenyl group, and the $C_{1-40}$ haloalkyl group can be covalently bonded to the imide nitrogen atom via an optional linker, and each of the 1-4 cyclic moieties can be the same or different, can be covalently bonded to each other or the imide nitrogen via an optional linker, and can be optionally substituted with 1-5 substituents independently selected from a halogen, oxo, —CN, $NO_2$, OH, =C(CN)$_2$, —NH$_2$, —NH($C_{1-20}$ alkyl), —N($C_{1-20}$ alkyl)$_2$, —S(O)$_2$OH, —CHO, —C(O)OH, —C(O)—$C_{1-20}$ alkyl, —C(O)—O$C_{1-20}$ alkyl, —C(O)NH$_2$, —C(O)NH—$C_{1-20}$ alkyl, —C(O)N($C_{1-20}$ alkyl)$_2$, —SiH$_3$, —SiH($C_{1-20}$ alkyl)$_2$, —SiH$_2$$C_{1-20}$ alkyl), —Si($C_{1-20}$ alkyl)$_3$, —O—$C_{1-20}$ alkyl, —O—$C_{1-20}$ alkenyl, —O—$C_{1-20}$ haloalkyl, a $C_{1-20}$ alkyl group, a $C_{1-20}$ alkenyl group, and a $C_{1-20}$ haloalkyl group; and π-1 and π-1' are an optionally substituted fused ring moiety selected from:

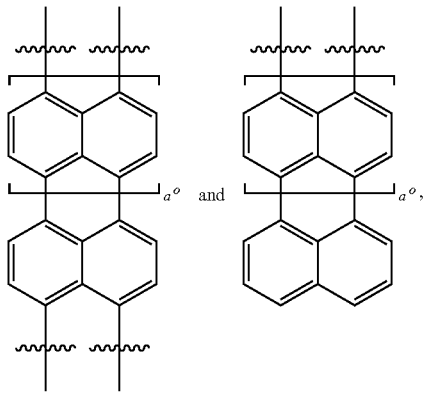

wherein a° is 0 or 1;
M₂ is a repeating unit comprising one or more optionally substituted polycyclic moieties and has a formula selected from:

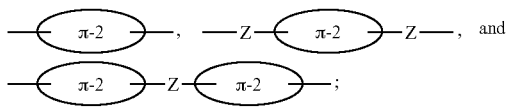

wherein:
π-2, at each occurrence, is independently an optionally substituted polycyclic moiety; and
Z, at each occurrence, is independently a linear conjugated linker; and
n is an integer between 2 and 5,000,
wherein π-2 has a reduction potential greater than or equal to −2.2 V;
provided that the polymer does not have a repeating unit of the formula:

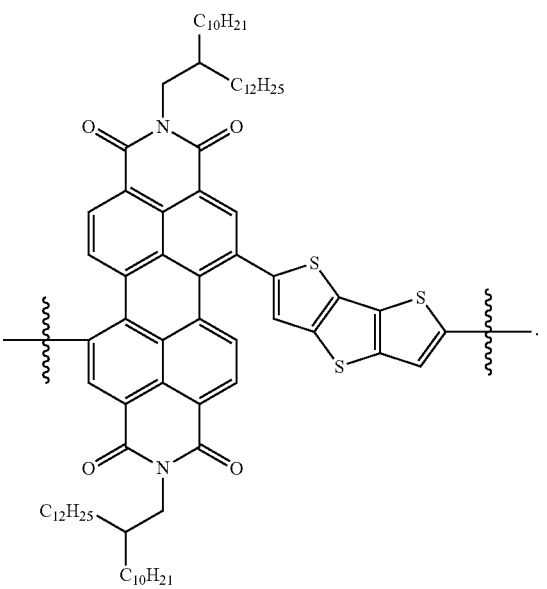

2. The polymer of claim 1, wherein $M_1$ is an optionally substituted aromatic imide selected from:

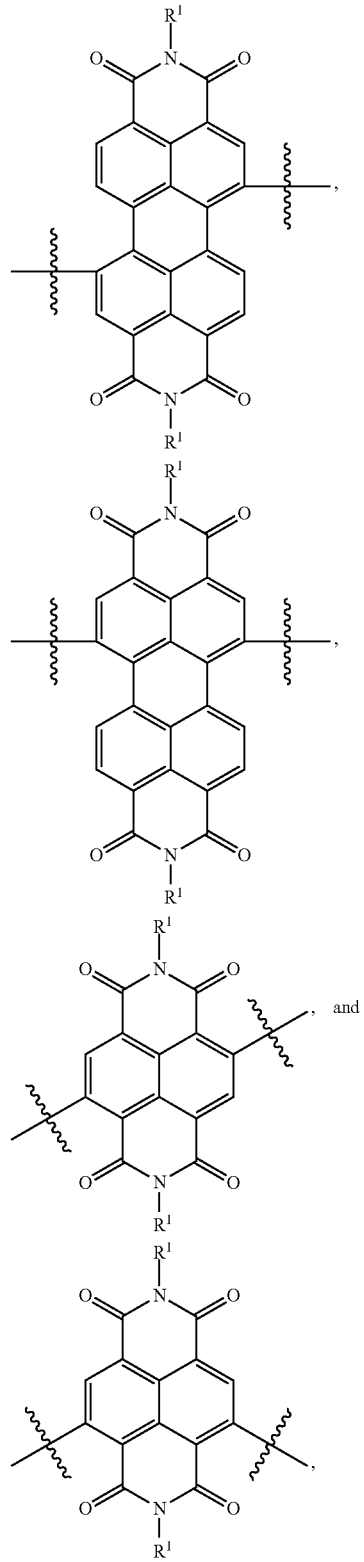

and $R^1$ is as defined in claim 1.

3. The polymer of claim 1, wherein each of π-1, π-1', and π-2 independently is optionally substituted with 1-6 $R^a$ groups; wherein:

$R^a$, at each occurrence, is a) halogen, b) —CN, c) $^-NO_2$, d) oxo, e) —OH, f) =$C(R^b)_2$, g) a $C_{1-40}$ alkyl group, h) a $C_{2-40}$ alkenyl group, i) a $C_{2-40}$ alkynyl group, j) a $C_{1-40}$ alkoxy group, k) a $C_{1-40}$ alkylthio group, l) a $C_{1-40}$ haloalkyl group, m) a —Y—$C_{3-10}$ cycloalkyl group, n) a —Y—$C_{6-14}$ aryl group, o) a —Y—$C_{6-14}$ haloaryl group, p) a —Y-3-12 membered cycloheteroalkyl group, or q) a —Y-5-14 membered heteroaryl group, wherein each of the $C_{1-40}$ alkyl group, the $C_{2-40}$ alkenyl group, the $C_{2-40}$ alkynyl group, the $C_{3-10}$ cycloalkyl group, the $C_{6-14}$ aryl group, the $C_{6-14}$ haloaryl group, the 3-12 membered cycloheteroalkyl group, and the 5-14 membered heteroaryl group is optionally substituted with 1-4 $R^b$ groups;

$R^b$, at each occurrence, is a) halogen, b) —CN, c) —$NO_2$, d) oxo, e) —OH, f) —$NH_2$, g) —NH($C_{1-20}$ alkyl), h) —N($C_{1-20}$ alkyl)$_2$, i) —N($C_{1-20}$ alkyl)-$C_{6-14}$ aryl, j) —N($C_{6-14}$ aryl)$_2$, k) —S(O)$_m$H, l) —S(O)$_m$—$C_{1-20}$ alkyl, m) —S(O)$_2$OH, n) —S(O)$_m$—$OC_{1-20}$ alkyl, o) —S(O)$_m$—$OC_{6-14}$ aryl, p) —CHO, q) —C(O)—$C_{1-20}$ alkyl, r) —C(O)—$C_{6-14}$ aryl, s) —C(O)OH, t) —C(O)—$OC_{1-20}$ alkyl, u) —C(O)—$OC_{6-14}$ aryl, v) —C(O)$NH_2$, w) —C(O)NH—$C_{1-20}$ alkyl, x) —C(O)N($C_{1-20}$ alkyl)$_2$, y) —C(O)NH—$C_{6-14}$ aryl, z) —C(O)N($C_{1-20}$ alkyl)-$C_{6-14}$ aryl, aa) —C(O)N($C_{6-14}$ aryl)$_2$, ab) —C(S)$NH_2$, ac) —C(S)NH—$C_{1-20}$ alkyl, ad) —C(S)N($C_{1-20}$ alkyl)$_2$, ae) —C(S)N($C_{6-14}$ aryl)$_2$, af) —C(S)N($C_{1-20}$ alkyl)-$C_{6-14}$ aryl, ag) —C(S)NH—$C_{6-14}$ aryl, ah) —S(O)$_m$$NH_2$, ai) —S(O)$_m$NH($C_{1-20}$ alkyl), aj) —S(O)$_m$N($C_{1-20}$ alkyl)$_2$, ak) —S(O)$_m$NH($C_{6-14}$ aryl), al) —S(O)$_m$($C_{1-20}$ alkyl)-$C_{6-14}$ aryl, am) —S(O)$_m$N($C_{6-14}$ aryl)$_2$, an) —$SiH_3$, ao) —SiH($C_{1-20}$ alkyl)$_2$, ap) —$SiH_2$($C_{1-20}$ alkyl), aq) —Si($C_{1-20}$ alkyl)$_3$, ar) a $C_{1-20}$ alkyl group, as) a $C_{2-20}$ alkenyl group, at) a $C_{2-20}$ alkynyl group, au) a $C_{1-20}$ alkoxy group, av) a $C_{1-20}$ alkylthio group, aw) a $C_{1-20}$ haloalkyl group, ax) a $C_{3-10}$ cycloalkyl group, ay) a $C_{6-14}$ aryl group, az) a $C_{6-14}$ haloaryl group, ba) a 3-12 membered cycloheteroalkyl group, or bb) a 5-14 membered heteroaryl group;

Y, at each occurrence, is a divalent $C_{1-20}$ alkyl group, a divalent $C_{1-20}$ haloalkyl group, or a covalent bond; and m, at each occurrence, is 0, 1, or 2.

4. The polymer of claim 1, wherein $R^1$, at each occurrence, is independently selected from H, a $C_{1-40}$ alkyl group, a $C_{2-40}$ alkenyl group, a $C_{1-40}$ haloalkyl group, -L-$Ar^1$, -L-$Ar^1$—$Ar^1$, -L-$Ar^1$—$R^2$, -L-$Ar^1$—$Ar^1$—$R^2$, -L-$Cy^1$, -L-$Cy^1$-$Cy^1$, -L-$Cy^1$-$R^2$, and -L-$Cy^1$-$Cy^1$-$R^2$;

wherein:

L, at each occurrence, is independently selected from —Y—O—Y—, —Y—[S(O)$_m$]—Y—, —Y—C(O)—Y—, —Y—[$NR^cC(O)$]—Y—, —Y—[C(O)$NR^c$]—, —Y—[$SiR^c_2$]-Y—, a divalent $C_{1-20}$ alkyl group, a divalent $C_{1-20}$ alkenyl group, a divalent $C_{1-20}$ haloalkyl group, and a covalent bond;

wherein:

$R^c$, at each occurrence, is independently H, a $C_{1-6}$ alkyl group, or a —Y—$C_{6-14}$ aryl group;

$Ar^1$, at each occurrence, is independently a monovalent or divalent $C_{6-14}$ aryl group or a 5-14 membered heteroaryl group, each optionally substituted with 1-5 substituents independently selected from a halogen, —CN, oxo, =$C(CN)_2$, a $C_{1-6}$ alkyl group, a $C_{1-6}$ alkoxy group, and a $C_{1-6}$ haloalkyl group; and $Cy^1$, at each occurrence, is independently a monovalent or divalent $C_{3-14}$ cycloalkyl group or a 3-14 membered cycloheteroalkyl group, each optionally substituted with 1-5 substituents independently selected from a halogen, —CN, oxo, =$C(CN)_2$, a $C_{1-6}$ alkyl group, a $C_{1-6}$ alkoxy group, and a $C_{1-6}$ haloalkyl group;

$R^2$, at each occurrence, is independently selected from a $C_{1-40}$ alkyl group, a $C_{2-40}$ alkenyl group, a $C_{1-40}$ haloalkyl group, a $C_{1-40}$ alkoxy group, -L'-$Ar^2$, -L'-$Ar^2$—$Ar^2$, -L'-$Ar^2$—$R^3$, -L'-$Ar^2$—$Ar^2$—$R^3$, -L'-$Cy^2$, -L'-$Cy^2$-$Cy^2$, -L'-$Cy^2$-$R^3$, -L'-$Cy^2$-$Cy^2$-$R^3$;

wherein:

L', at each occurrence, is independently selected from —Y—O—Y—, —Y—[S(O)$_m$]-Y—, —Y—C(O)—Y—, —Y—[$NR^cC(O)$]—Y—, —Y—[C(O)$NR^c$]—, —Y—$NR^c$—, —Y—[$SiR^c_2$]-Y—, a divalent $C_{1-20}$ alkyl group, a divalent $C_{1-20}$ alkenyl group, a divalent $C_{1-20}$ haloalkyl group, and a covalent bond;

$Ar^2$, at each occurrence, is independently a monovalent or divalent $C_{6-14}$ aryl group or a 5-14 membered heteroaryl group, each optionally substituted with 1-5 substituents independently selected from halogen, oxo, —CN, =$C(CN)_2$, a $C_{1-6}$ alkyl group, a $C_{1-6}$ alkoxy group, and a $C_{1-6}$ haloalkyl group;

$Cy^2$, at each occurrence, is independently a monovalent or divalent $C_{3-14}$ cycloalkyl group or a 3-14 membered cycloheteroalkyl group, each optionally substituted with 1-5 substituents independently selected from a halogen, oxo, —CN, =$C(CN)_2$, a $C_{1-6}$ alkyl group, a $C_{1-6}$ alkoxy group, and a $C_{1-6}$ haloalkyl group;

$R^3$, at each occurrence, is a $C_{1-40}$ alkyl group, a $C_{2-40}$ alkenyl group, a $C_{1-40}$ haloalkyl group, or a $C_{1-40}$ alkoxy group;

Y, at each occurrence, is a divalent $C_{1-20}$ alkyl group, a divalent $C_{1-20}$ haloalkyl group, or a covalent bond; and m, at each occurrence, is 0, 1, or 2.

5. The polymer of claim 1, represented by formula:

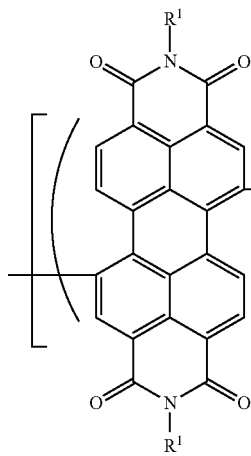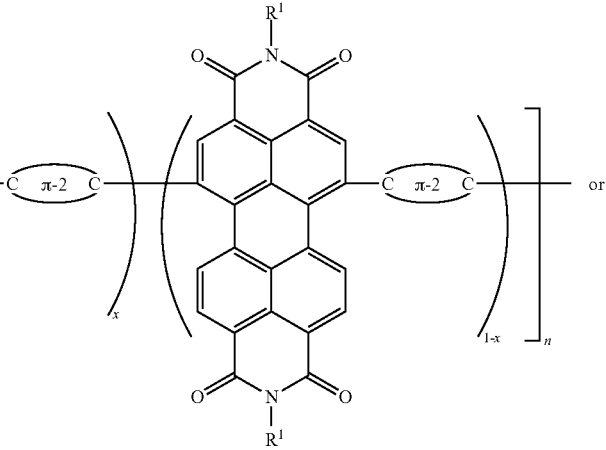

-continued

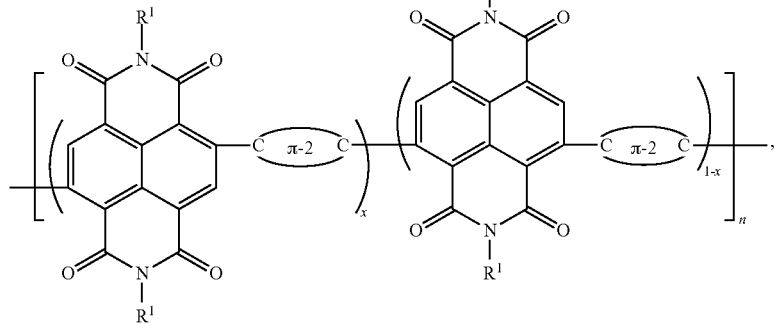

wherein n is an integer between 5 and 1,000; x is a real number and 0<x≤1; and π-2 and $R^1$ are as defined in claim 1.

6. The polymer of claim 1, wherein $R^1$ is a linear or branched $C_{3-40}$ alkyl group selected from an n-hexyl group, a 1-methylpropyl group, a 1-methylbutyl group, a 1-methylpentyl group, a 1-methylhexyl group, a 1-ethylpropyl group, a 1-ethylbutyl group, a 1-3,dimethylbutyl group, and a 2-octyldodecyl group.

7. The polymer of claim 1, wherein $R^1$ is selected from:

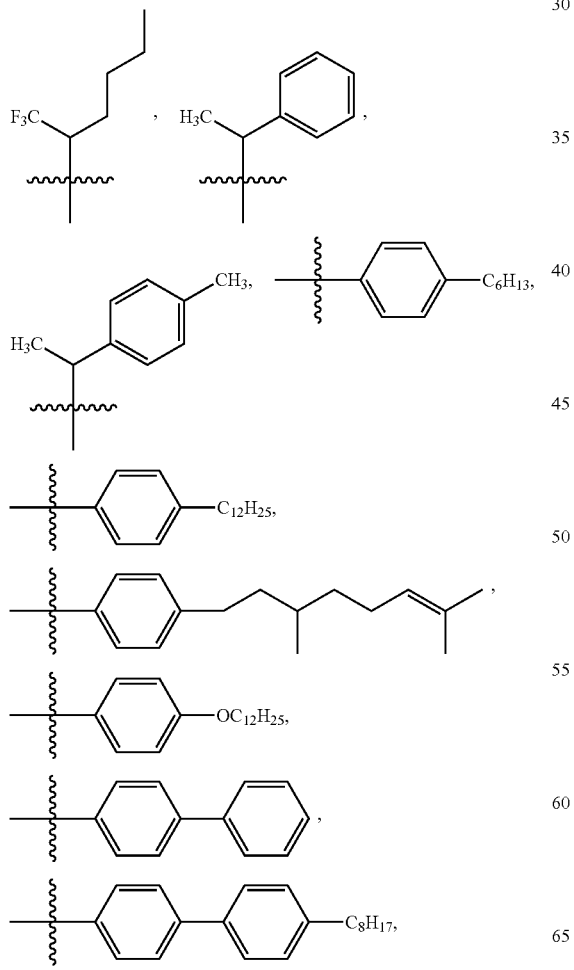

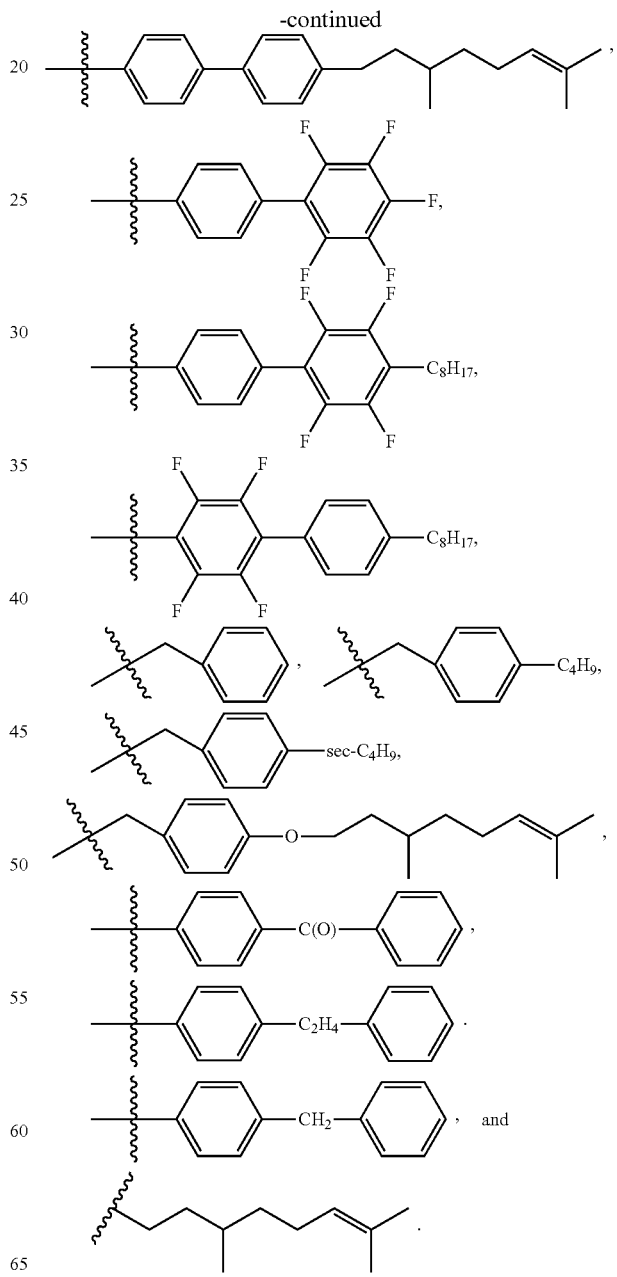

8. The polymer of claim 3, wherein π-2 is selected from:
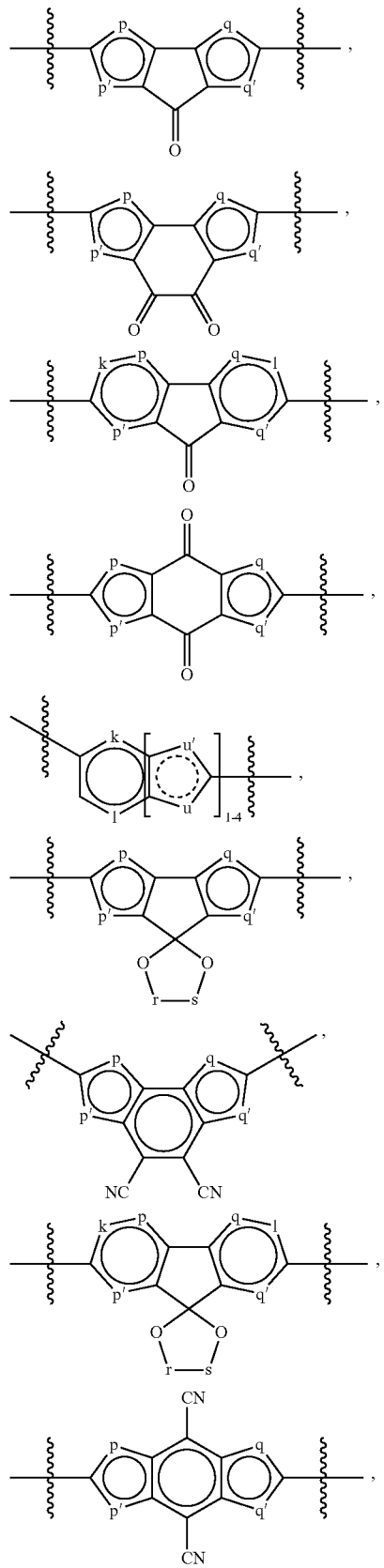
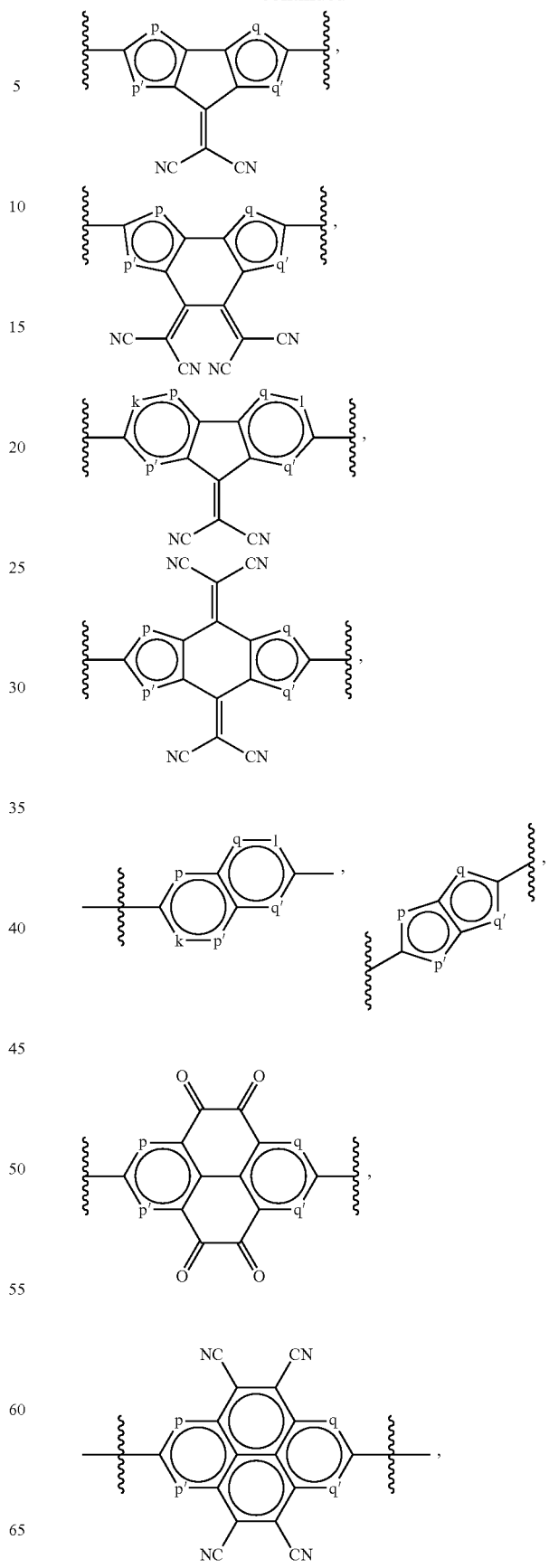

-continued

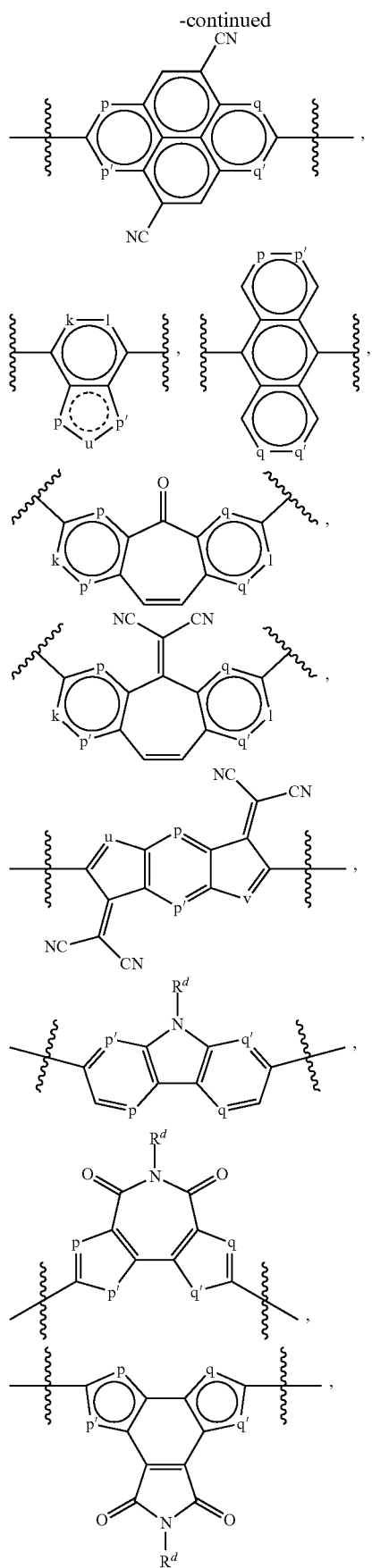

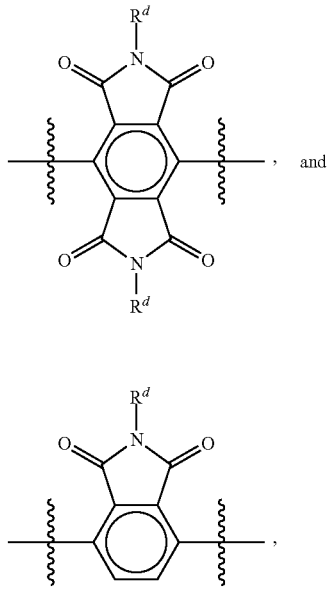

-continued

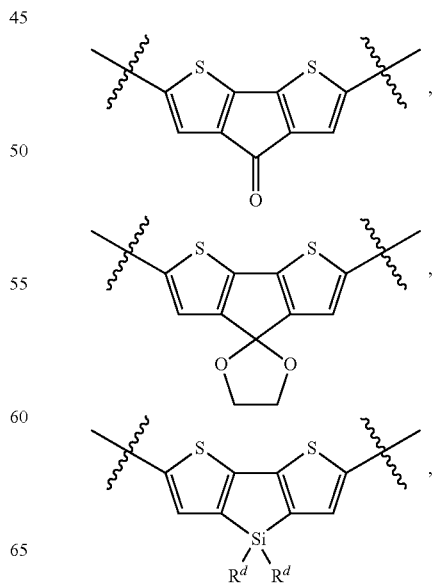

wherein:

k, k', l and l' independently are selected from —CR$^d$=, =CR$^d$—, —C(O)—, —C(C(CN)$_2$)—;

p, p', q and q' independently are selected from —CR$^d$=, =CR$^d$—, —C(O)—, —C(C(CN)$_2$)—, —O—, —S—, —N=, =N—, —N(R$^d$)—, —SiR$^d$=, =SiR$^d$—, and —SiR$^d$R$^d$—;

r and s independently are —CR$^d$R$^d$— or —C(C(CN)$_2$)—;

u, u', v and v' independently are selected from —CR$^d$=, =CR$^d$—, —C(O)—, —C(C(CN)$_2$)—, —S—, —S(O)—, —S(O)$_2$—, —O—, —N=, =N—, —SiR$^d$=, —SiR$^d$R$^d$—, —CR$^d$R$^d$—CR$^d$R$^d$—, and —CR$^d$=CR$^d$—;

R$^d$, at each occurrence, independently is H or R$^a$; and

R$^a$ is as defined in claim 3.

9. The polymer of claim 3, wherein π-2 is selected from:

65
-continued
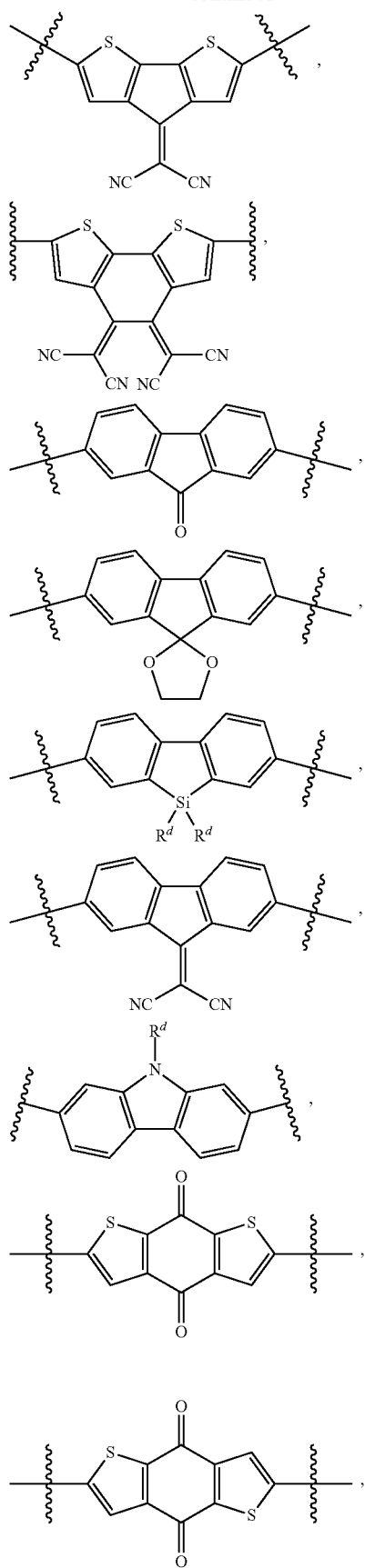
66
-continued
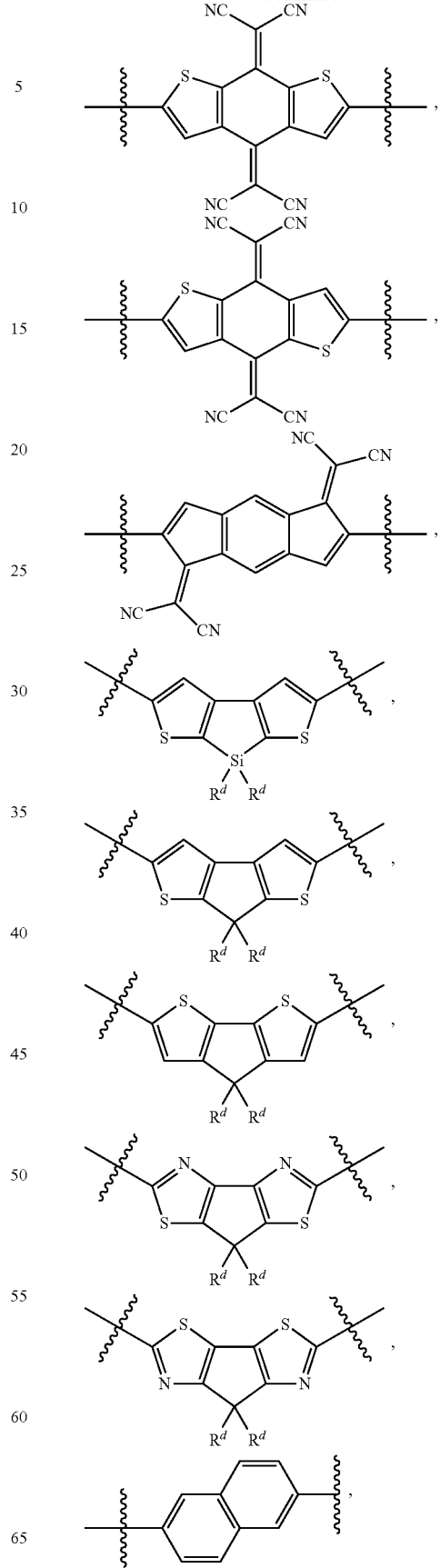

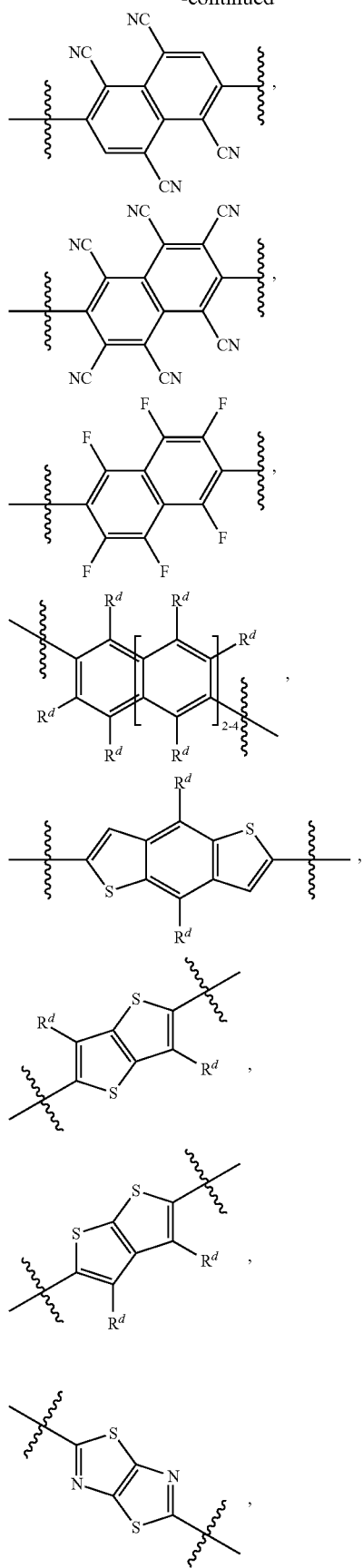
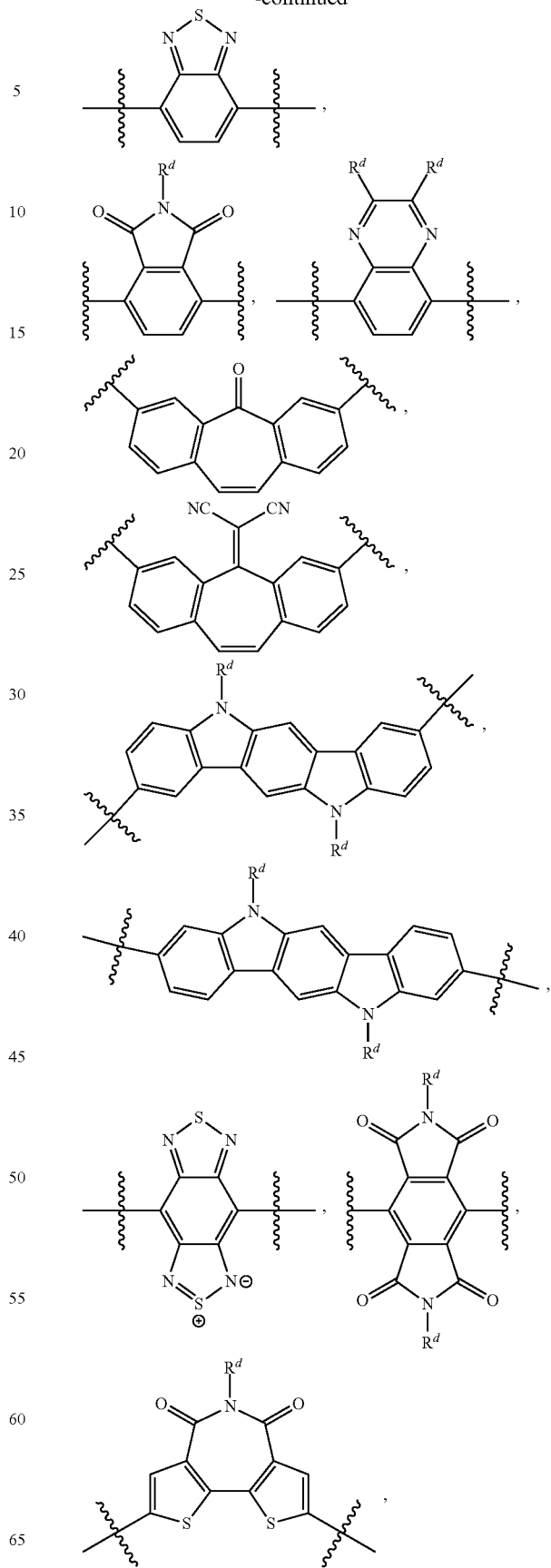

-continued

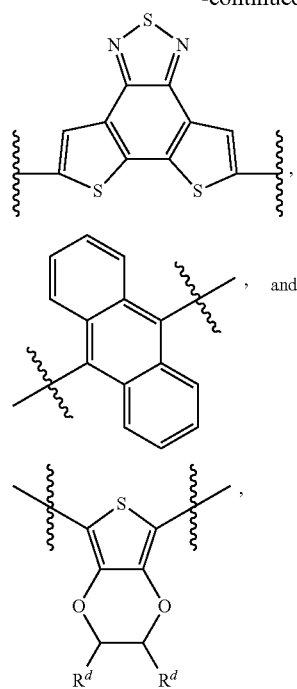

wherein $R^d$, at each occurrence, independently is H or $R^a$; and $R^a$ is as defined in claim 3.

10. The polymer of claim 1, wherein π-2 is a polycyclic moiety comprising a Spiro atom or substituted with 1-4 groups selected from an oxo group and a dicyanovinylidenyl group.

11. The polymer of claim 1, wherein the polymer is

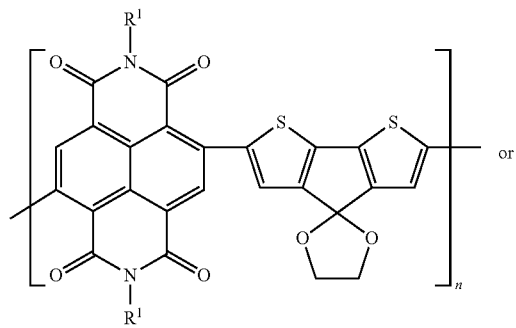

or

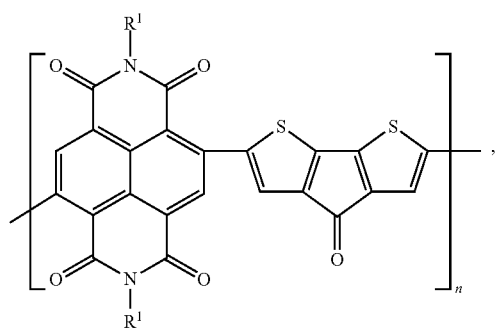

or wherein $R^1$ and n are as defined in claim 1.

12. The polymer of claim 1, wherein the polymer is

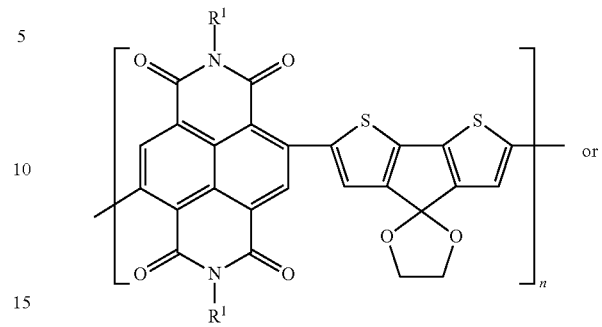

or

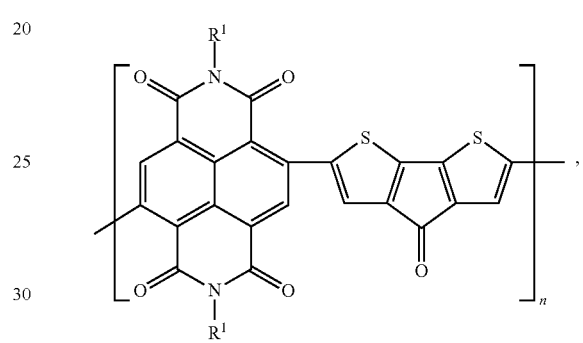

wherein $R^1$ and n are as defined in claim 1.

13. The polymer of claim 1, wherein the polymer is selected from:

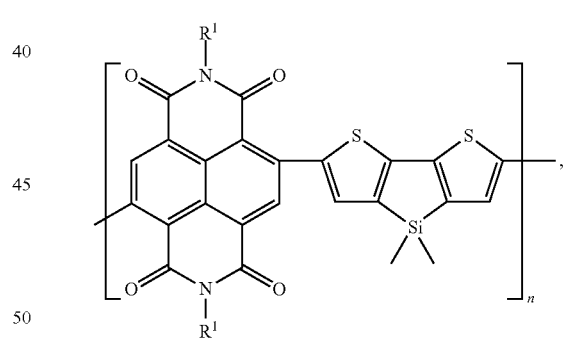

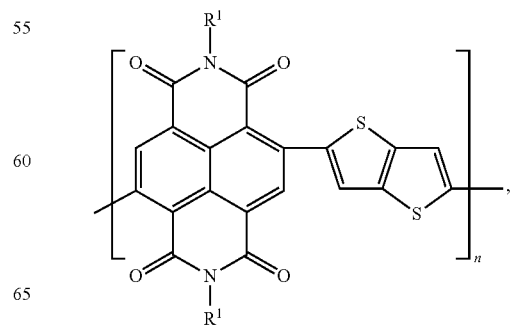

71
-continued

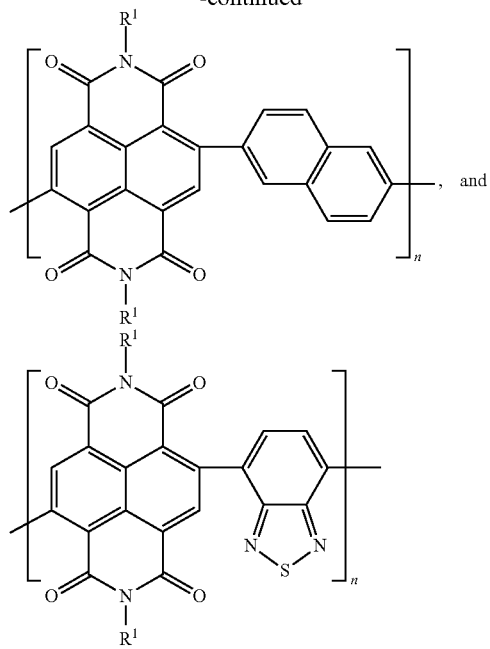

wherein R¹ and n are as defined in claim 1.

14. The polymer of claim 1, wherein the polymer is selected from:

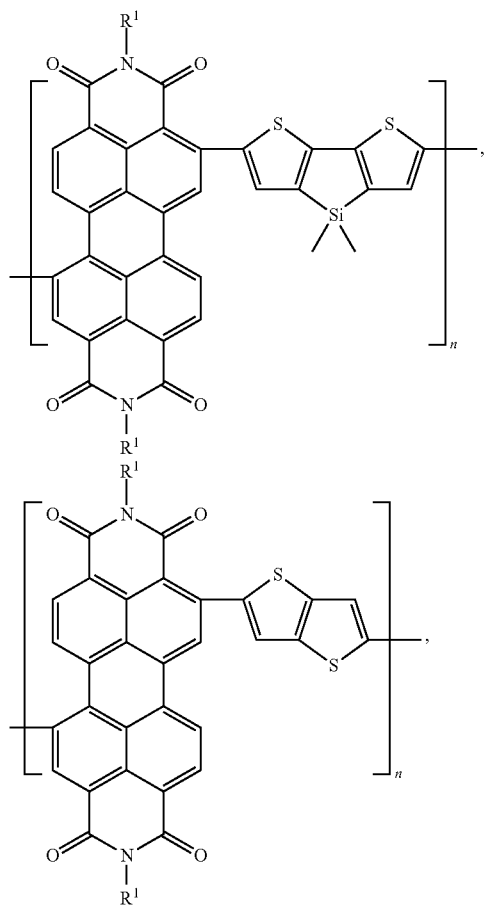

72
-continued

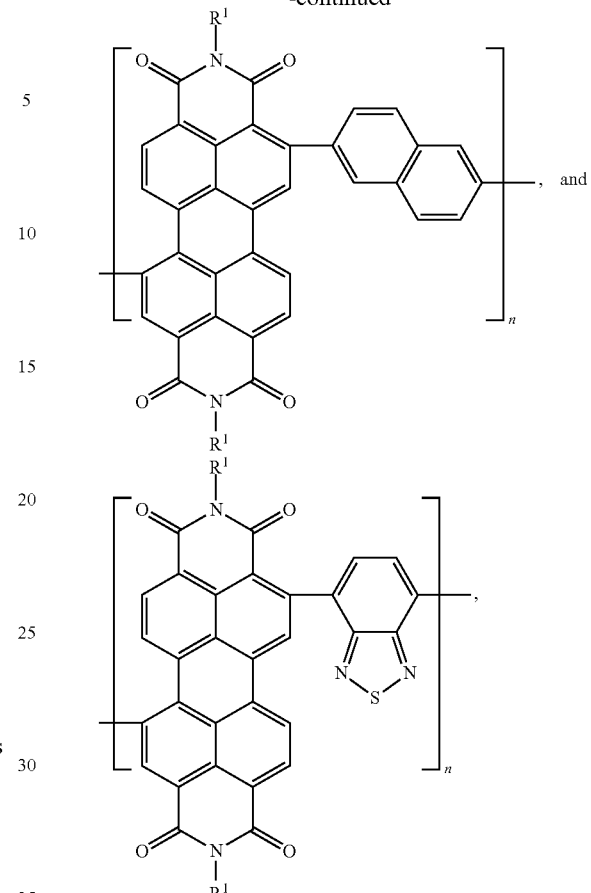

wherein R¹ and n are as defined in claim 1.

15. A polymer represented by formula I or formula I':

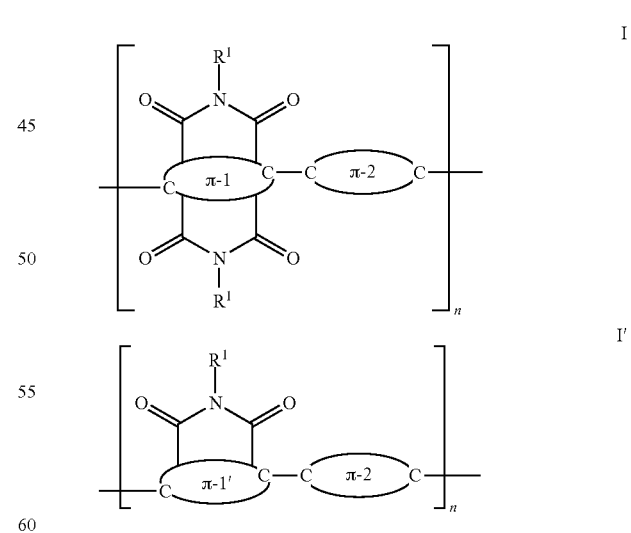

wherein:

π-1 and π-1' independently are a cyclic moiety optionally substituted with 1-4 $R^a$ groups;

π-2 is a π-conjugated moiety having a reduction potential greater than about −2.6 V and optionally substituted with 1-6 $R^a$ groups;

wherein:

$R^a$, at each occurrence, is a) halogen, b) —CN, c) —NO$_2$, d) oxo, e) —OH, f) =C($R^b$)$_2$, g) a $C_{1-40}$ alkyl group, h) a $C_{2-40}$ alkenyl group, i) a $C_{2-40}$ alkynyl group, j) a $C_{1-40}$ alkoxy group, k) a $C_{1-40}$ alkylthio group, l) a $C_{1-40}$ haloalkyl group, m) a —Y—$C_{3-10}$ cycloalkyl group, n) a —Y—$C_{6-14}$ aryl group, o) a —Y—$C_{6-14}$ haloaryl group, p) a —Y-3-12 membered cycloheteroalkyl group, or q) a —Y-5-14 membered heteroaryl group, wherein each of the $C_{1-40}$ alkyl group, the $C_{2-40}$ alkenyl group, the $C_{2-40}$ alkynyl group, the $C_{3-10}$ cycloalkyl group, the $C_{6-14}$ aryl group, the $C_{6-14}$ haloaryl group, the 3-12 membered cycloheteroalkyl group, and the 5-14 membered heteroaryl group is optionally substituted with 1-4 $R^b$ groups;

$R^b$, at each occurrence, is a) halogen, b) —CN, c) —NO$_2$, d) oxo, e) f) —NH$_2$, g) —NH($C_{1-20}$ alkyl), h) —N($C_{1-20}$ alkyl)$_2$, i) —N($C_{1-20}$ alkyl)-$C_{6-14}$ aryl, j) —N($C_{6-14}$ aryl)$_2$, k) —S(O)$_m$H, l) —S(O)$_m$—$C_{1-20}$ alkyl, m) —S(O)$_2$OH, n) —S(O)$_m$—OC$_{1-20}$ alkyl, o) —S(O)$_m$—OC$_{6-14}$ aryl, p) —CHO, q) —C(O)—$C_{1-20}$ alkyl, r) —C(O)—$C_{6-14}$ aryl, s) —C(O)OH, t) —C(O)—OC$_{1-20}$ alkyl, u) —C(O)—OC$_{6-14}$ aryl, v) —C(O)NH$_2$, w) —C(O)NH—$C_{1-20}$ alkyl, x) —C(O)N($C_{1-20}$ alkyl)$_2$, y) —C(O)NH—$C_{6-14}$ aryl, z) —C(O)N($C_{1-20}$ alkyl)-$C_{6-14}$ aryl, aa) —C(O)N($C_{6-14}$ aryl)$_2$, ab) —C(S)NH$_2$, ac) —C(S)NH—$C_{1-20}$ alkyl, ad) —C(S)N($C_{1-20}$ alkyl)$_2$, ae) —C(S)N($C_{6-14}$ aryl)$_2$, af) —C(S)N($C_{1-20}$ alkyl)-$C_{6-14}$ aryl, ag) —C(S)NH—$C_{6-14}$ aryl, ah) —S(O)$_m$NH$_2$, ai) —S(O)$_m$NH($C_{1-20}$ alkyl), aj) —S(O)$_m$N($C_{1-20}$ alkyl)$_2$, ak) —S(O)$_m$NH($C_{6-14}$ aryl), al) —S(O)$_m$N($C_{1-20}$ alkyl)-$C_{6-14}$ aryl, am) —S(O)$_m$N($C_{6-14}$ aryl)$_2$, an) —SiH$_3$, ao) —SiH($C_{1-20}$ alkyl)$_2$, ap) —SiH$_2$($C_{1-20}$ alkyl), aq) Si($C_{1-20}$ alkyl)$_3$, ar) a $C_{1-20}$ alkyl group, as) a $C_{2-20}$ alkenyl group, at) a $C_{2-20}$ alkynyl group, au) a $C_{1-20}$ alkoxy group, av) a $C_{1-20}$ alkylthio group, aw) a $C_{1-20}$ haloalkyl group, ax) a $C_{3-10}$ cycloalkyl group, ay) a $C_{6-14}$ aryl group, az) a $C_{6-14}$ haloaryl group, ba) a 3-12 membered cycloheteroalkyl group, or bb) a 5-14 membered heteroaryl group;

Y, at each occurrence, is a divalent $C_{1-20}$ alkyl group, a divalent $C_{1-20}$ haloalkyl group, or a covalent bond; and m, at each occurrence, is 0, 1, or 2;

$R^1$, at each occurrence, is independently selected from H, a $C_{1-40}$ alkyl group, a $C_{2-40}$ alkenyl group, a $C_{1-40}$ haloalkyl group, -L-Ar$^1$, -L-Ar$^1$—Ar$^1$, -L-Ar$^1$—R$^2$, -L-Ar$^1$—Ar$^1$—R$^2$, -L-Cy$^1$, -L-Cy$^1$-Cy$^1$, -L-Cy$^1$-R$^2$, and -L-Cy$^1$-Cy$^1$-R$^2$;

wherein:

L, at each occurrence, is independently selected from —Y—O—Y—, —Y—[S(O)$_m$]—Y—, —Y—C(O)—Y—, —Y—[NR$^c$C(O)]—Y—, —Y—[C(O)NR$^c$]—, —Y—NR$^c$—, —Y—[SiR$^c_2$]—Y—, a divalent $C_{1-20}$ alkyl group, a divalent $C_{1-20}$ alkenyl group, a divalent $C_{1-20}$ haloalkyl group, and a covalent bond;

wherein:

$R^c$, at each occurrence, is independently H, a $C_{1-6}$ alkyl group, or a —Y—$C_{6-14}$ aryl group;

Ar$^1$, at each occurrence, is independently a monovalent or divalent $C_{6-14}$ aryl group or a 5-14 membered heteroaryl group, each optionally substituted with 1-5 substituents independently selected from a halogen, —CN, oxo, =C(CN)$_2$, a $C_{1-6}$ alkyl group, a $C_{1-6}$ alkoxy group, and a $C_{1-6}$ haloalkyl group; and Cy$^1$, at each occurrence, is independently a monovalent or divalent $C_{3-14}$ cycloalkyl group or a 3-14 membered cycloheteroalkyl group, each optionally substituted with 1-5 substituents independently selected from a halogen, —CN, oxo, =C(CN)$_2$, a $C_{1-6}$ alkyl group, a $C_{1-6}$ alkoxy group, and a $C_{1-6}$ haloalkyl group;

$R^2$, at each occurrence, is independently selected from a $C_{1-40}$ alkyl group, a $C_{2-40}$ alkenyl group, a $C_{1-40}$ haloalkyl group, a $C_{1-40}$ alkoxy group, -L'-Ar$^2$, -L'-Ar$^c$—Ar$^2$, -L'-Ar$^2$—R$^3$, -L'-Ar$^2$—Ar$^2$—R$^3$, -L'-Cy$^2$, -L'-Cy$^2$-Cy$^2$, -L'-Cy$^2$-R$^3$, -L'-Cy$^2$-Cy$^2$-R$^3$;

wherein:

L', at each occurrence, is independently selected from —Y—O—Y—, —Y—[S(O)$_m$]—Y—, —Y—[C(O)—Y—, —Y—[NR$^c$C(O)]—Y—, —Y—[C(O)NR$^c$]—, —Y—NR$^c$—, —Y—[SiR$^c_2$]—Y—, a divalent $C_{1-20}$ alkyl group, a divalent $C_{1-20}$ alkenyl group, a divalent $C_{1-20}$ haloalkyl group, and a covalent bond;

Ar$^c$, at each occurrence, is independently a monovalent or divalent $C_{6-14}$ aryl group or a 5-14 membered heteroaryl group, each optionally substituted with 1-5 substituents independently selected from halogen, oxo, —CN, =C(CN)$_2$, a $C_{1-6}$ alkyl group, a $C_{1-6}$ alkoxy group, and a $C_{1-6}$ haloalkyl group;

Cy$^2$, at each occurrence, is independently a monovalent or divalent $C_{3-14}$ cycloalkyl group or a 3-14 membered cycloheteroalkyl group, each optionally substituted with 1-5 substituents independently selected from a halogen, oxo, —CN, =C(CN)$_2$, a $C_{1-6}$ alkyl group, a $C_{1-6}$ alkoxy group, and a $C_{1-6}$ haloalkyl group;

$R^3$, at each occurrence, is a $C_{1-40}$ alkyl group, a $C_{2-40}$ alkenyl group, a $C_{1-40}$ haloalkyl group, or a $C_{1-40}$ alkoxy group; and n is an integer in the range from 2 to 5,000.

16. The polymer of claim 15, wherein 7-2 has a reduction potential greater than or equal to about −1.2 V.

17. The polymer of claim 15, wherein π-2 is a polycyclic moiety optionally substituted with 1-6 $R^a$ groups.

18. A composition comprising the polymer of claim 1 dissolved or dispersed in a liquid medium.

19. The composition of claim 18, wherein the liquid medium comprises water or an organic solvent.

20. The composition of claim 18, the composition further comprising at least one additive.

21. The composition of claim 20, wherein the additive is independently selected from the group consisting of a detergent, a dispersant, a binding agent, a compatiblizing agent, a curing agent, an initiator, a humectant, an antifoaming agent, a wetting agent, a pH modifier, a biocide, and a bactereriostat.

22. An article of manufacture comprising the polymer of claim 1.

23. The article of manufacture of claim 22, wherein the article of manufacture is an electronic device, an optical device, or an optoelectronic device.

24. A thin film semiconductor comprising the polymer of claim 1.

25. A composite comprising a substrate and the thin film semiconductor of claim 24 deposited on the substrate.

26. A field effect transistor device comprising the thin film semiconductor of claim 24.

27. A field effect transistor device comprising the composite of claim 25.

28. The field effect transistor device of claim 26, wherein the field effect transistor has a structure selected from top-gate bottom-contact structure, bottom-gate top-contact structure, top-gate top-contact structure, and bottom-gate bottom-contact structure.

29. The field effect transistor device of claim 26 comprising a dielectric material, wherein the dielectric material comprises an organic dielectric material, an inorganic dielectric material, or a hybrid organic/inorganic dielectric material.

30. A photovoltaic device comprising the thin film semiconductor of claim 24.

31. A photovoltaic device comprising the composite of claim 25.

32. The photovoltaic device of claim 30 comprising a p-type semiconducting material adjacent to the polymer.

33. An organic light emitting device comprising the thin film semiconductor of claim 24.

34. An organic light emitting device comprising the composite of claim 25.

35. A method of making an article of manufacture comprising depositing a composition of claim 26 onto a substrate.

36. The method of claim 35, wherein depositing the composition comprises at least one of printing, spin coating, drop-casting, zone casting, dip coating, blade coating, and spraying.

37. The method of claim 36, wherein printing is selected from gravure printing, inkjet printing, flexographic printing, screen printing, pad printing, offset printing, and lithographic printing.

* * * * *